United States Patent
Kertsopoulos

(10) Patent No.: US 9,418,781 B2
(45) Date of Patent: Aug. 16, 2016

(54) MAGNETIC SYSTEM OF THREE INTERACTIONS

(71) Applicant: Georgios Konstantinos Kertsopoulos, Haidari Attikis (GR)

(72) Inventor: Georgios Konstantinos Kertsopoulos, Haidari Attikis (GR)

(*) Notice: Subject to any disclaimer, the term of this patent is extended or adjusted under 35 U.S.C. 154(b) by 169 days.

(21) Appl. No.: 14/384,675

(22) PCT Filed: Mar. 12, 2013

(86) PCT No.: PCT/GR2013/000015
§ 371 (c)(1),
(2) Date: Sep. 11, 2014

(87) PCT Pub. No.: WO2013/136097
PCT Pub. Date: Sep. 19, 2013

(65) Prior Publication Data
US 2015/0170815 A1    Jun. 18, 2015

(30) Foreign Application Priority Data
Mar. 13, 2012 (GR) .............................. 20120100153

(51) Int. Cl.
*H01F 7/02* (2006.01)
*G01R 33/383* (2006.01)

(52) U.S. Cl.
CPC ............ *H01F 7/0273* (2013.01); *G01R 33/383* (2013.01); *H01F 7/0278* (2013.01)

(58) Field of Classification Search
CPC .................... H01H 2215/042; H01H 2221/04; H01F 7/0273; H01F 7/0278; G01R 33/383
See application file for complete search history.

(56) References Cited

U.S. PATENT DOCUMENTS

| | | | |
|---|---|---|---|
| 4,054,944 A | 10/1977 | Lau | |
| 4,831,351 A * | 5/1989 | Leupold | H01F 7/02 315/5.35 |
| 5,017,819 A | 5/1991 | Patt et al. | |
| 5,063,934 A * | 11/1991 | Rapoport | G01R 33/383 324/321 |
| 5,977,888 A | 11/1999 | Fujita et al. | |
| 6,841,908 B2 * | 1/2005 | Hasegawa | F16C 32/0461 310/216.023 |
| 6,970,061 B1 * | 11/2005 | Danby | G01R 33/83 335/296 |
| 8,212,557 B2 * | 7/2012 | Pusiol | G01F 1/56 324/303 |
| 2006/0232369 A1 * | 10/2006 | Gorshkov | G01R 33/3806 335/306 |
| 2015/0042428 A1 * | 2/2015 | Kocijan | B25B 11/002 335/285 |

FOREIGN PATENT DOCUMENTS

DE                31 26 470 A1    1/1983

* cited by examiner

Primary Examiner — Michael Zarroli

(57) ABSTRACT

Magnetic system possessing and producing polar and field properties comprising an application of organized ensemble of constituted constructions of magnetic apparatus as means of construction. The magnetic system as an application produces magnetic phenomena and interactions, such as the production of three different interactions and also their related respective three opposites, depending on the distance existing between the magnetic constructions. It is a fully systemized product that can be used as an experimental instrument for exploitation of new designing possibilities in magnetic constructions, containing also a process of operation.

10 Claims, 39 Drawing Sheets

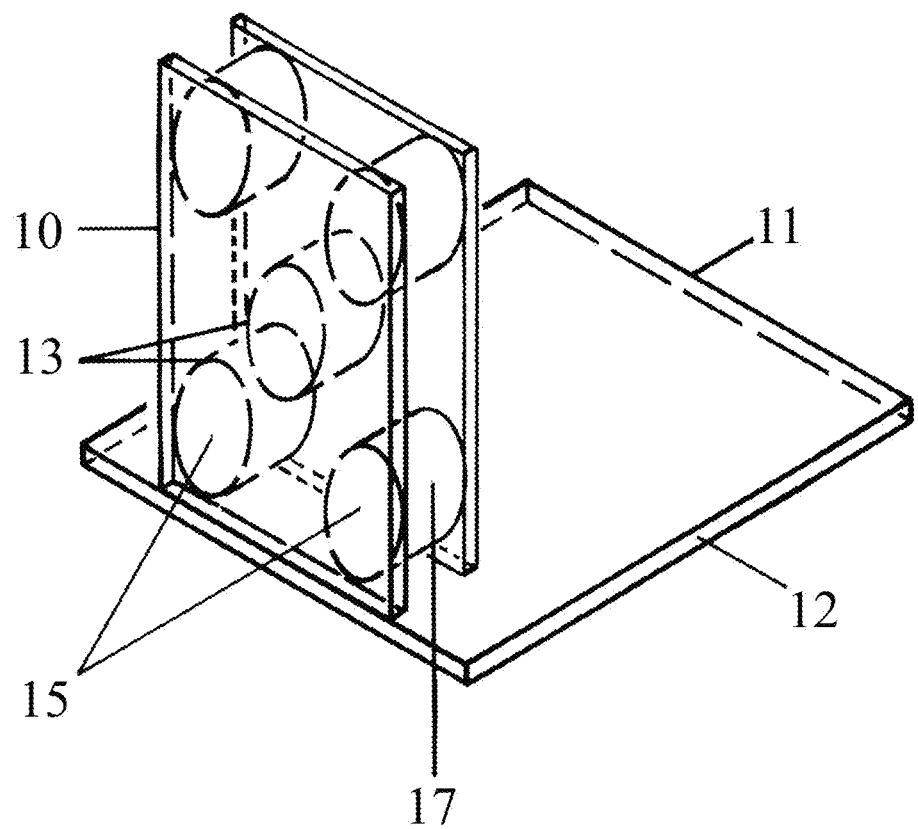
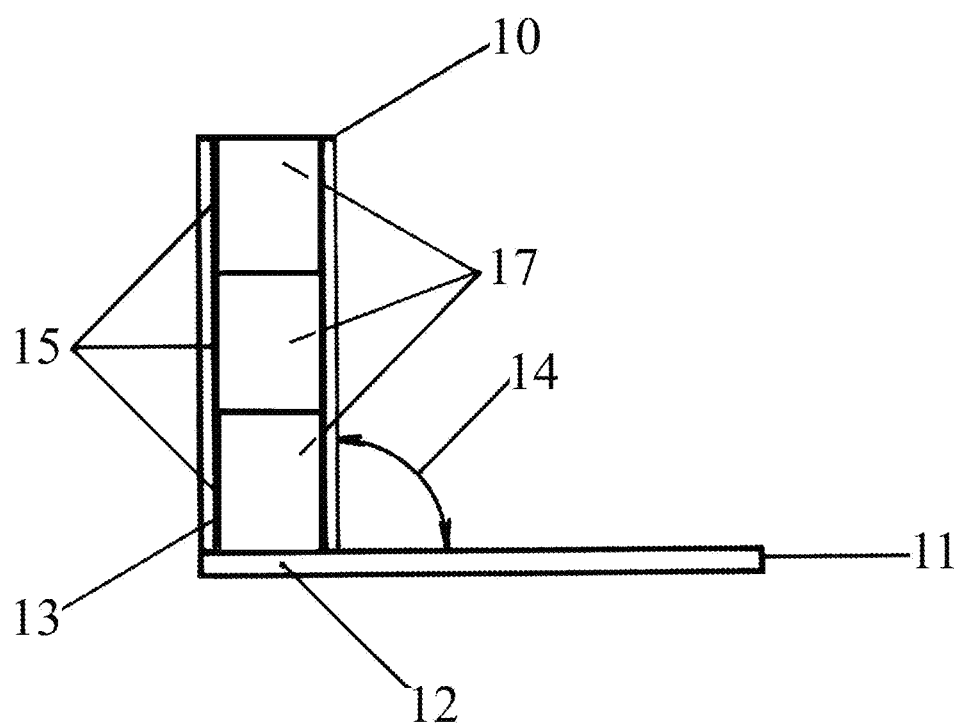
Fig. 13

Fig. 16         For D - D see Fig.18

D - D
From the Fig. 16

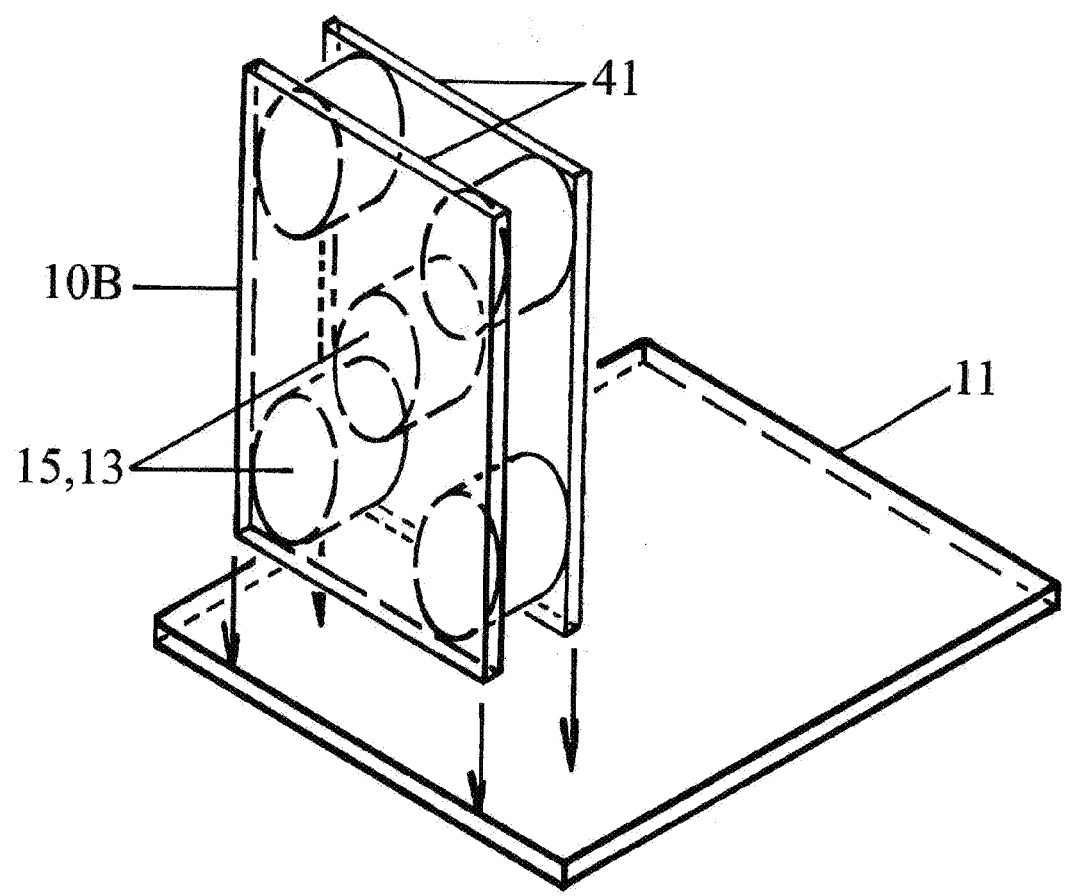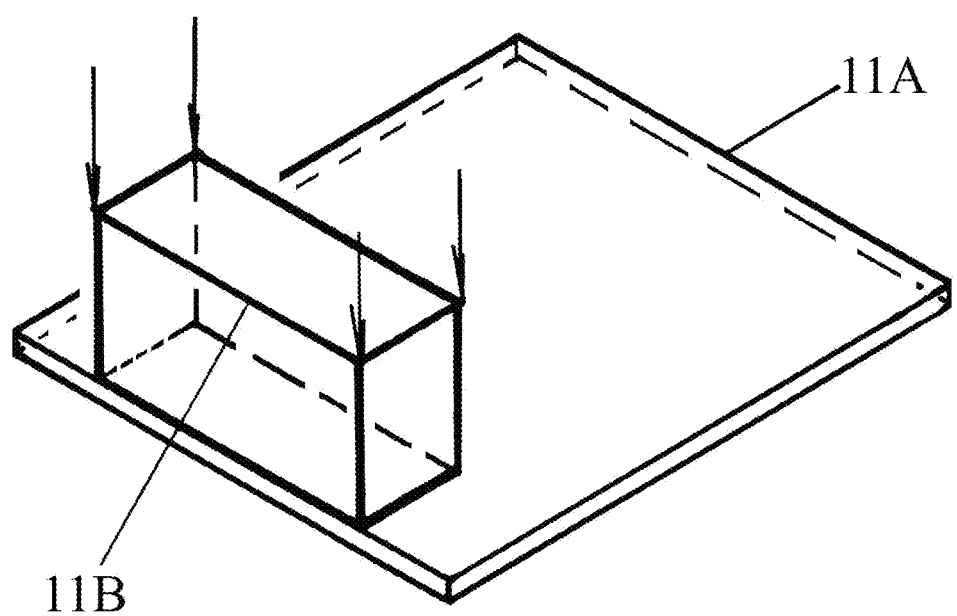
Fig. 25

MAGNETIC SYSTEM OF THREE INTERACTIONS

BACKGROUND OF THE INVENTION

1. Field of the Invention

The present invention relates to a magnetic system, which as an application is comprised by a magnetic apparatus that possesses and produces polar and field properties for exhibiting and interpreting magnetic phenomena and interactions.

2. Description of the Prior Art

Magnetostatic fields are widely used in industry. These are either used as interactions between bodies that generate these, for the generation of a desired kinetic energy by attraction or repulsion, or for the generation of electric energy, wherein the dynamic lines of the field generate induction such as in motors, generators etc., or as a means for accelerating high-energy particles in cyclotrons, or for diagnosis and therapy by means of medical instruments, and these constitute the foundational base of all kinds of the technology employing the various special aspects of the properties, interactions and phenomena of magnetism.

The interaction in the empty air space between two magnetic bodies is of a single type, either repulsive or attractive, but never seen to be both. This results to the fact that the effect of the field, whether it being homogeneous or heterogeneous, extends from the closest distance between the poles to infinity with impossibility of delimitation. The possibility of delimitation means that the specific attractive or repulsive property of the field may be abruptly stopped according to the preferred design and at the selected point. This means that whereas the field has an increasing intensity (as we approach the poles) one cannot interrupt this specific property of the effect of the attraction or the repulsion abruptly or oppositely, one cannot interrupt the increasing extinguishments of the specific property of the effect of the field (as we progressively separate the poles). As a result, the specific attractive or repulsive property of the effect of the field does extinguish at infinity and cannot abruptly stop at a specific desired distance. These limitations and prohibitions of magnetism in the state of the art do not allow the available technology to design products in a flexible and efficient manner, thus the exploitation of the magnetic lines of the field is frequently not achieved in its quantitative and qualitative entirety. A disadvantage of the present state of the art is also that it cannot generate an attractive field without the physical union and contact between two magnetic bodies. For example, the presently available technology does not allow a magnetic construction to pull another magnetic construction through an attractive field without any contact occurring in between them.

SUMMARY OF THE INVENTION

The magnetic system as an application is a complete product which possesses and produces new technological magnetic features and characteristics and can function and be utilized as a complete prototype laboratory instrument. The magnetic system is realized by the magnetic apparatus producing three interactions and the process of operation recites the steps of operation of the apparatus. The invention is claimed in two independent genus claims and each of these as an independent claim has four species claims dependent on it. The two independent genus claims in short are:

1) the magnetic apparatus producing three interactions in the empty air space found between a pair of interacting magnetic constructions sliding in a guide in one dimension only.

2) the process of operation of the apparatus producing three interactions in the empty air space between a pair of interacting magnetic constructions, sliding in a guide in one dimension only.

The magnetic apparatus may be used by theoretical and experimental scientists, engineers, chemists, physicists, technicians, professors, teachers, students and all other persons interested in magnetism and its phenomena, so that its feats may be used in the general magnetic technology. The main features of the magnetic apparatus are:

a) depending on the different distance that is created between the positions of two confronted and parallel magnetic bodies, the following are produced:
   1) three different interactions: attractive, repulsive and attractive-repulsive and the opposite to the above order namely
   2) three different interactions: repulsive, attractive and repulsive-attractive
b) possession of specific polar and field properties, where the simultaneous like-unlike and unlike-like properties of poles are created and introduced according to the fluctuation of the distance between the magnetic bodies.

A certain plurality of dipolar permanent magnets arranged in specific positions is placed by gluing on a thin planar surface, thereby forming a magnetic arrangement. Each magnetic arrangement is perpendicularly supported on a thin, planar, horizontal and non-magnetic base, thereby making a magnetic body, which is designated as "magnetic construction". This magnetic construction slides in the grooves of a guide and interacts with its respective magnetic construction with which it constitutes a pair. Each pair is designated as a comprehensive constructional type of arrangement for the ease of understanding the description. The motion of the pair of the magnetic constructions on the guide is controlled manually. The guide allows the two magnetic constructions to interact in an attractive or repulsive manner and even to balance unmoving, remaining stable, however, this is always achieved only towards one spatial dimension (forward and backward) so that the faces of the magnetic constructions remain always confronted and parallel to each other. The guide with the two magnetic constructions, which interact thereon constitute the magnetic apparatus, which is the product of the invention. The user of the product moves forward-backwards the confronted magnetic constructions in various ways as desired. Each arrangement of the magnets creates specific technological distributions of the magnetic lines, which in both manners regarding their path through the magnets as magnetic lines and also regarding their distribution in the surrounding air space as dynamic lines determine the geometry of their magnetostatic field. Each magnetic construction by itself has specific technologically applicable magnetic properties, while when this confronts its respective magnetic construction of the pair on the guide it produces further applicable magnetic properties. That is on the guide and by means of the compound properties of the magnetic arrangements three interactions are produced. On the guide the two compound magnetic constructions as a factor of possession and production of the magnetic fields create in the free air in-between them the phenomenon of co-existence of three different fields in one and only distance that varies from their union to infinity. While the visible and experimental maximum distance of interaction of the magnetic constructions is between the local margins of the guide, we use the concept of infinity as the maximized distance of non-interaction, as this is used as a scholarly term in magnetism. Depending on the specific intervening distance, which the user creates in-between the magnetic constructions, the property of their polarity is differentiated, as unlike or like or as unlike-like polarity and the kind of effect of the magnetic field whether it is attractive or repulsive or attractive-repulsive simultaneously. As it is known, the opening and closing fluctuation of the distance in physical magnetism never effects and cannot contribute to the changing of the property of the polarity in-between two confronted magnetic bodies. In the present application the opening and closing fluctuation of the distance becomes the factor that is able to alter the properties of the polarity from unlike to like poles or the opposite. Also in physical magnetism we never meet the case where the poles are unlike-like simultaneously or like-unlike simultaneously, while in the invention this is realized.

In other words, in the state of the art the poles confronted in-between interacting magnetic constructions are only like or only unlike independently of the opening or closing fluctuation of the distance intervening between the poles.

In the operation of the present application the poles in-between interacting magnetic constructions of the invention become like, unlike, like-unlike or unlike-like depending on the opening or closing fluctuation of the distance intervening between the poles.

The main characteristic features are the possession and production of interactions in the technological application of the invention lying in the uniqueness that on the guide there exist three different delimitated phenomena of magnetic interdependence, namely three different multi-planar polarities in-between two magnetic bodies, which create correspondingly three different interactions with also three different fields. All these interdependences are produced in the opening or closing fluctuation of the distance that is regulated within the one and only empty air space when two magnetic constructions become confronted. More analytically:

A) Depending on the position and the distance of the magnetic constructions, their magnetic poles become opposite in the nearer distance producing attractive in effect field and in the further distance become similar (the unlike poles are also named opposite and the like are also named similar. In the present invention these terms are used equally) producing repulsive in effect field, while in the middle distance become similar and opposite simultaneously, because there is the intensity equivalence of the attractive and repulsive forces and occurs a production of unstable balance interaction. The A) case constitutes the first dependent species claim of the magnetic apparatus as the mechanism-means of construction of the application.

B) In the case, where we bring two other types of confronted magnetic constructions then depending on the position and the distance of the magnetic constructions, their magnetic poles become similar in the nearer distance producing repulsive in effect field and in the further distance become opposite producing an attractive in effect field, while in the middle distance become opposite and similar simultaneously, because there is the intensity equivalence of the repulsive and attractive forces and occurs a production of stable balance interaction (secured attractive field from a distance). Case B) constitutes the second dependent species claim of the magnetic apparatus as the mechanism-means of construction of the application, followed by further dependent species claims of various types which produce the results of Cases A) and B).

ADVANTAGES OF THE INVENTION

The magnetic system as an application with the magnetic apparatus as mechanism-means of construction and the process of operation constitute a full and systemized product which serves in the statement, verification, proofing and technological and scientific study of all these factors and agents which its technology introduces in the magnetic technology and science as different additive capabilities of the properties, interactions and phenomena of magnetism. By means of the above-mentioned capabilities, the invention achieves in various ways to eliminate the disadvantages of the state of the prior art since in a single empty air space between two interacting magnetic bodies, which possess fixed and invariably arranged dipole permanent magnets, the property of polarity as like or unlike alters depending on the distance between them (it is noted that this is achieved for the first time in magnetism).

Also, in the disadvantage of the state of the prior art can be mentioned the incapability to construct a pair of magnetic construction, which execute a pulling effect magnetic interaction, without however, contact or union occurring between them. The present invention is able to achieve the magnetic coupling between the pair of magnetic constructions through a secured attractive field from distance, without the physical contact of the magnetic constructions. In this manner every mechanical union and friction is avoided having as a result to obtain a repulsive field within an attractive field. In this manner one magnetic construction pulls the confronted magnetic contraction through an attractive field but these never have contact because of the repulsive field also existing between them. Constructions of this kind, i.e. attractive interaction from distance are useful in robotics and in the assembly lines of fabricated products. Also, the interactions of the unstable balance as well as the stable balance (secured attractive interaction from a distance), which are introduced in magnetism for the first time, may be exploited by the magnetic industry and depending on the design application may become particularly useful due to the co-existence of the homogeneous and the heterogeneous field between the magnetic constructions, at the spatial distances where the attractive forces are equal to the repulsive ones. By these capabilities, the invention can contribute in eliminating different disadvantages of the state of the art, since its technology may be successfully incorporated in the generation of existing and also new technological alternative applications.

BRIEF DESCRIPTION OF THE DRAWINGS

FIG. 13 shows on top perspective view and on the bottom elevation of the sample of the magnetic construction (12).

FIG. 25 shows the magnetic arrangement (10B) ready to be glued on the base (11) or (11A).

Herewith are referred for the facility of cross-referencing by the reader often used identical reference numbers from 1 to 13 for the characterization of common components in the figures:

1—north pole,
2—south pole,
3—front bundle of dynamic lines that is emitted always from the front face-pole (15) on the front placed (31) dipole (13) in an arrangement.
4—front/rear bundle of dynamic lines that are emitted from the rear face-pole (32) of a front placed (31) dipole (13) in an arrangement.
4A—front/rear bundle of dynamic lines that are emitted from the front face-pole (15A) of a rear placed (9) dipole (13) in an arrangement.
5—neutral area of the dipole magnet (7) or (13) between its two poles, in regard to the dynamic lines at the environmental air space.
6—conceivable surface that cuts vertically every loop (8) of the magnetic lines exactly at the stage where they form a curvature and leave every polar area (3).
7—the known to the state of the art typical dipole magnet.
8—loop of magnetic lines of a dipole magnet (7).
8A—loop of magnetic lines that flows through any front placed dipole (7) and a rear and marginally in line sideways placed dipole (9).
9—at the rear placed dipole in every arrangement that makes use of it.
10—magnetic arrangement as a general term of the invention.
10A—in FIGS. 15 and 19 represents typical magnetic arrangement—on the guide (19) confronting the magnetic arrangement (10B). In FIGS. 16, 17, 18 and 19 represents the specific magnetic arrangement of the first constituted constructional type of arrangements.
10B—in FIGS. 15 and 19 represents typical magnetic arrangement—on the guide (19) confronting the magnetic arrangement (10A). In FIGS. 16, 17, 18 and 19 represents the specific magnetic arrangement of the first constituted constructional type of arrangements.
11—thin planar base where on it is glued every different magnetic arrangement that slides on the guide (19) forward-backwards.
11A—thin planar base as (11) characterized by the fact that the magnetic arrangement that is glued on it is elevated by an additional wedge (11B), which is glued on it at the front part.
11B—additional wedge that is glued on the front part of the base (11A).
12—magnetic construction as a general term of the invention.
12A—in FIGS. 15 and 19 represents typical sliding magnetic construction on the guide (19) confronting the magnetic construction (12B). In FIGS. 16, 17, 18 and 19 represents the specific magnetic construction of the first constituted constructional type of arrangements.
12B—in FIGS. 15 and 19 represents typical sliding magnetic construction on the guide (19) confronting the magnetic construction (12A). In FIGS. 16, 17, 18 and 19 represents the specific magnetic construction of the first constituted constructional type of arrangements.
13—the specific typical right cylindrical dipole permanent magnet that is used by preference in all the arrangements.
14—the right and vertical 90° (right angle) position that are placed the dipole magnets (13) in regard to the horizontally theorized surface of the base (11) and (11A) of the magnetic constructions (12) and the guide (19).
15—face-pole of the front placed (31) dipole (13) in a magnetic arrangement.
15A—face-pole of rear placed (9) dipole (13) in a magnetic arrangement.
16—radius a of the specific typical right cylindrical dipole magnet (13) that is used by preference in all the arrangements.

The rest of the reference numbers are explained through the description and the drawings.

DETAILED DESCRIPTION OF THE PREFERRED EMBODIMENT

The magnetic system is an application producing three different interactions and the relevant to it opposites between the empty air space of the manually sliding pair of confronted magnetic constructions that are uni-directionally interacting in a guide.

The above realization is done by the magnetic apparatus with specific polar and field properties that achieves as a means the different magnetic requirements of the application and its necessity to constitute a comprehensive system. The magnetic apparatus provides the guide, the magnetic constructions and the magnetic arrangements that form each magnetic construction, these being constituted by permanent magnets and at the position where one magnetic construction has a front dipole, the respective opposite arrangement of the magnetic construction of the pair does not have an opposite front dipole but has it on the side either in horizontal or vertical or otherwise diagonal delimitation opposite the first one.

All this is described below is FIGS. 1 to 10 defining the detailed preferred embodiment that theoretically and as a core technology exploits the dynamic lines of the dipole permanent magnets to form the system. Also, from FIGS. 11 to 39 is described the detailed preferred embodiment of the magnetic apparatus that as a mechanism-means is called upon to make use of this core technology and realize the application that in all its constructions fulfills all the required variations that the completeness of a system must expose. Furthermore, FIGS. 40 to 42 describe in detail the method of manufacturing in regard to the symmetries that form the technology of the magnetic apparatus. The method describes the relation that exists between the described symmetries and an infinite square mesh of plane tiling p4m and additionally shows that through this relation of the arrangements with the entity of the mesh p4m, many other embodiments can be manufactured with more or less permanent magnets embodied in the arrangements than the ones already shown. In this case this method provides the opportunity of constructing other embodiments if one chooses different parts of the mesh p4m while keeping all other elements of the technology as is.

FIGS. 1, 2, 3, and 4 show the exploited constructional typical step of the application realized by the apparatus, which is the core and the common step in all the technology of the invention, and depicts the manner by which the invention exploits and makes useful all the polar properties of the loops of the magnetic lines. Each dipole permanent magnet used in the arrangements, in one or the other way, makes use of this exploited constructional typical step.

Figure 1:
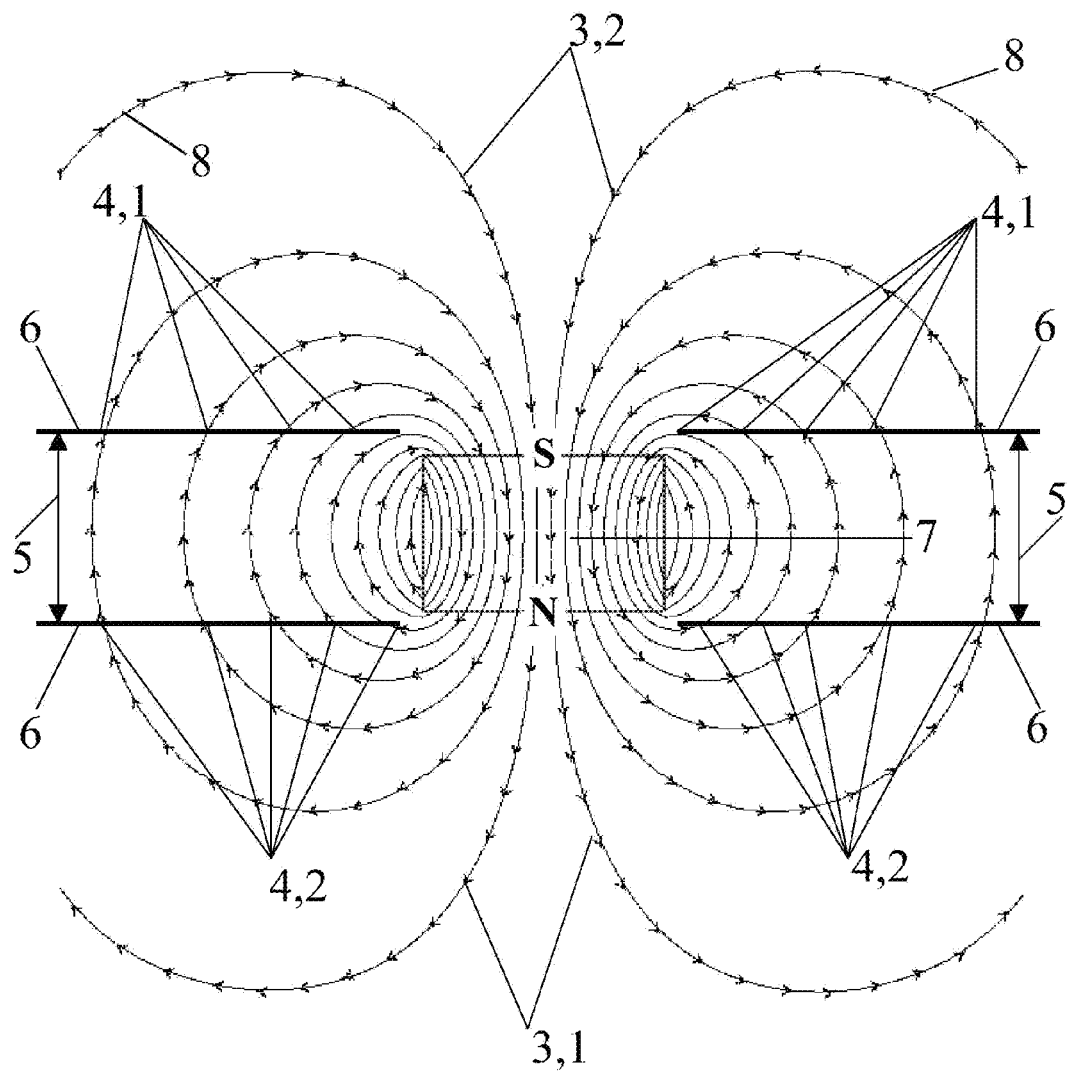
FIG. 1 shows the exploitation of the additional polar properties of the loops (8) of a dipole by utilizing the front (3) and the front/rear (4A) bundle of dynamic lines.

FIG. 1 shows every specific in magnetic vector and direction part of the loop (8) of a dipole (7), that is constituted by the front bundle of dynamic lines (3), with two poles corresponding to every two loops, which poles regard the North (1) and South (2) of the dipole (7) and also the front/rear bundle of dynamic lines (4), which is in the neutral zone of the magnet (5), where there two other beneficial poles are found to be present, which correspond to each bundle of the loops (8) of the neutral zone (5) and are of opposite polarity from their respective adjacent front poles of the same loop. The term "beneficial pole" is used in the sense that in the interactions of the arrangements' of the invention this "beneficial pole" functions in the same way and with the same properties as a pole with two loops (8, 8) as shown in FIG. 1. In every planar conceivable surface (6) that cuts vertically every loop (8) of the magnetic lines, exactly at the points where the magnetic lines curve leave every polar area (3) and are located in the named neutral zone (5) of the magnet, every magnetic line has an opposite vector and direction from what each one had at its neighboring polar area (3). All lines at that planar conceivable surface (6) that cuts there vertically the dynamic lines, are of opposite polarity from the neighboring pole (3) that they belong. We name then, these dynamic lines front/rear bundle of dynamic lines (4) specifically for their recognizable identification. This bundle is also in that area (6) always of opposite polarity than the adjacent pole (3), in which these are also present and differ from this part of the dynamic lines coming from the adjacent polar region (3) and which for their recognizable identification are particularly designated here as front bundle of dynamic lines (3). At the north (1) pole (3) of a dipole (7), which is designated as front bundle of dynamic lines (3), the adjacent front/rear bundle of dynamic lines (4) coming from a perpendicularly considered level (6) jointly from the two adjacent loops (8, 8) of the neutral zone (5) are of south polarity (2, 2) and this as (4, 2) is identical to the south (2) pole (3) of the dipole (7). The same case applies to the south (2) pole (3) of the same dipole (7), which is also designated as front bundle of dynamic lines (3) and the adjacent front/rear bundle of dynamic lines (4), which comes from a vertically considered level (6) jointly from the two adjacent loops (8, 8) of the neutral zone (5) is of north (1, 1) polarity (4,1) and is identical to the north (1) pole (3) of the dipole (7). Because then of the fact that every dipole (7) has two poles (3, 1 and 3, 2) the invention exploits constructionally the areas (5) of every loop (8, 8) of every dipole (7), utilizing the differentiation that the dynamic lines attain in their magnetic vector and direction in space, when they penetrate in the neutral zone (5) of the magnet (7) so that every dipole (7) has two poles (3, 1 and 3, 2) but every loop (8, 8) of the dipole (7) possesses two more beneficially exploited constructionally-wise polarities (4, 2) and (4, 1).

Figure 2:
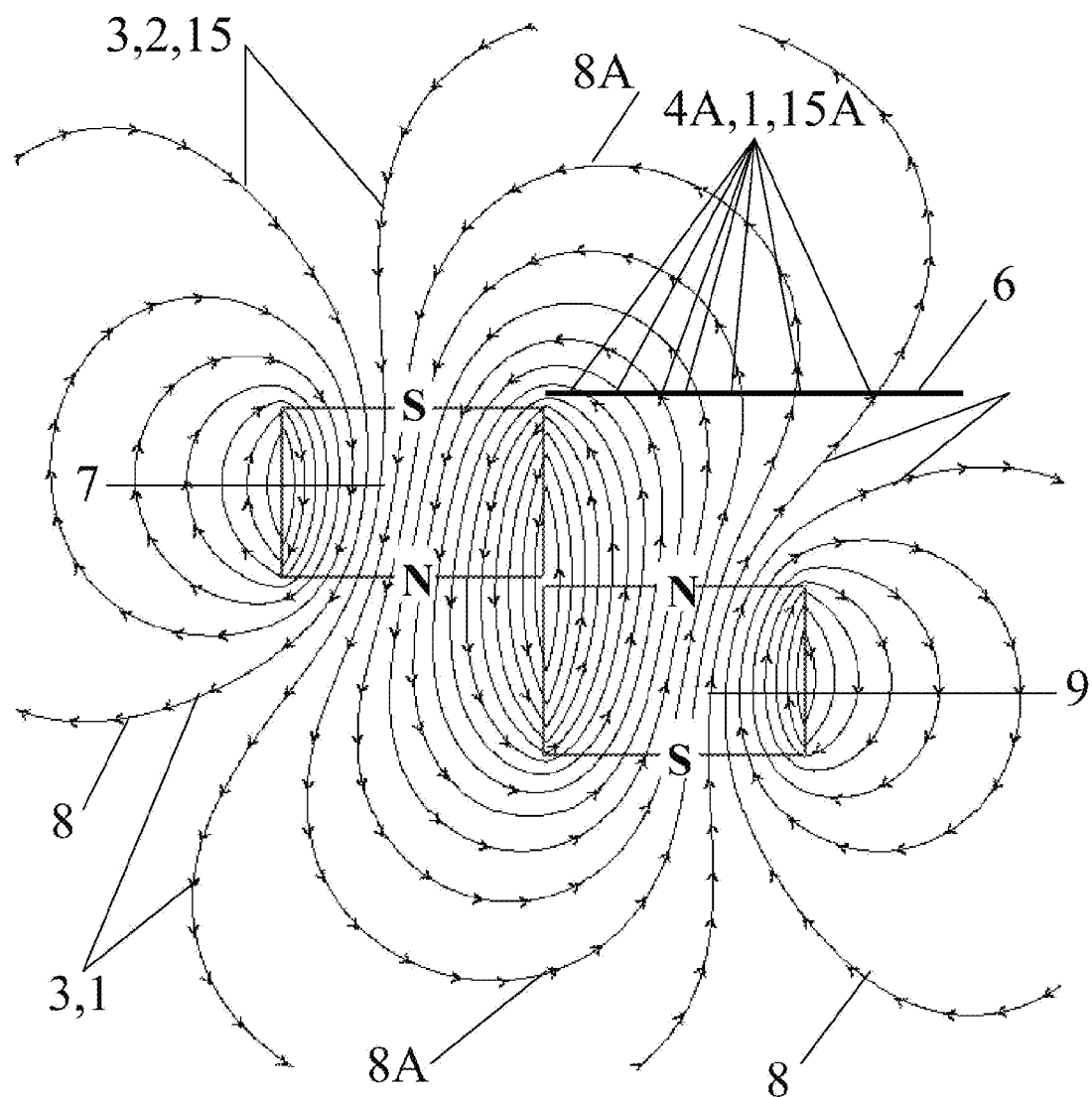
FIG. 2 shows the front (3) and the front/rear (4A) bundle of dynamic lines with a front (7) and a rear dipole (9).

FIG. 2 shows a second case, where due to the nature of magnetism the dynamic lines always select the closest and easiest way or mean to pass through both magnetic materials that are nearby, to close a magnetic loop (8A) as dynamic lines. These corresponding results are achieved by positioning a dipole (9) in marginal adjacent rear position from a front dipole (7), where the from pole of the rear dipole (9) is of the same polarity, meaning north (1) with the rear polarity of the front dipole (7) so, one front bundle of the dynamic lines (8A) of the rear dipole (9), unifies with the bundle of dynamic lines of the loop of the front dipole (7) in this manner is formed a single and uniform loop of magnetic lines (8A) is formed that penetrates both dipoles (7, 9). If the front bundle of dynamic lines (3) of South polarity (2) is designated as the one coming from the front dipole (7), then the total front bundle of the rear dipole (9) will be designated as front/rear bundle of dynamic lines (4A) of North polarity (1) executing the similar operations as in the first case of FIG. 1 (4, 1), referred above as one dipole (7) only, with the exception that here in FIG. 2 the front/rear bundle (4A, 1) is emitted from the front bundle of dynamic lines of the rear positioned dipole (9). The front/rear bundle of dynamic lines (4), is emitted spherically in the three-dimensional space from a cylindrical dipole.

Figure 3:
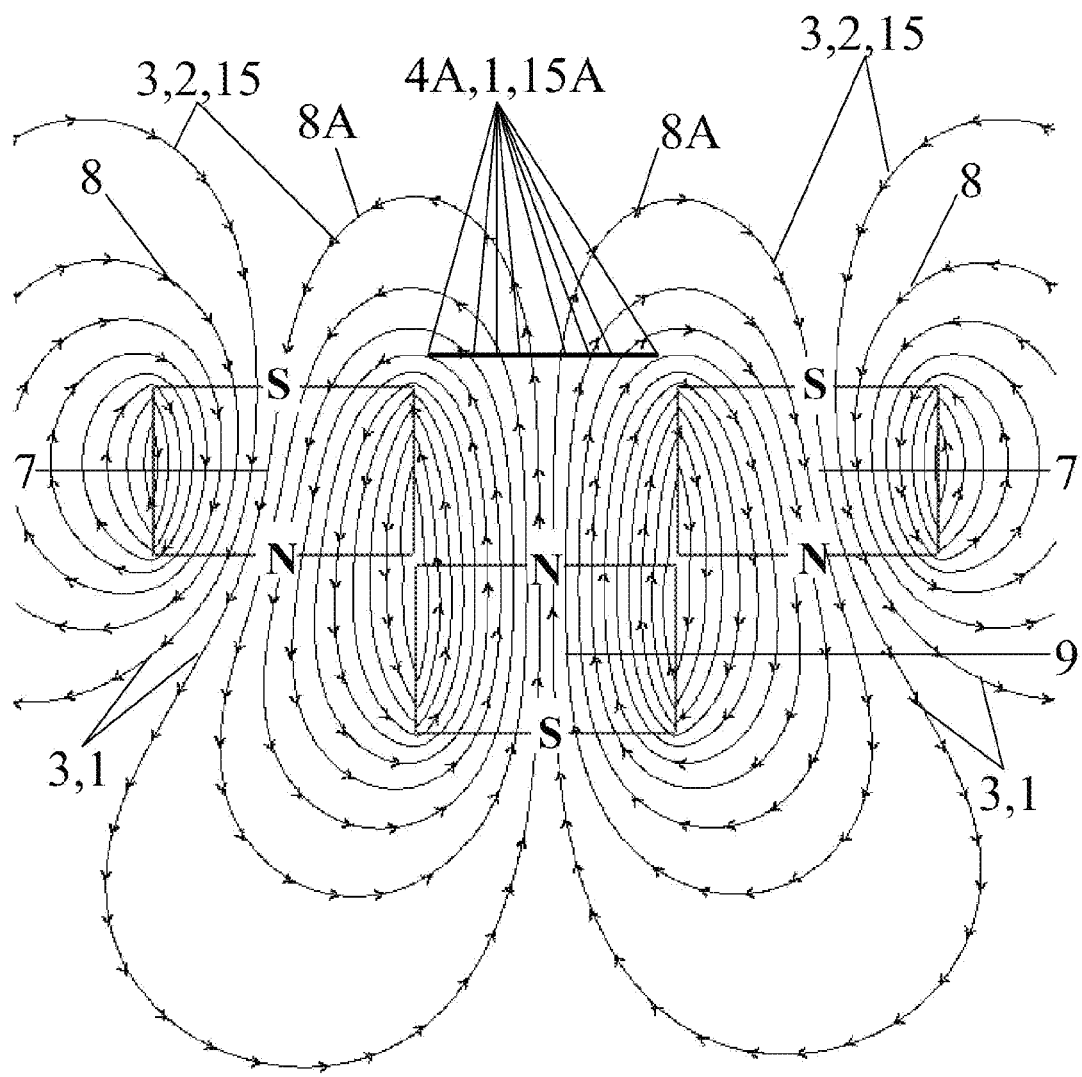
FIG. 3 shows the front (3) and the front/rear (4A) bundle of dynamic lines with two marginal forewords (7, 7) and a central rear dipole (9).

FIG. 3 shows the front/rear bundle of dynamic lines (4A, 1) being formed from two front dipoles (7, 7) and one rear dipole (9), where there are two loops (8A, 8A) passing through the two front dipoles (7, 7) and the rear dipole (9). Thus, there are various combinations, wherein loops may be present of the type (8A) passing through two magnetic dipoles. In the case of three front dipoles (7, 7, 7) and a rear dipole (9), three loops (8A, 8A, 8A) etc. will be formed and the maximum number is six loops (8A×6), between equally sized proper cyclic cylindrical magnetic dipoles, namely when there are six front dipoles (7) in the front and around a rear dipole (9), with p6m symmetry, of hexagonal planar mesh of plane tiling, as shown exemplarily in FIG. 4. FIG. 3 and the above referred as in FIG. 4 is exemplary, since (4A) may contain two or three or up to six loops (8A×6), which will depend on the manner that the magnetic dipoles are arranged in the construction of each magnetic arrangement.

Figure 4:
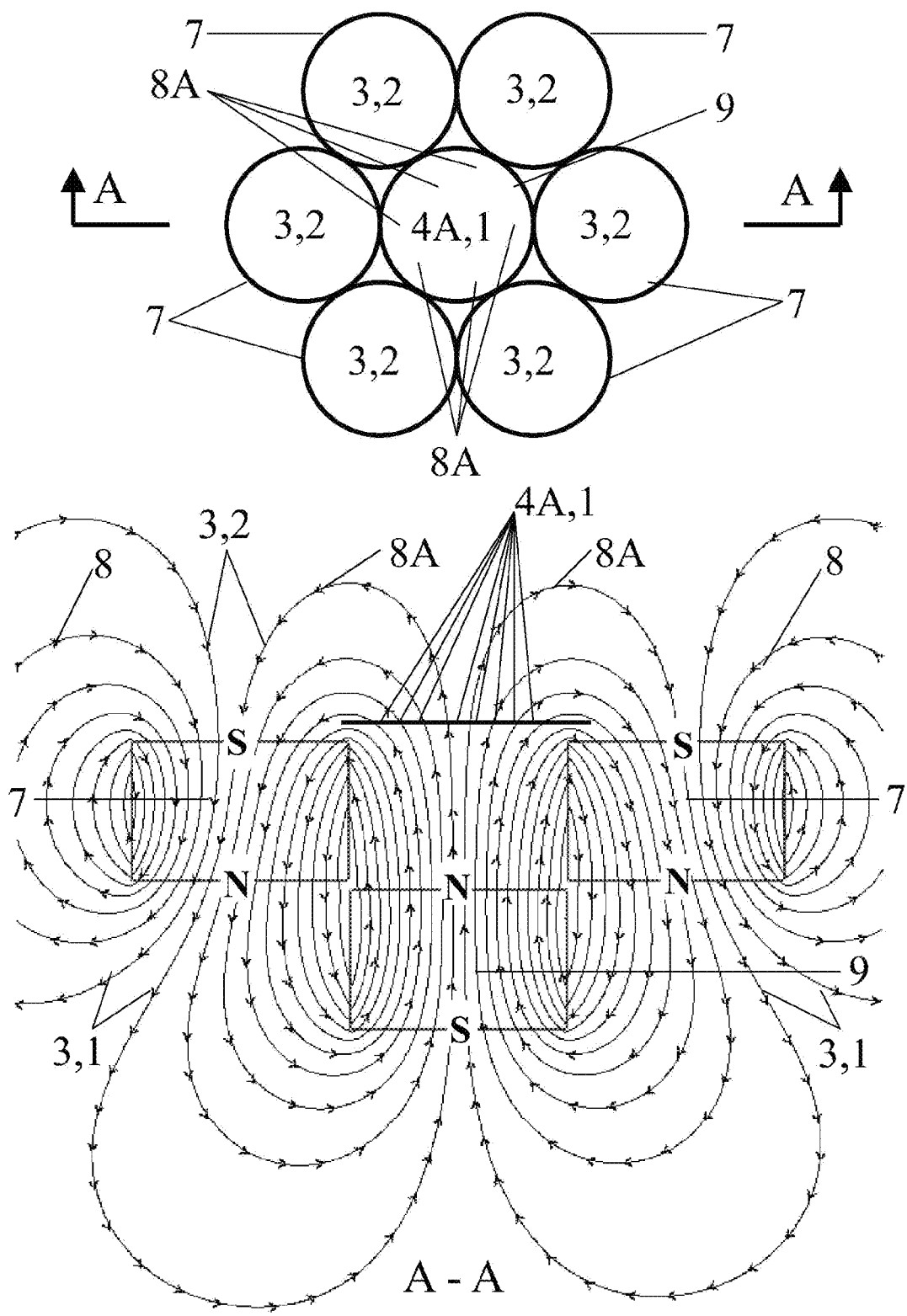
FIG. 4 shows on top a plan and on the bottom a section where is viewed the front (3) and the front/rear (4A) bundle of dynamic lines with six marginal front (7) and a central rear dipole (9), that shows the outmost number of loops (8A) that can exist between a rear dipole (9) and six marginal sideways situated front dipoles (7).
Figure 7:
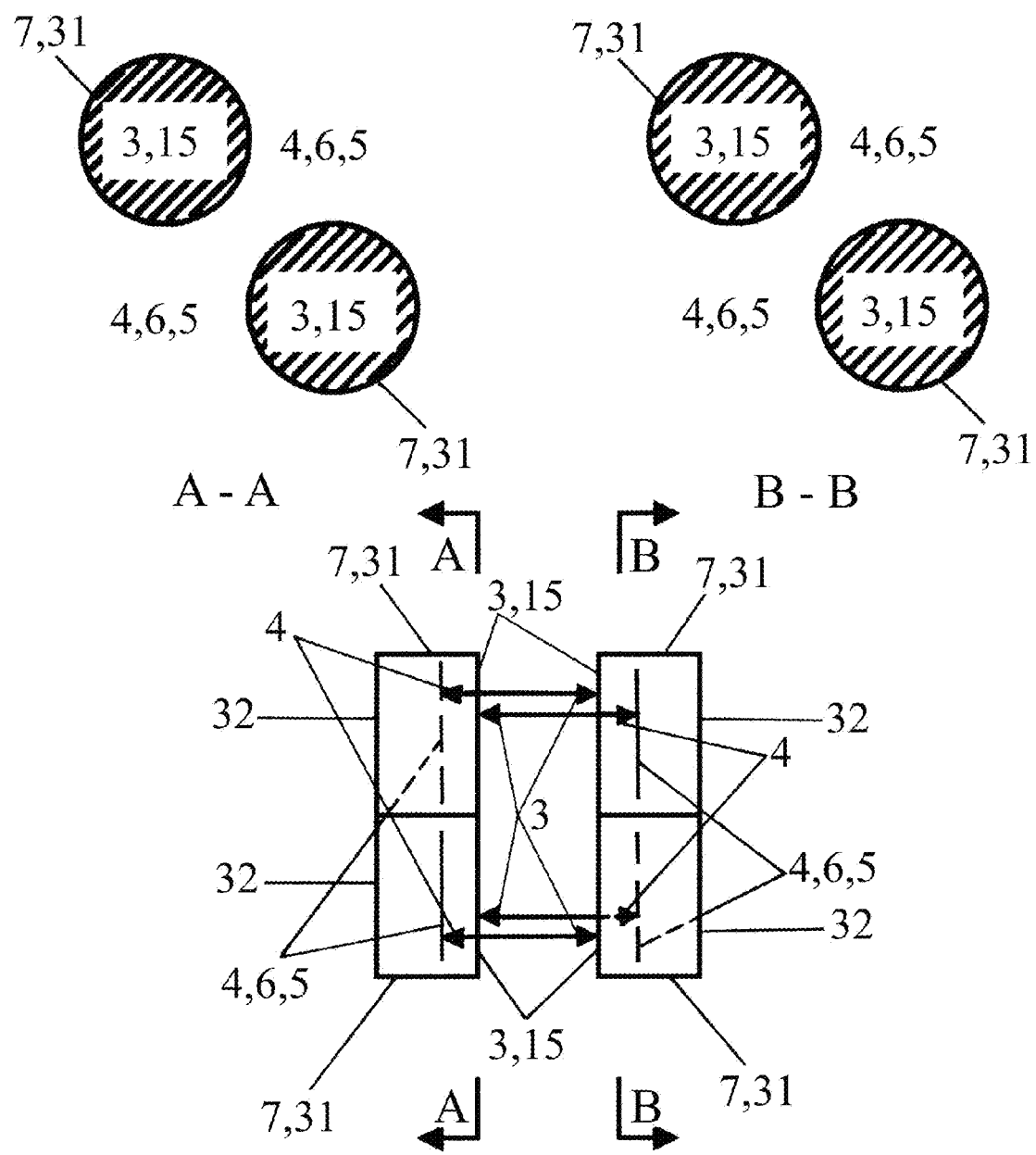
FIG. 7 shows on bottom two confronted magnetic arrangements each comprised of two magnets aligned in one row-array and on top two sections A-A and B-B of the arrangements. On bottom shows separate unique interactions of front-front/rear (3-4) bundles of dynamic lines, when the front/rear bundles of dynamic lines are (4, 6, 5) and their polarity is the same with the rear face-pole (32) of the front (31) dipole (7).
Figure 8:
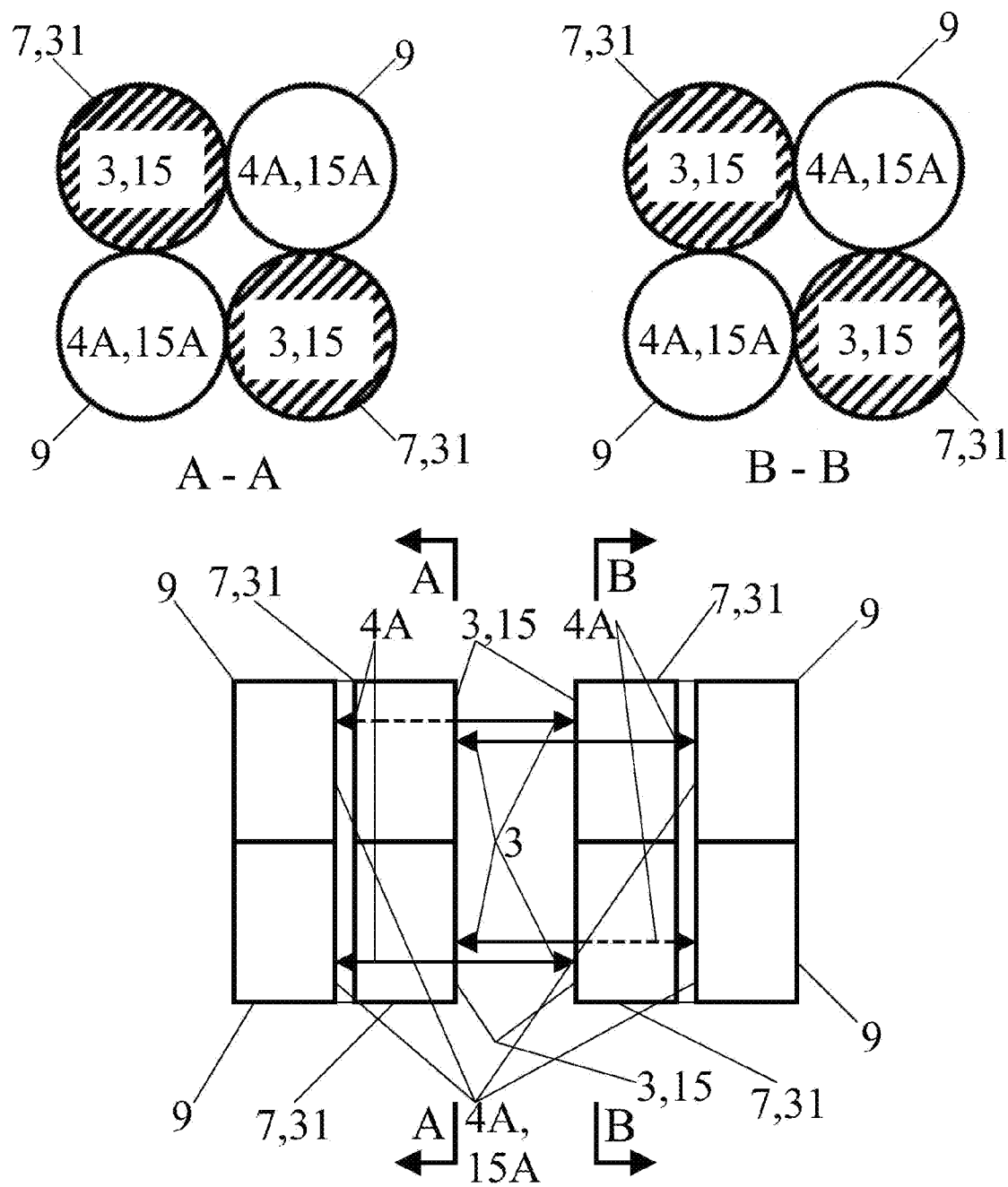
FIG. 8 shows on bottom two confronted magnetic arrangements each comprised of four magnets aligned in two rows-arrays and on top two sections A-A and B-B of the arrangements. On bottom shows separate unique interactions of front-front/rear (3-4A) bundles of dynamic lines, when the front/rear bundles of dynamic lines is (4A) and their polarity is the same with the front face-pole (15A) of the rear dipole (9).

The exploitation of all the polar properties produced by the dynamic lines of the loops of the magnetic lines of a dipole either by the manner of FIG. 1, or by the manner of FIGS. 2, 3 or 4 constitutes the exploited constructional step of all the arrangements of the invention. In any of the mentioned arrangements, the above-mentioned exploitation of the various cases of FIG. 1 and of the FIGS. 2, 3 and 4 is used, wherein the front/rear bundle of dynamic lines of FIG. 1 (4) is exactly similar in operation, as the front/rear bundle of dynamic lines (4A) of FIGS. 2, 3 and 4. Their only difference is in the intensity, namely in FIGS. 2, 3 and 4, the (4A) is more powerful in magnetic intensity than that (4) of FIG. 1. As regards the functions of the interactions, these are similar. An example of the function of the particular interactions is given with the FIGS. 8 and 10, which shows confronted dipoles as arrangements schematically, using the cases of the FIGS. 2, 3 and 4, wherein the bundles of the dynamic lines (4A) comes from rear positioned dipoles (9). As applied in these figures for (4A), the same applies for the case of FIG. 1 (4), where in this case no rear dipoles (9) are used, but at the area (4) of the loops, the polarity of which is identical with the rear pole of the dipole, is exploited and these interaction cases are shown in FIGS. 7 and 9.

FIGS. 5, 6, 7, 8, 9 and 10 show the interactions of the above-mentioned cases of FIGS. 1, 2 and 3, in the construction of the interacting magnetic constructions located opposite one another. In the FIGS. 5 and 6, the front bundles of dynamic lines (3) of each dipole (7) interact either attractively or repulsively with the front bundles of dynamic lines (3.) of each opposite dipole (7), with the FIG. 5 having for front/rear bundles of dynamic lines the (4) and FIG. 6 having the (4A). Also, the front bundles of dynamic lines (3) of each dipole (7) interact either attractively or repulsively also with the front/rear dynamic lines in FIGS. 7 and 8, with the FIG. 7 having for front/rear bundles of dynamic lines the (4) and FIG. 8 having the (4A).

Figure 9:
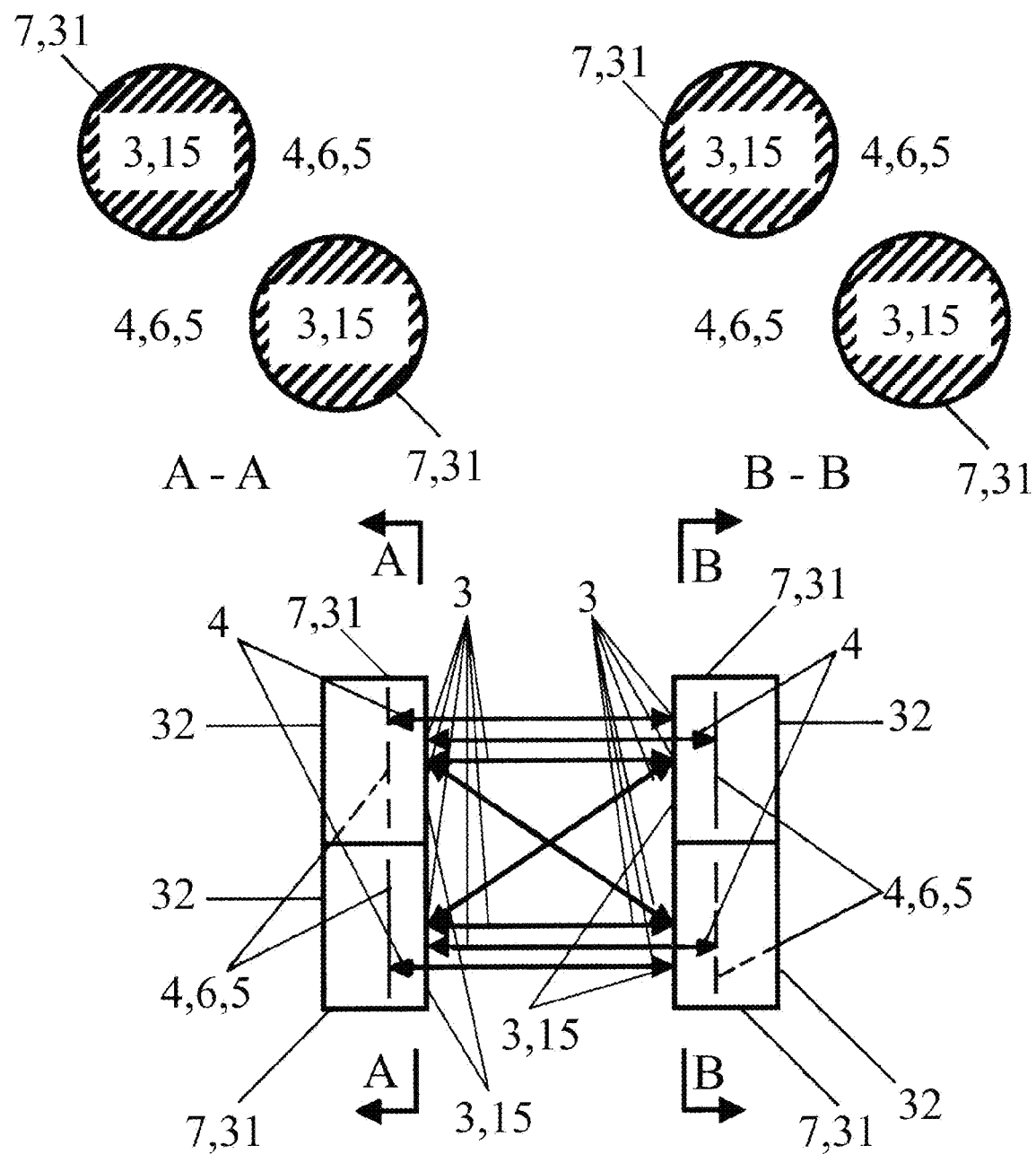
FIG. 9 shows on bottom two confronted magnetic arrangements each comprised of two magnets aligned in one row-array and on top two sections A-A and B-B of the arrangements. On bottom shows simultaneous, double interactions of the front-front (3-3) and the front-front/rear (3-4) bundles of dynamic lines, when the front/rear bundles of dynamic lines are (4,6,5) and their polarity is the same with the rear face-pole (32) of the front (31) dipole (7).
Figure 10:
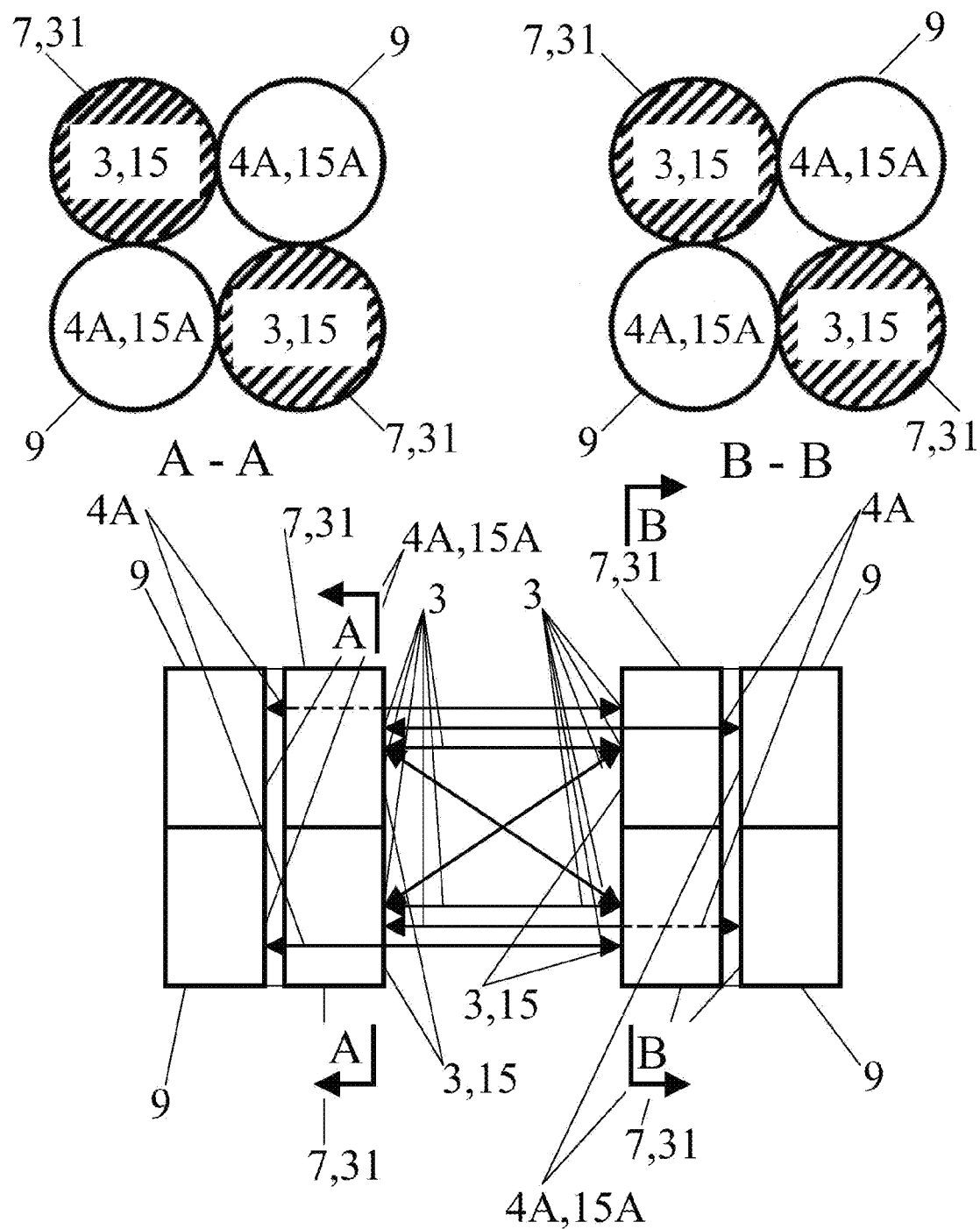
FIG. 10 shows on bottom two confronted magnetic-arrangements each comprised of four magnets aligned in two rows-arrays and on top two sections A-A and B-B of the arrangements. On bottom shows simultaneous, double interactions of the front-front (3-3) and the front-front/rear (3-4A) bundles of dynamic lines, when the front/rear bundles of dynamic lines is (4A) and their polarity is the same with the front face-pole (15A) of the rear dipole (9).

FIGS. 9 and 10 show the mutual dual front-front and front-front/rear interaction occurring simultaneously and in equivalence depending on the distance between the confronted dipoles (7,9), with the FIG. 9 having front/rear bundles of dynamic lines the (4) and FIG. 10 having the (4A).

Each magnetic arrangement of any design on each magnetic construction operates having additional beneficial poles in magnetism with multi-planar emission possibilities of north and south polarity with possibilities of a unique interaction of attractive or repulsive FIGS. 5, 6, 7, and 8, or simultaneous beneficial interaction between these polarities, FIGS. 9 and 10.

Figure 11:
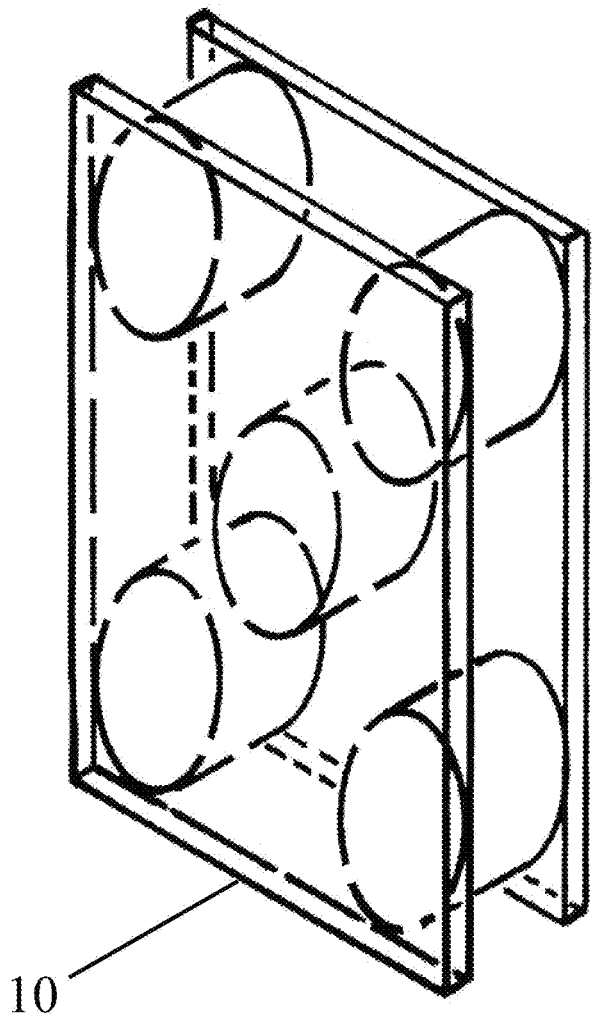
FIG. 11 shows a sample of the magnetic arrangement (10) in perspective.
Figure 12:
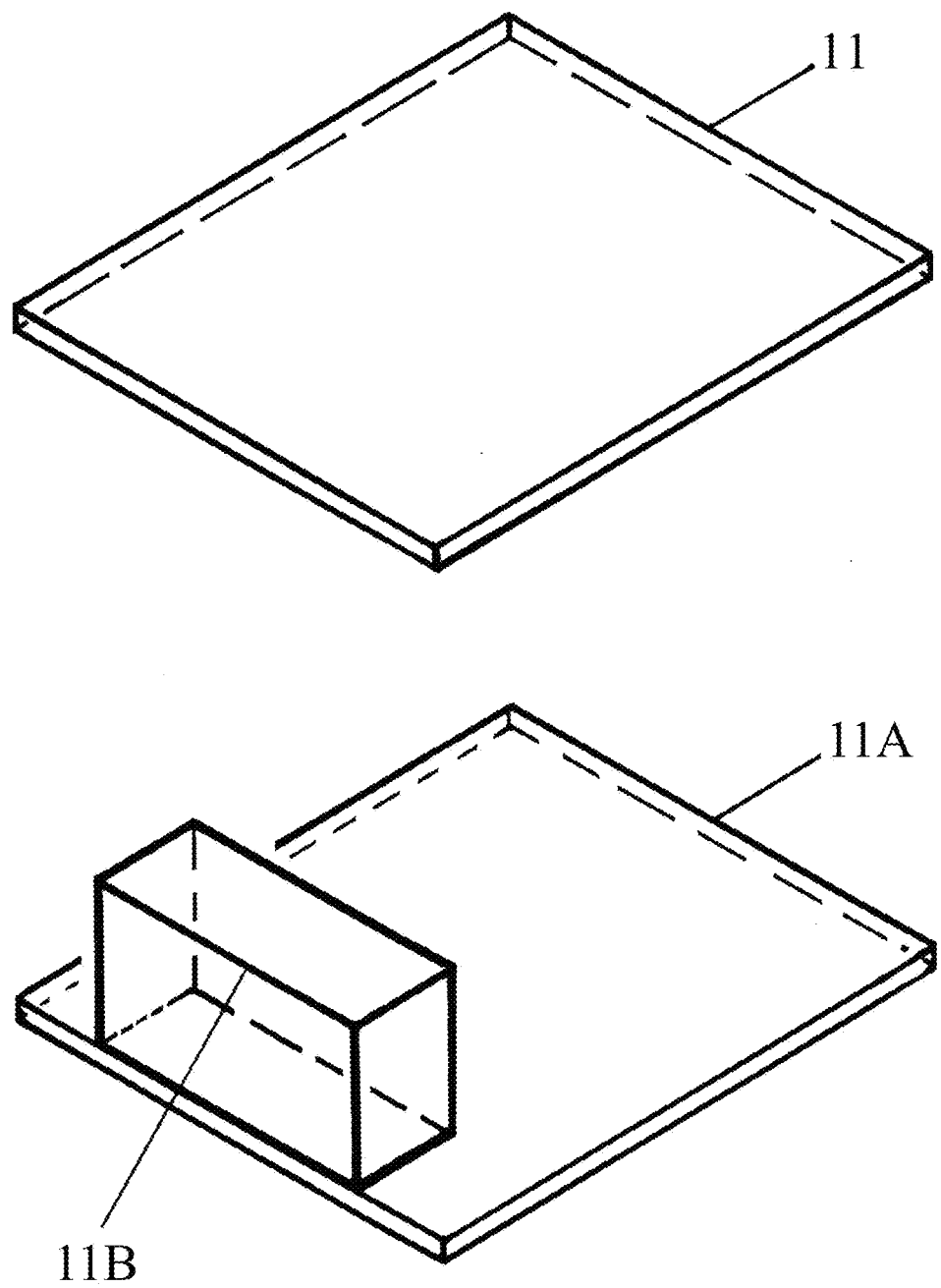
FIG. 12 shows samples of the base (11, 11A) in perspective.
Figure 14:
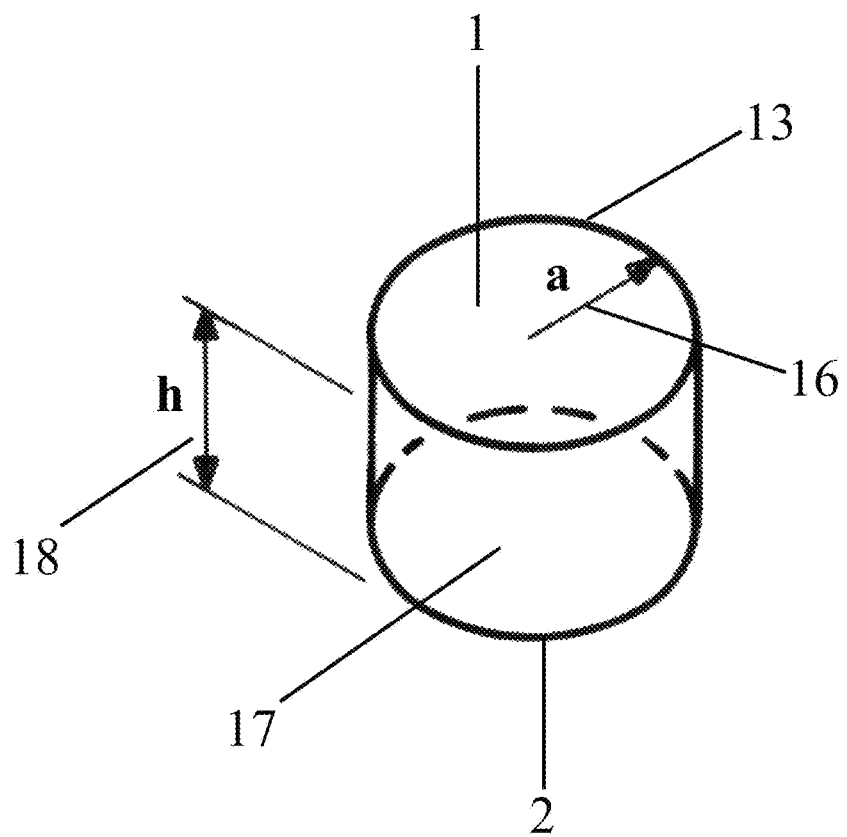
FIG. 14 shows perspective view of the typical right cylindrical dipole permanent magnet (13) that is utilized in all the arrangements of the invention.

FIG. 11 shows the magnetic arrangement (10), and FIG. 12 shows a planar base (11) or (11A) which may also have an elevated front base (11B). The magnetic arrangement (10) and the base (11) constitute a magnetic construction, FIG. 13 (12), the magnetic arrangement comprised of right cylindrical dipole permanent magnets (13) and these are arranged always on a vertical standing 90° orthogonal position (14), in relation to the horizontal theorized plane of the base of the constructions (11) and of the guide (19) accordingly. Also, the faces-poles of the magnets (15), which always face the opposite faces-poles of the opposite arrangements, constitute the north or south pole of each magnet (13). The cylindrical surface (17) constitutes the neutral zone between the poles.

Figure 19:
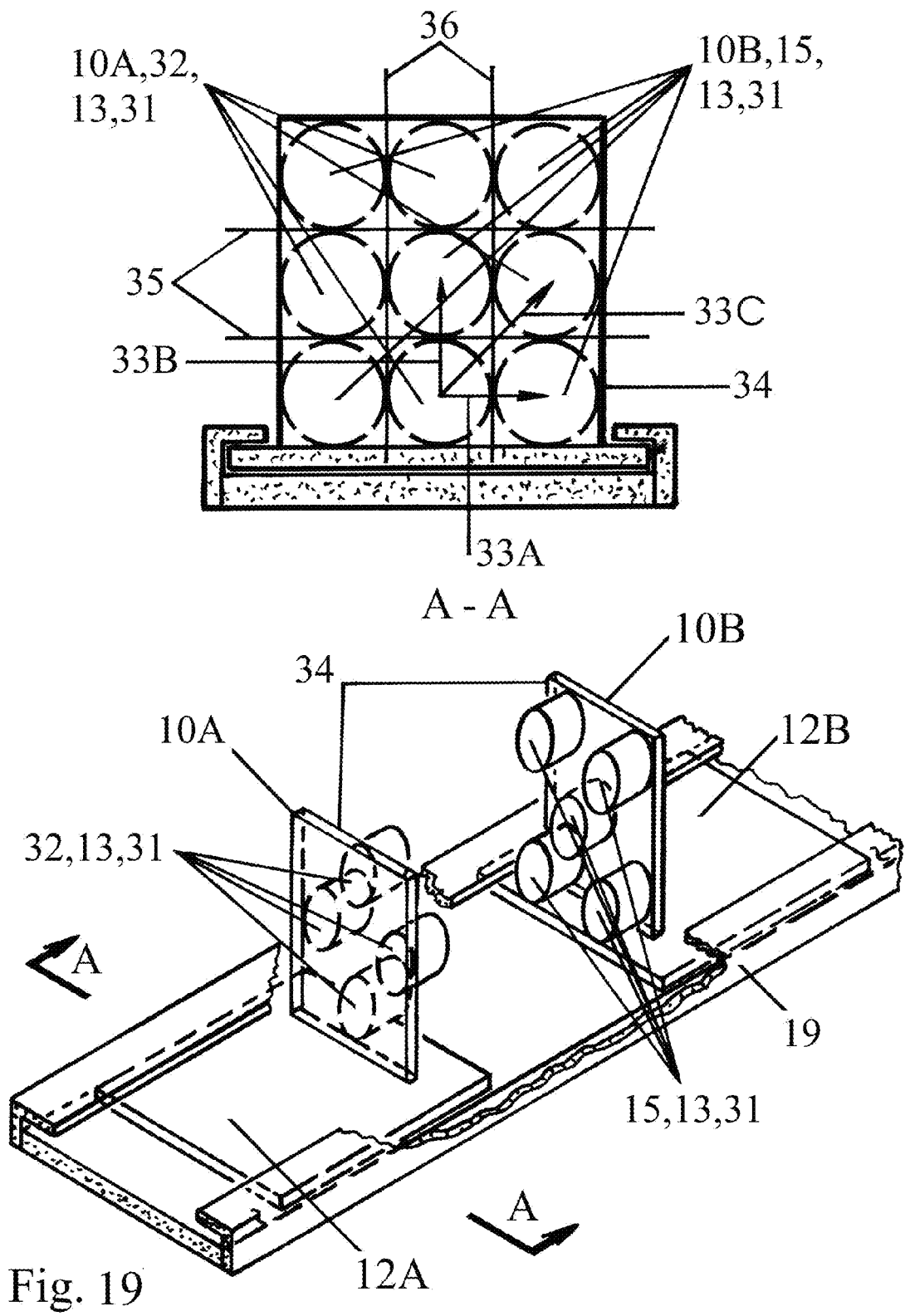
FIG. 19 shows at the bottom perspective view and of the magnetic apparatus and on top section A-A, typical, for all referenced symmetries (34) with marginal sideways horizontal and vertical alignment of the confronted and situated at the front (31) dipoles (13) of the arrangements.

FIG. 19 shows a typical right central cylindrical dipolar permanent magnet (13), which is preferably used in all the arrangements. The bases of the cylinder constitute the poles (1, 2) of the cylindrical magnet (13) with radius a (16), while the cylindrical surface (17) constitutes the neutral zone between the poles (1, 2) with height h, (18). The magnets employed by the invention may be of any analogous type and size, as long as a single selected type is for all the arrangements using these and each dipolar magnet (7) to be a right central cylinder (13) or a cylinder of a similar shape and the ratio between h (18) and base diameter 2a is preferably equal to $h=4/7(2a)$, without excluding a small deviation which will provide a smaller or larger ratio.

The geometry of the magnetostatic field determined by the geometry of the loops of the magnetic lines is the decisive and critical factor, which is served by the above-mentioned material requirements of the magnet and also of the ratio that is determined. If this geometry of the magnetostatic field that the loops of the magnetic lines have, is served by another form and ratio of magnets, it will cause the same results that the description and claims of the method determine. Each right central cylindrical dipolar magnet (13) of the invention is similar to any other used, in order to apply the claims of the application and its method. The ratio between height h (18) and diameter base 2a of every magnet to be equal to $h=4/7(2a)$ and the height to be h (18) 8 mm and the base radius a (16) is 7 mm, so that 2a equals 14 mm, the Gauss value for each north or south pole for each magnet is on average 4000 Gauss±100 Gauss, the mean flux—(X10μWb) for each north or south pole in each magnet varies between 296 and 308 and the type of the material of each magnet (13) is Nd—Fe—B.

Figure 15:
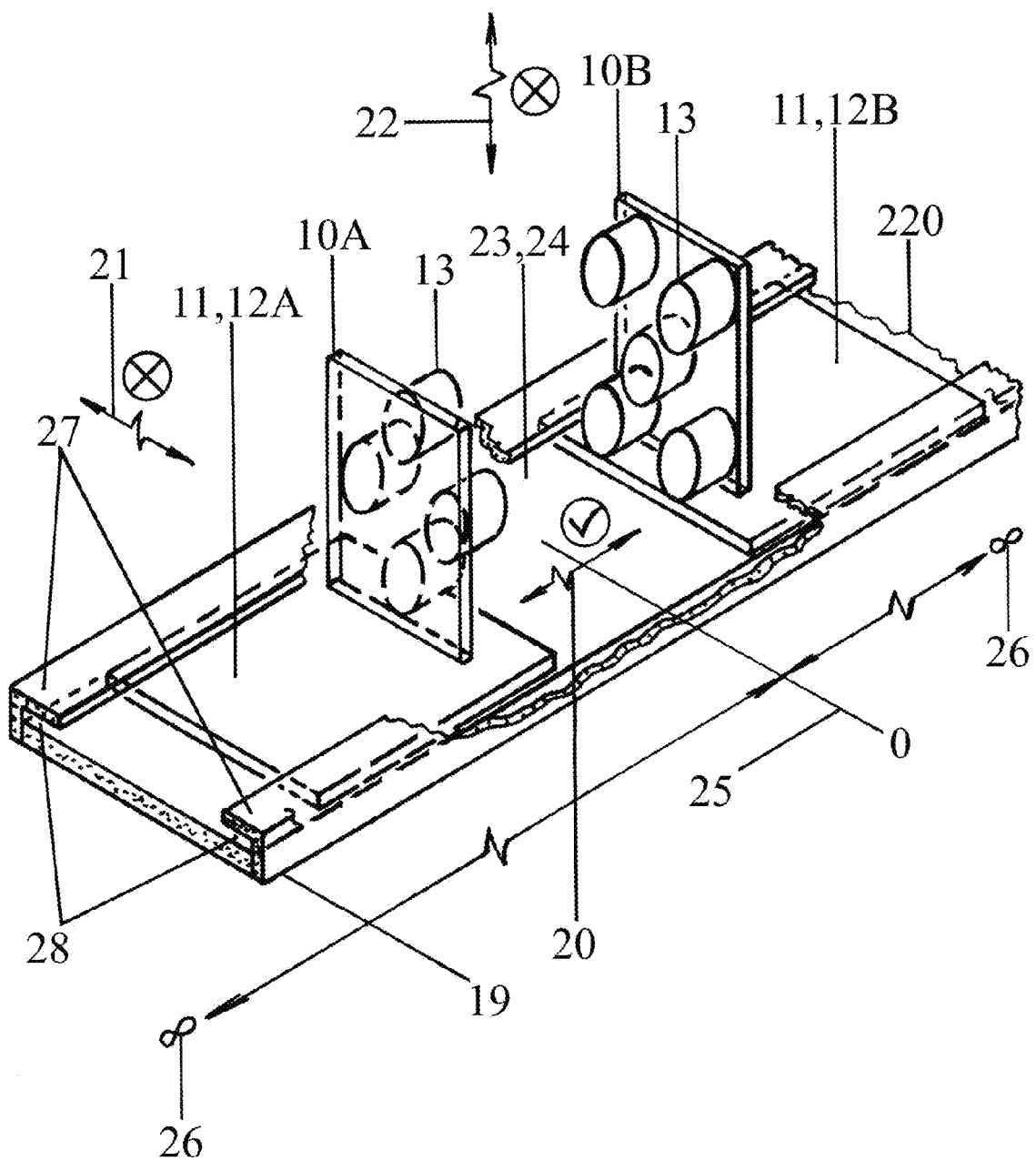
FIG. 15 shows a general perspective view of the application (220), the guide (19) with two magnetic constructions (12A, 12B) and freedom of movement of them only foreword-backward (20) with their faces being always parallel and confronted forbidding their movement towards the other two spatial dimensions (21,22).

FIG. 15 shows general perspective representation of the application (220) constituted by the guide (19) with two sliding magnetic constructions (12A, 12B). When two of the magnetic arrangements (10A, 10B) of the magnetic apparatus are positioned on a flat base (11, 11) constituting a magnetic construction (12A, 12B), respectively and afterwards they become confronted one against the other, with only one freedom of sliding motion (20), due to any manner-guide (19) which will guide these only to one spatial dimension in the interactions (20), blocking the motion to the other two spatial dimensions (21, 22), maintaining their faces always parallel, these magnetic constructions create in the single empty air space (23) and depending on the distance (24) varying from zero distance (25) to the theoretical infinity (26) different properties of similar or opposite poles and interactions. The assembly consisting of the guide (19) and the two magnetic constructions (12A, 12B), with possibility of interaction between them, constitutes the application (product) (220), namely the magnetic system. Subsequently, the construction of the application is determined, by the positioning of the dipoles (13) in each mentioned arrangement but also the operations, the behaviors as well as the interactions of their dynamic lines are determined. Also, it is here explained how these dynamic lines are operating and modified, depending on the different delimitated distance (24) between the magnetic constructions (12A, 12B).

In order to create three different polarities, as regards the like and unlike poles and the three different interactions of the magnetic constructions, FIG. 15 (12A, 12B) depending on the distance (24) separating the two magnetic constructions, which are herein mentioned as typical also for the subsequent ones, a single manual motion (20) of the magnetic constructions (12A, 12B) should be provided, i.e. the one moving against the other in a single spatial dimension (20) with no possibility of motion in the other two spatial dimensions (21, 22). In the invention, each pair of magnetic constructions which interact between them (12A, 12B) have for each magnetic construction (12A, 12B) the magnetic arrangements (10A, 10B) adhered on a thin planar base (11), which moves on a planar guide (19), which over the length of the interacting path of the magnetic constructions (24) and on its two sides the guide (19) has an elevated obstacle with a tooth projected inwards (27) which create the channel (28), that allows each magnetic construction (12A) to be guided in a single spatial dimension (20), forward-backwards (20), against the other magnetic construction (12B), but blocks their motion to the other two spatial dimensions (21, 22).

When reference is made to the description and drawings, to like or unlike front poles of the two confronted magnetic constructions, which constitute a comprehensive constructional type of arrangements, this reference always determines the initial property of the polarity of the poles in the arrangements, without any interaction of the constructions occurring on the guide. That is, by the phrase "First Comprehensive Constructional Type Of Arrangements (FCCTOA) with like front poles", it is meant that the front poles of each arrangement is either north or south, initially, when no interaction is present between them. It is noted, as already mentioned, that whereas the initial front polarities are always present there, and in the interactions themselves, however, these same initial front polarities apply only in a specific spatial range, since the magnetic constructions subsequently change, during the interactions, the property of each initial polarity depending on the distance. The subsequent change of the already present initial property of the interacting polarity, depending on the distance, due to the application technology, is marked by the typical exploited constructional step.

Figure 16:
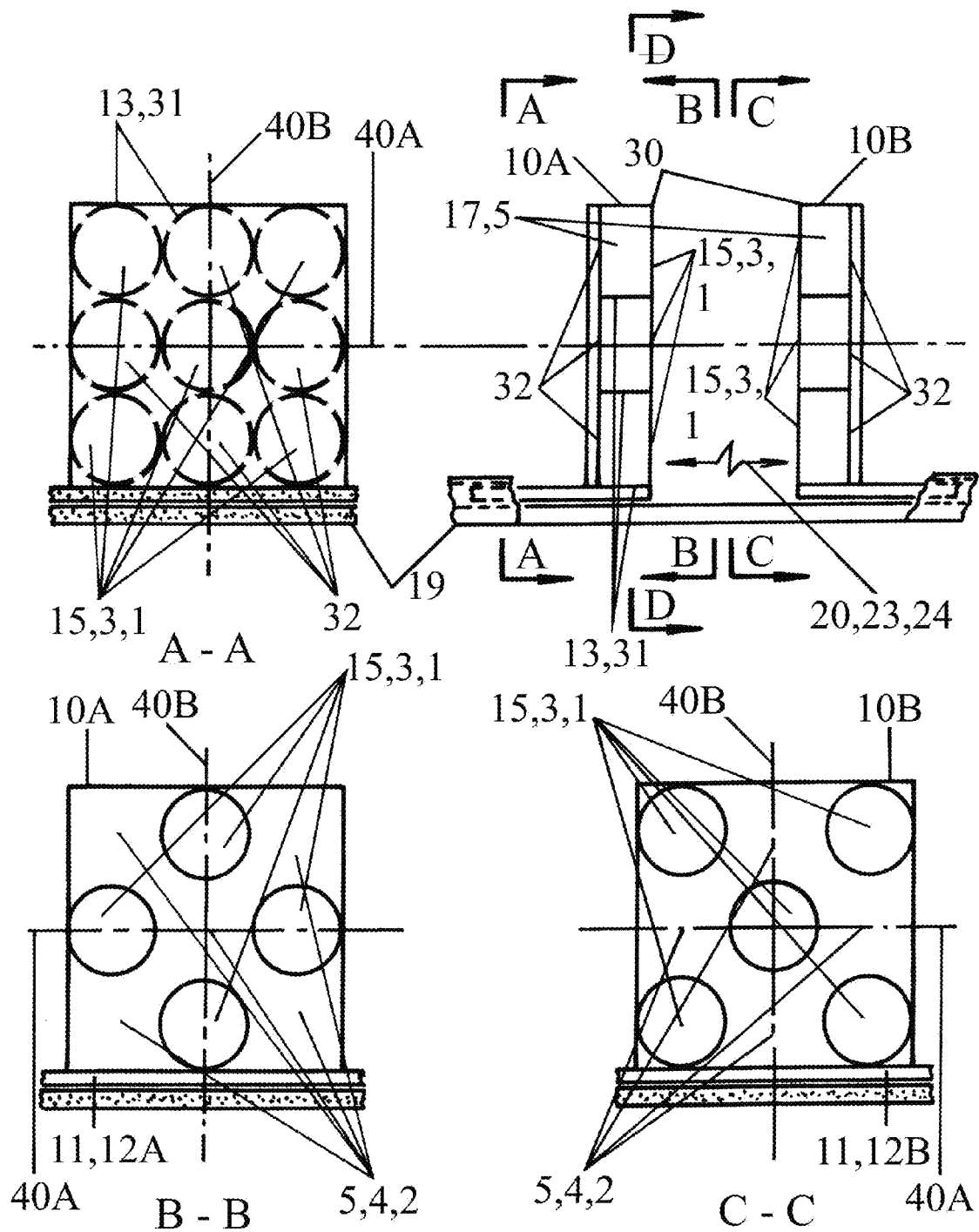
FIG. 16 shows as magnetic apparatus the First Comprehensive Constructional Type Of Arrangements (FCCTOA) with north (1) like front poles (15, 3) in elevation at the top right part of the Fig., with the section A-A at the left and right underneath sections-B-B and C-C that show the front part of the arrangements (10A, 10B). The section D-D that is cutting the elevation is shown on FIG. 18.
Figure 17:
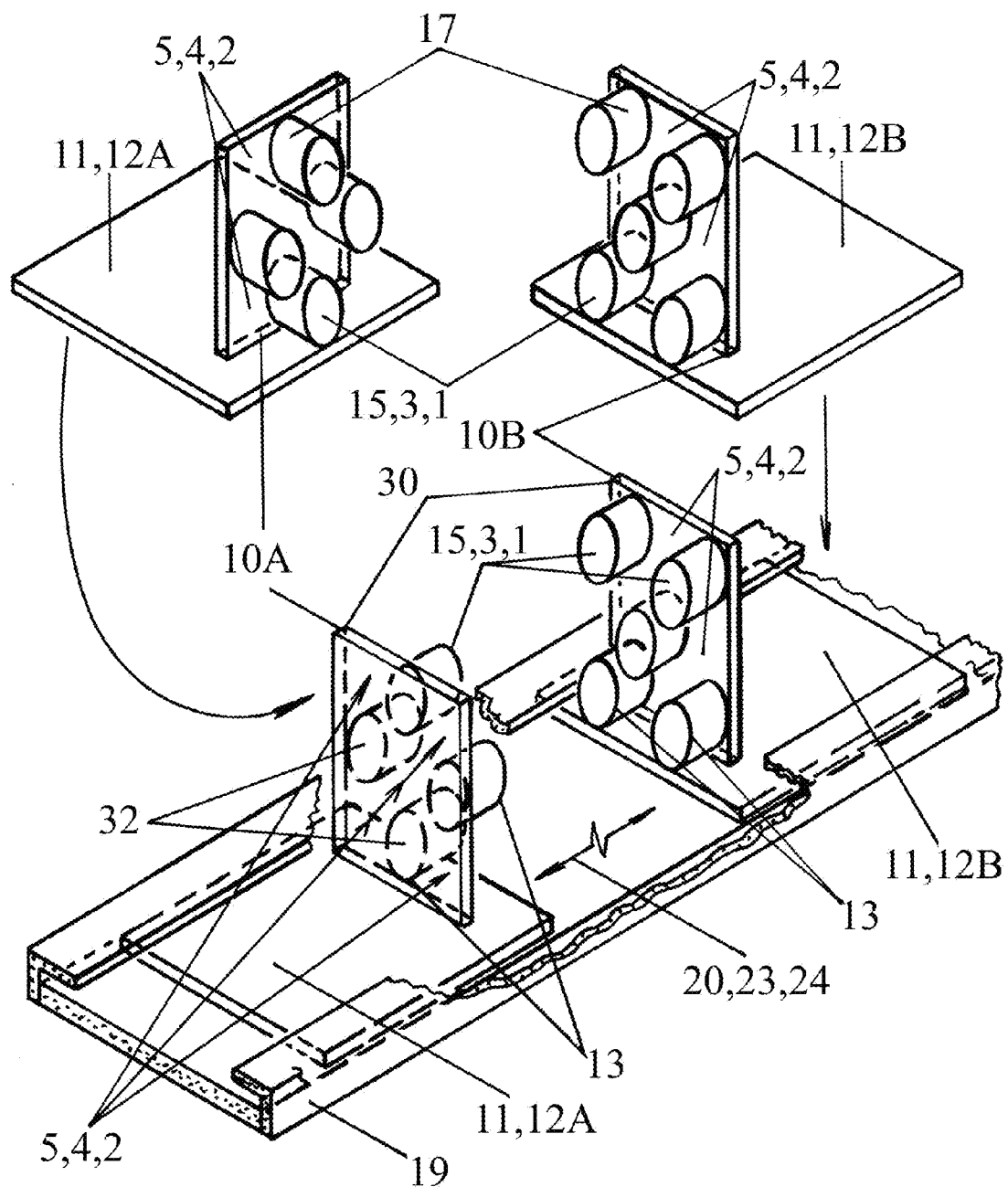
FIG. 17 shows the First Comprehensive Constructional Type Of Arrangements (FCCTOA) with north (1) like front poles (15, 3) that are shown also on FIG. 16, but here they are shown separately the two magnetic constructions (12A, 12B) in perspective and underneath are shown again in perspective the two magnetic constructions (12A, 12B) confronted inside the guide (19).

FIGS. 16 and 17, show the First Comprehensive Constructional Type Of Arrangements (FCCTOA) with like front poles (30), here the north poles are shown as like and the same conditions exist if the poles are south as like poles. In the FCCTOA with like front poles, each one of the arrangements (10A, 10B) of the pair (30) has one row-array of dipoles (13) but possesses two levels of beneficial and operational polar property (3, 4). The imaginary central axes (40A) passing through the poles (15, 32) are in parallel relation with the plane of the base (11) of the magnetic constructions (12A, 12B) and the guide (19) and also, the cylindrical surface (17), i.e. the neutral zone (5) between the poles (15, 32) is for each magnetic dipole (13) in parallel relation with the plane of the base (11) of the magnetic constructions (12A, 12B) and of the guide (19). Each magnetic construction (12A, 12B) of each pair (30) emits in the empty air space (23) in front, a beneficial front bundle of dynamic lines (3) and an equally beneficial front/rear bundle of dynamic lines (4) having an opposite polarity. The front bundle of dynamic lines (3) is the one that either starts or ends directly from or to the face of each front pole (15), whereas the front/rear bundle of dynamic lines (4) constitutes the part of the loop of the magnet (13), as this is present in the neutral zone (5), i.e. in the empty air space surrounding the sides (17) of the dipole and not the polar surface (15). The front bundle-emission of dynamic lines (3) has as origination point the front face-pole (15) of each frontally positioned (31) dipole (13) of the magnetic arrangements (10A, 10B) and it is necessary, irrespective of the how many magnetic dipoles (13) are used or irrespective of their different arrangement between them, as in all the arrangements of like front poles of the invention, all the poles of the front faces (15) of each frontally positioned dipoles, FIGS. 16 and 17 (3, 1) should be of like polarity. For the FCCTOA with like front poles of FIGS. 16 and 17 (3, 1) the front/rear bundle-emission of dynamic lines (4) has as beneficial polar property the rear face-pole (32) of each front dipole (31) and this occurs because when these dynamic lines (4) interact with the confronted arrangement, the beneficial property of their polarity is identical with the polar property of the rear face-pole (32) of each front dipole (31) and is always opposite to the polarity of the front bundle-emission of dynamic lines (3) of the same arrangement.

Figure 18:
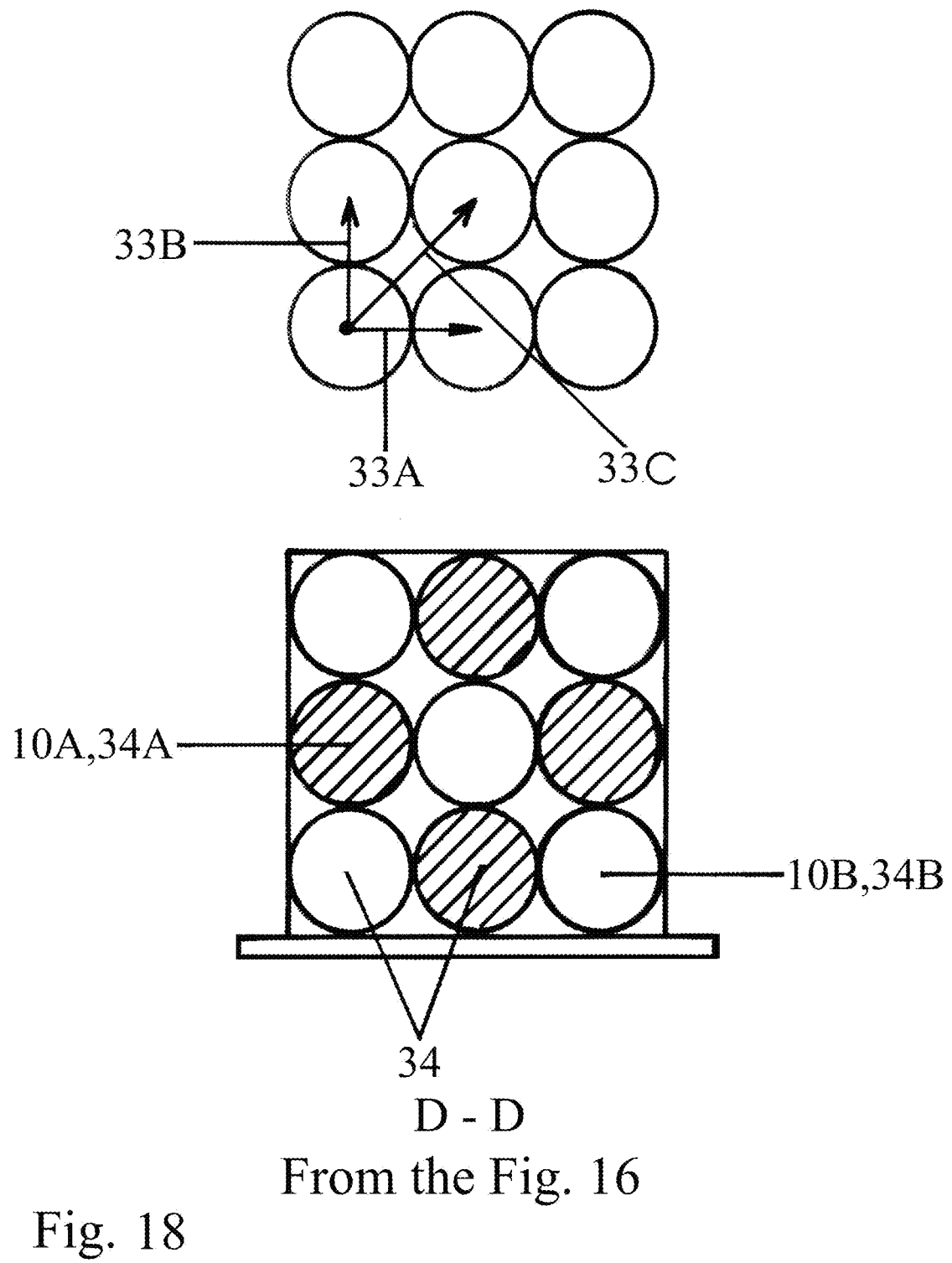
FIG. 18 shows at the top typical delimitated arrangement of the confronted situated dipoles between two arrangements and at the bottom is section D-D from FIG. 16 showing the comprehensive symmetry that is constituted from the combination of the two different arrangements.

The positioning of each front dipole (31) is assembled in a manner so that at the position where one magnetic arrangement (10A) has a front dipole (31), the respective confronted arrangement (10B) of the magnetic construction (12B) of the pair (30) which will operate with that, does not have a confronted front dipole (31) but has it on the side as shown in the upper part of the FIG. 18 either in horizontal (33A) or vertical (33B) or otherwise diagonal delimitation (33C) confronting the first one. This condition applies for all the described arrangements of the invention.

The pair (30) constitutes the FCCTOA and in FIGS. 16 and 17, all the front poles (15) of the confronted arrangements (10A, 10B) are north (3, 1) and if they were south (3, 2) everything would be the same. In that case there would be two different positionings of the poles of the dipoles (13), however in both cases of like north or like south, the poles are like between confronted arrangements (10A, 10B), wherein apart from the similarity in the construction they provide exactly the same results in all the interactions and effects on the application. Thus, FIGS. 16 and 17 constitute the FCCTOA (30), with like front poles, wherein the arrangement (10A) becomes the first allocated constructional type of arrangement of the FCCTOA of like front poles and the arrangement (10B) becomes the second allocated constructional type of arrangement of the FCCTOA of like front poles. Features and properties of the comprehensive as well as of the allocated types of arrangement of the above is that the arrangements possess one row-array of dipoles (13), but possess two levels of beneficial polar property (3, 4). That is, whereas a type includes the symmetries for location-positioning of the dipoles (13), as these are described at the bottom of FIG. 18, the type is independent from the symmetries, exactly because the same type is produced with numerous symmetries, as will be described below. Therefore, the already described concept of the type differs explicitly from the concept of symmetry. It is noted that in the description as well as in the claims, if applies that from the first to the second comprehensive constructional type of arrangements, for each numbered type, for example, the first one, there are two such associated types, i.e. the like ones the one type and with the same numbering the unlike ones the other type. That means that there are: the first comprehensive constructional type of arrangements of like front poles and also the first comprehensive constructional type of arrangements of unlike front poles and this applies for the second comprehensive constructional types of arrangements. This unified numbering regarding the like and the unlike front poles has been selected as such in the description, since each comprehensive constructional type of arrangements, from the first to the second, apart from the different polar location of the dipoles, has the comprehensive constructional type of arrangements with like front poles and the comprehensive constructional type of arrangements with unlike front poles absolutely identical in the other material constructional elements. While they are absolutely identical in all the other constructional elements, apart from the polarity between them, however with their determined polarity, as like or unlike front poles, they provide opposite properties, interactions and effects and therefore they are individualized between them in the description and the claims.

FIGS. 18 and 19 show typical delimitated arrangement of the confronted located dipoles between two arrangements and total formation of the symmetry constituted from the summation of the two different arrangements (10A) and (10B).

FIG. 18 at bottom shows a section D-D from the FIG. 16 depicting the formation symmetry of the arrangements, where the arrangement (10A) and the arrangement (10B) are depicted together. The arrangement (10A) constitutes the first allocated arrangement symmetry (34A) and the arrangement (10B) constitutes the second allocated arrangement symmetry (34B). These two arrangements together constitute the formulated arrangement symmetry (34). It is clearly distinguished in this manner that the type differs in regard to the symmetry and that one type may be created and produced in numerous different symmetries. Also, as will be explained below, the opposite applies also, i.e. symmetry may be created and produced in different types of arrangements.

FIG. 19 shows at the bottom perspective representation and on top view being typical for all the mentioned symmetries with marginal sideways-lateral location of the opposite located front dipoles of the arrangements. When the magnetic constructions (12A) and (12B) are located on the guide (19), and their magnetic arrangements (10A) and (10B) are one against the other, the front poles (15) of the front dipoles (31) of the magnetic arrangements (10A) and (10B) must be located marginally sideways-lateral either in horizontal (33A) or vertical (33B) or in otherwise diagonal (33C) delimitation one opposite the other (see also FIG. 18), for any number or combination of poles (15, 13, 31) used, which applies for all the analogous arrangements of the invention, i.e. the marginal final sideways-lateral point of each should coincide to a horizontal (35) or vertical (36) imaginary line, to which the marginal initial sideways-lateral point of the opposite pole (15, 13, 31), belonging to the opposite magnetic construction, also coincides.

Figure 20:
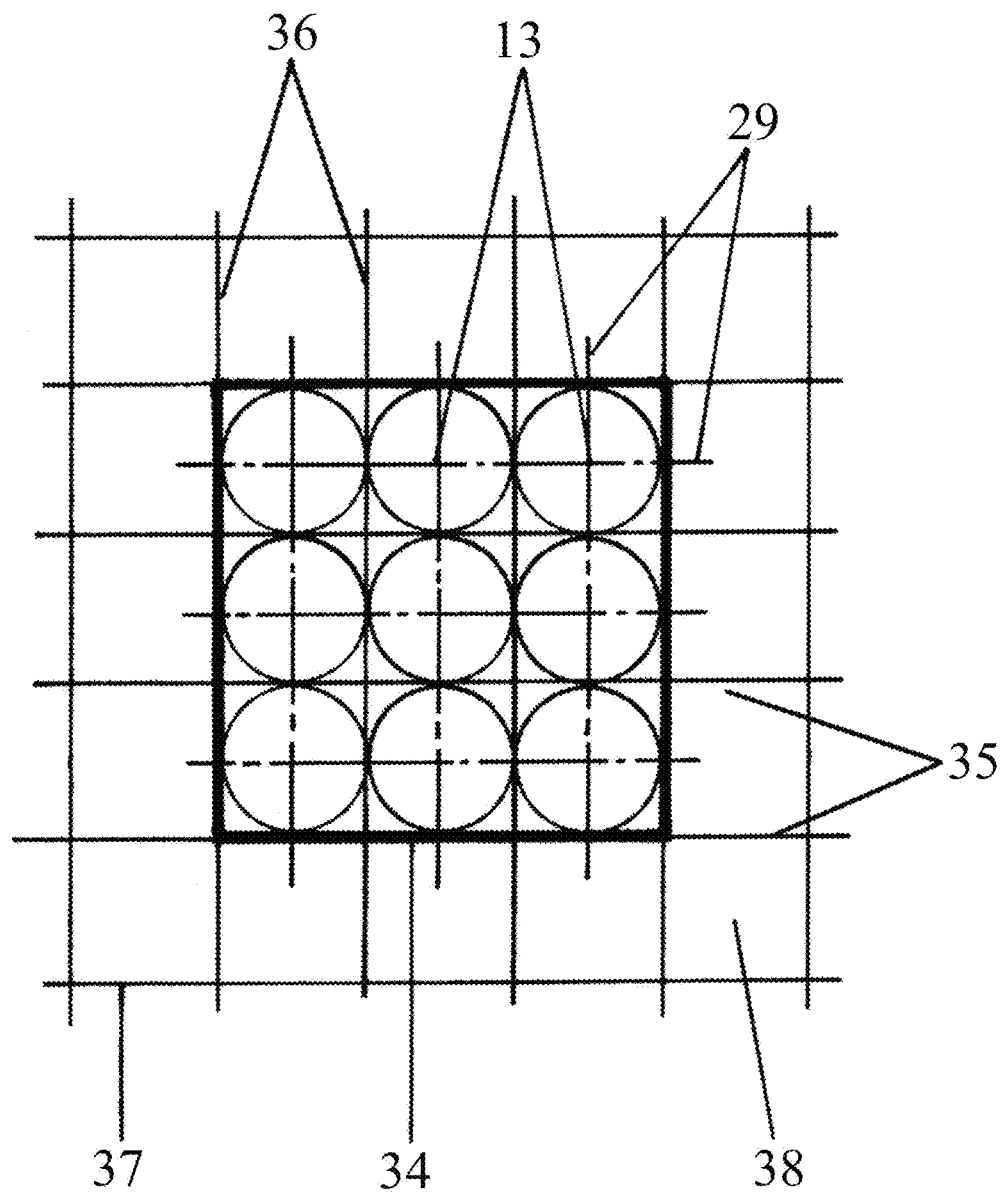
FIG. 20 shows the chosen first comprehensive symmetry (34) of arrangements (10A, 10B) to comprise the symmetry of the square tiling p4m (37).
Figure 21:
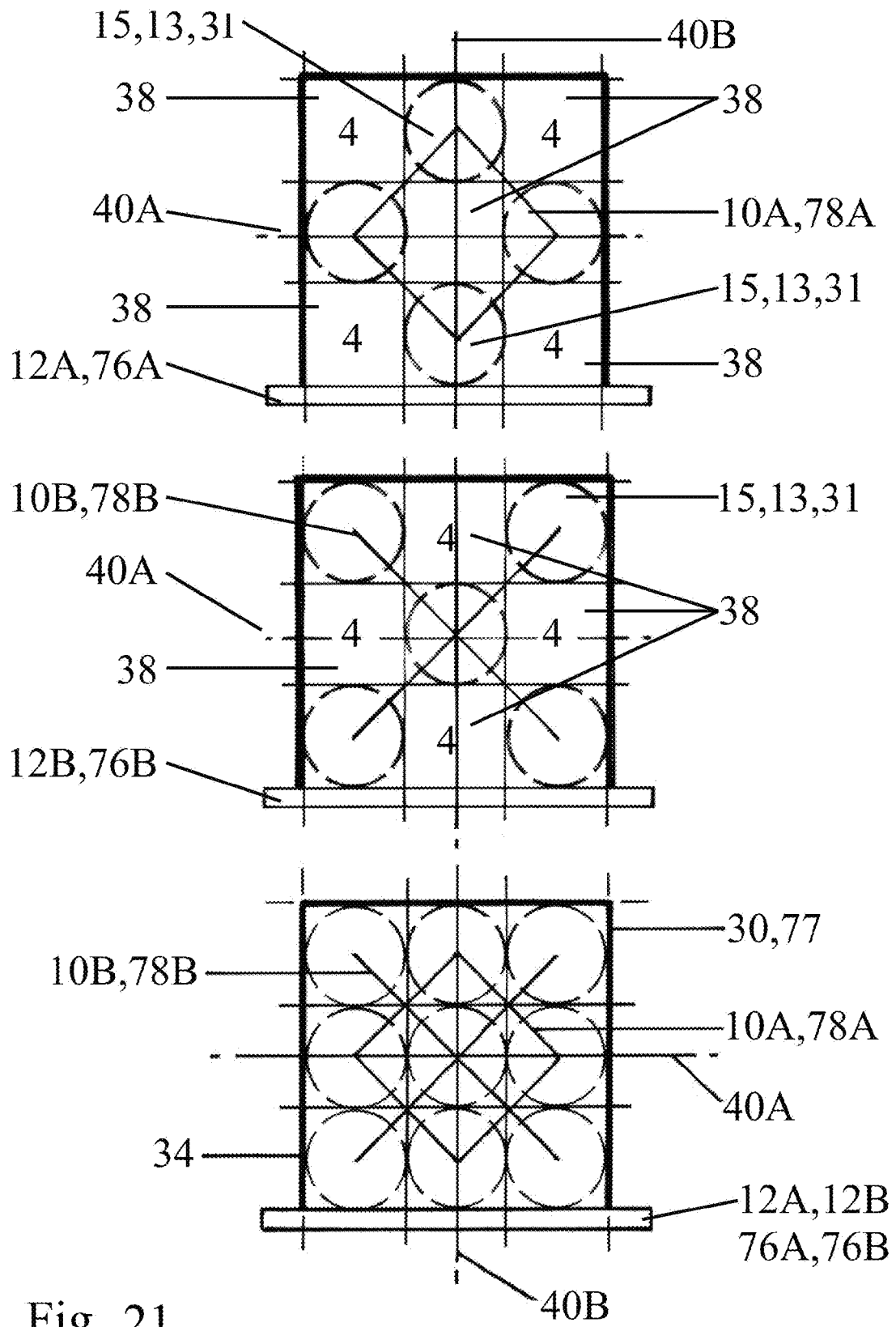
FIG. 21 shows at the center (10B) and at the top (10A) the two chosen allocated symmetries of arrangement, comprising on the bottom of the page the comprehensive symmetry of arrangements (10A, 10B) so that it constitutes a comprehensive symmetry (34) of the square mesh of plane tiling p4m.

FIGS. 20 and 21 show the selected first formulated symmetry of arrangements (34), which is a symmetry of the normal square mesh p4m (37), which comprises the formulated symmetry that constitutes the constructional pair (30) of the magnetic arrangements (10A, 10B).

FIG. 20 depicts the selected first formulated symmetry of arrangements (34), which constitutes symmetry of the normal square, mesh p4m (37). The horizontal (35) and vertical lines (36) show the sideways-lateral limits of the opposite located poles-magnets (15, 13) to coincide and to constitute a square mesh (37), with symmetry p4m, and the pole-magnets (15, 13) are marginally enclosed in each empty square cell (38) and constitute as a whole a selected total symmetry of arrangements (34) of the normal square mesh p4m with symmetry (37). Exactly as a selected formulated symmetry of arrangements (34) of a normal square mesh p4m (37) distributes in alternate manner the double colors between the cells of the mesh, also here is done in the formulated symmetry arrangements (34), and in a typical alternate manner it applies in all the arrangements of the invention. This means that as shown on FIG. 21 on the top, the magnetic construction (12A), does not have magnetic poles (15, 13) in its empty cells (38). These are located in the central part of FIG. 21, at the magnetic construction (12B), in the magnetic arrangement (10B). When (10A) and (10B) are confronted, bottom of FIG. 21, they complete the total formulated symmetry of arrangements (34). A selected comprehensive symmetrical arrangement, as the (34), becomes comprehensive constructional type of arrangements as the already mentioned (30). The vertical and horizontal lines FIG. 20 (29) are central axes of the cells (38) of the mesh (37) passing through the dipoles at their centers.

In FIG. 21, it is important to note that the horizontal imaginary central line (40A), which cuts in half each arrangement (10A, 10B) and the vertical imaginary central line (40B) coincide to a single line, when the two arrangements are confronted and thus the total symmetry (34), which constitutes the constructional pair (30), has a horizontal imaginary central line (40A) and a vertical imaginary central line (40B), since the (40A) and (40B) of the individual arrangements coincide to those. As long as each front pole of the FIG. 21, (15, 13, 31) of each arrangement (10A, 10B) has marginally or in tolerance penetration sideways-laterally, as described immediately below, either in horizontal or in vertical delimitation opposite that, each front pole (15, 13, 31) of the opposite magnetic construction, exactly opposite and not sideways-laterally or diagonally, it confronts the front/rear bundle-emission of the dynamic lines (4) of the loop of the confronted magnetic construction, where, when operating, the beneficial interacting polar property becomes identical to the property of the rear face-pole (32) of each front dipole (31, 13).

Figure 22:
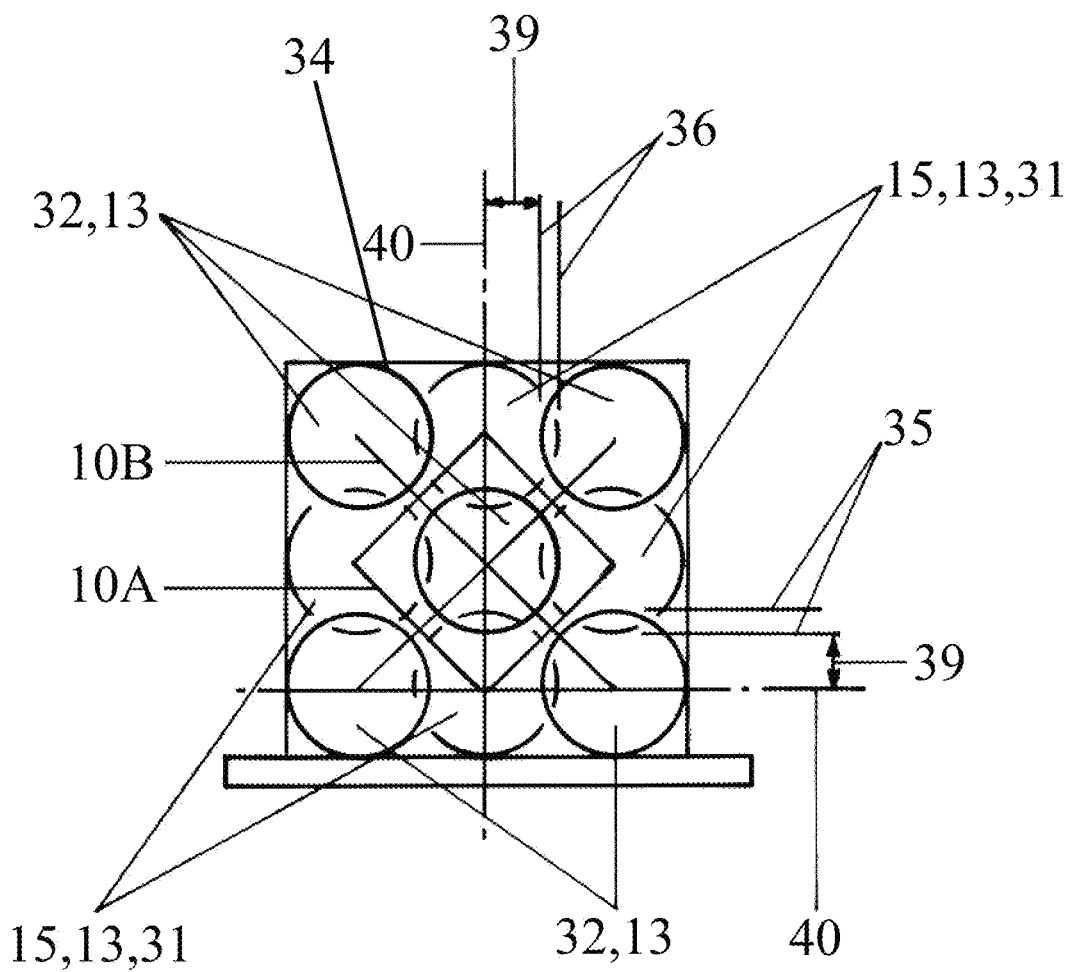
FIG. 22 shows the typical toleration from 0 to ⅓ infiltration of every dipole from the sideways outmost barrier, until the central conceivable line of every confronted situated dipole, so that the tolerance (39) to be equal with ⅔ or even more of the dipole's radius.

FIG. 22 shows the tolerance from 0 to ⅓ of the radius a, of penetration of each dipole from its sideways-lateral upper boundary until the central imaginary line of each opposite located dipole. It shows the manner that each confronted front dipole (31) may be introduced laterally through the boundary of the selected imaginary line, to which their confronted lateral boundaries (35, 36) coincide and the manner that the boundary of the one penetrates in the confronted one (35, 36) from 0 to ⅓ of the dimension as regards the lateral boundary of each confronted dipole (15, 13) so that the dimension on FIG. 22 (39) to be equal to ⅔ or more of the radius of the dipole, but never smaller.

The above-mentioned tolerance (39) allows the control of the interaction's intensity allowing its increase or decrease, since from the zero marginal sideways-lateral coincidence to the ⅓ of the radius of the dimension penetrating between them, the intensity of the magnetic force generated from each front bundle of dynamic lines is gradually increased, FIGS. 5, 6, 7, 8, 9 and 10 (3) in its mutual interactions. These include the mutual-dual front-front/rear interactions (4), whether these are attractive or repulsive. The magnetic arrangements may be manufactured either in marginal relation between the opposite located dipoles, FIG. 19 (35, 36) or with tolerance penetration, FIG. 22 (39).

Figure 23:
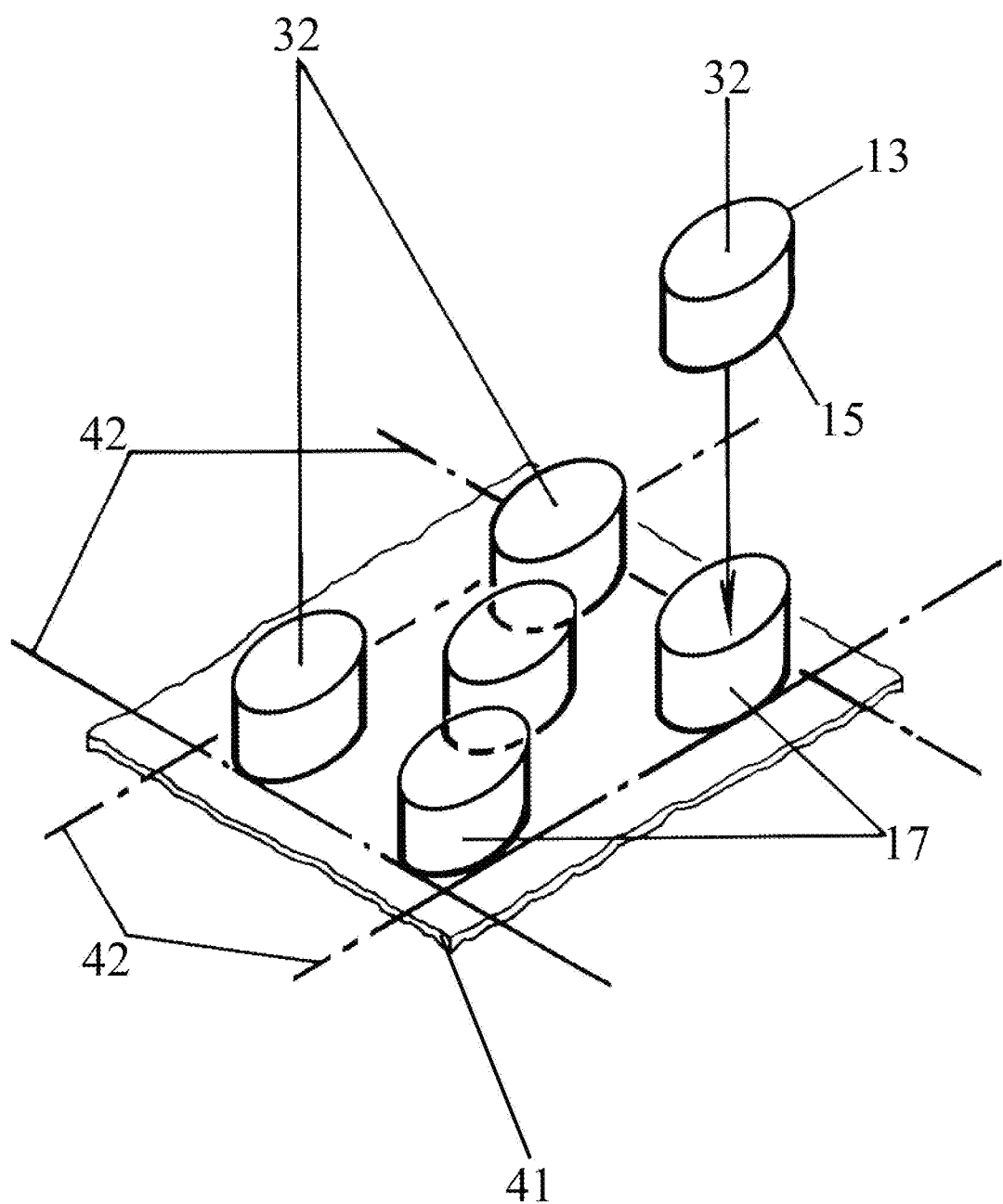
FIG. 23 shows typical manner of gluing of the magnets on a thin plane surface.
Figure 24:
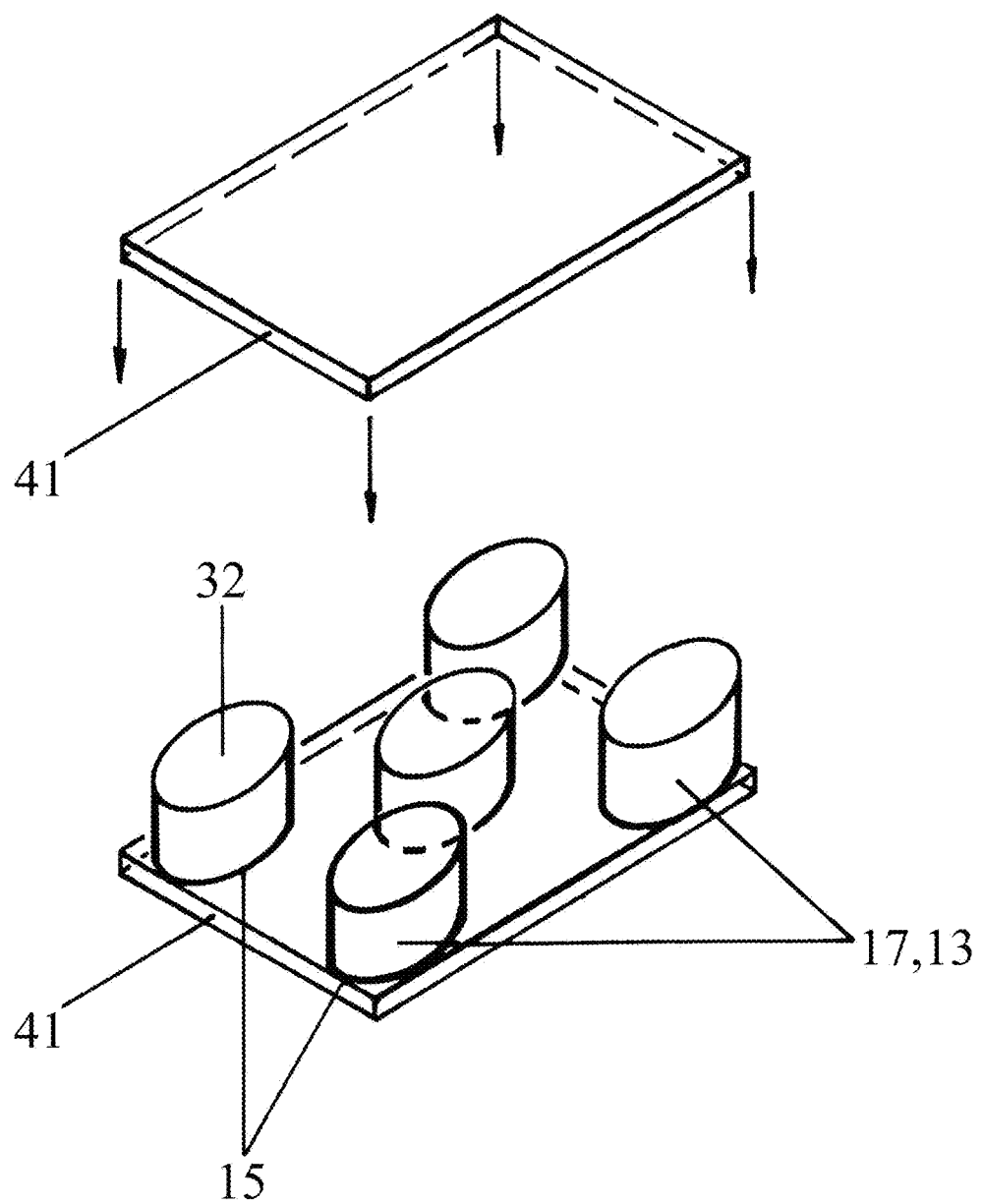
FIG. 24 shows typical manner of gluing both poles (15, 32) of the magnets on a thin plane surface.
Figure 26:
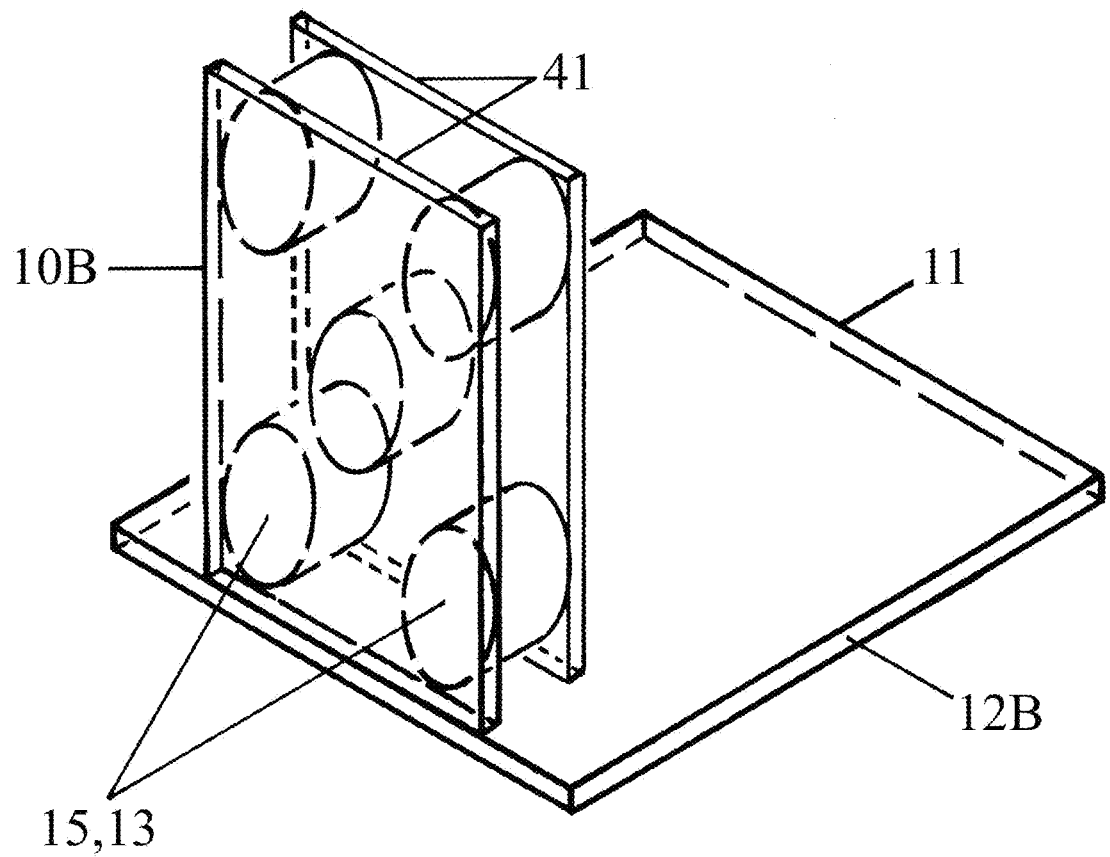
FIG. 26 shows the magnetic arrangement (10B) glued on the base (11) comprising with it the magnetic construction (12B).

FIGS. 23, 24, 25 and 26 show the constructional steps and the proposed ways for constructing the magnetic arrangements and magnetic constructions, using as example the magnetic arrangement (10B), which constitutes along with the base (11) the magnetic construction (12B). FIG. 23 shows the selected symmetry (10B) being constructed. Any thin surface (41), made of balsa or thin fiberglass or from any thin plastic as that of the CD or DVD casings, is selected. Each magnet (13) is attached-glued in the selected position, the face-pole (15) being vertical to the surface (41), which has been placed horizontally on a bench or a mounting plate. The mounting plate is preferred since it is a paramagnetic material and stabilizes due to magnetization the magnetic dipoles in the attachment procedure. Instant glue is employed and preferably each magnet is drawn—in a sliding manner—to the attachment point to avoid the undesired interaction between them. The surface (41) is sawn exactly on the surface (42) with the cylindrical surfaces (17) of the magnets (13) and another rear surface (41), either cut appropriately, or adhered as large surface and subsequently sawn, is also adhered on the rear side, FIG. 24 (32) of the magnets (13), as long as this is exactly on the face with the cylindrical surfaces (17). When these are adhered and filed-sanded-polished, in order that the surfaces are facing, FIG. 25 (41) with the cylindrical surfaces (17) of the magnets (13), the magnetic arrangement (10B) is ready as an arrangement. After the instant glue enters the edge of the surfaces (41) and the sides (17) of the magnets (13), which will be glued on the surface, the magnetic arrangement (10B) is also glued flat-face with the base (11) of dimensions 60×52×3 mm which may be made of balsa wood or soft plastic and together they constitute the magnetic construction, FIG. 26 (12B), where the face of the base (11) and the front part of the magnetic arrangement (10B), i.e. the surface (41) are facing a vertical line. If the base FIG. 25 (11A) 60×52×3 mm is necessary to be used instead of the base (11), in order to elevate the magnetic arrangement adhered to the base for alternative constructions, wherein (11A) seems to have a further wedge made of wood or balsa (11B), on the front part, of analogous height in order to bring the confronted magnetic arrangements to the different desired height. The proposed construction of the guide, FIG. 27 (19) and of the base, FIGS. 24 to 26 (11) or (11A) made of wood or balsa, is exemplary and serves in that it does not provide undesired interferences in the magnetic fields, but also in that the magnetic constructions may be easily and quickly immobilized with a pin which will easily penetrate in the balsa of the base (11) or (11A) and in the wood of the guide (19). Other materials realizing the same conditions may be used such as soft plastic or any other alternative material. Subsequently the magnets (13) with the surfaces (41) may be covered with two-component epoxy glue having a solidification time of 5 minutes, so that this is soon hardened to stabilize the adherence of the magnets (13) with the surfaces (41). The above is typical and applies for all the magnetic arrangements and magnetic constructions of the invention. In the below mentioned arrangements, where further rows-arrays or layers of magnets (13) are present, behind the front ones the same procedure is repeated, wherein the second row of magnets is adhered on the rear surface (41) and again on the rear faces of the magnets of the second row a further surface (41) is adhered, etc. FIGS. 24, 25 and 26 show two adhered surfaces (41) present on the front and rear faces-poles of the magnets (13). However, a surface (41) is able to form an arrangement, either on the front or on the rear part. Thus, in all the following figures, the application uses only the rear surface (41) to form the arrangements and not the front surface (41), so that the faces-poles of the magnets (13) are exactly aligned with the surface of the base (11) or (11A). In this way, a zero distance between the confronted arrangements is achieved optimally. It is noted that this zero distance (25) is always in one sideways-lateral viewing dimension only, if and when mentioned in the description and the figures, given that the confronted poles of magnets (13) of the arrangements are always laterally confronted and never straight-forward aligned. In the arrangement having rear poles, an additional surface (41) may be adhered on their rear part; however it may also not be adhered. The figures and descriptions do not show an additional adhered surface (41) on the rear part of the rear dipoles to facilitate easy reading of the figures.

Figure 27:
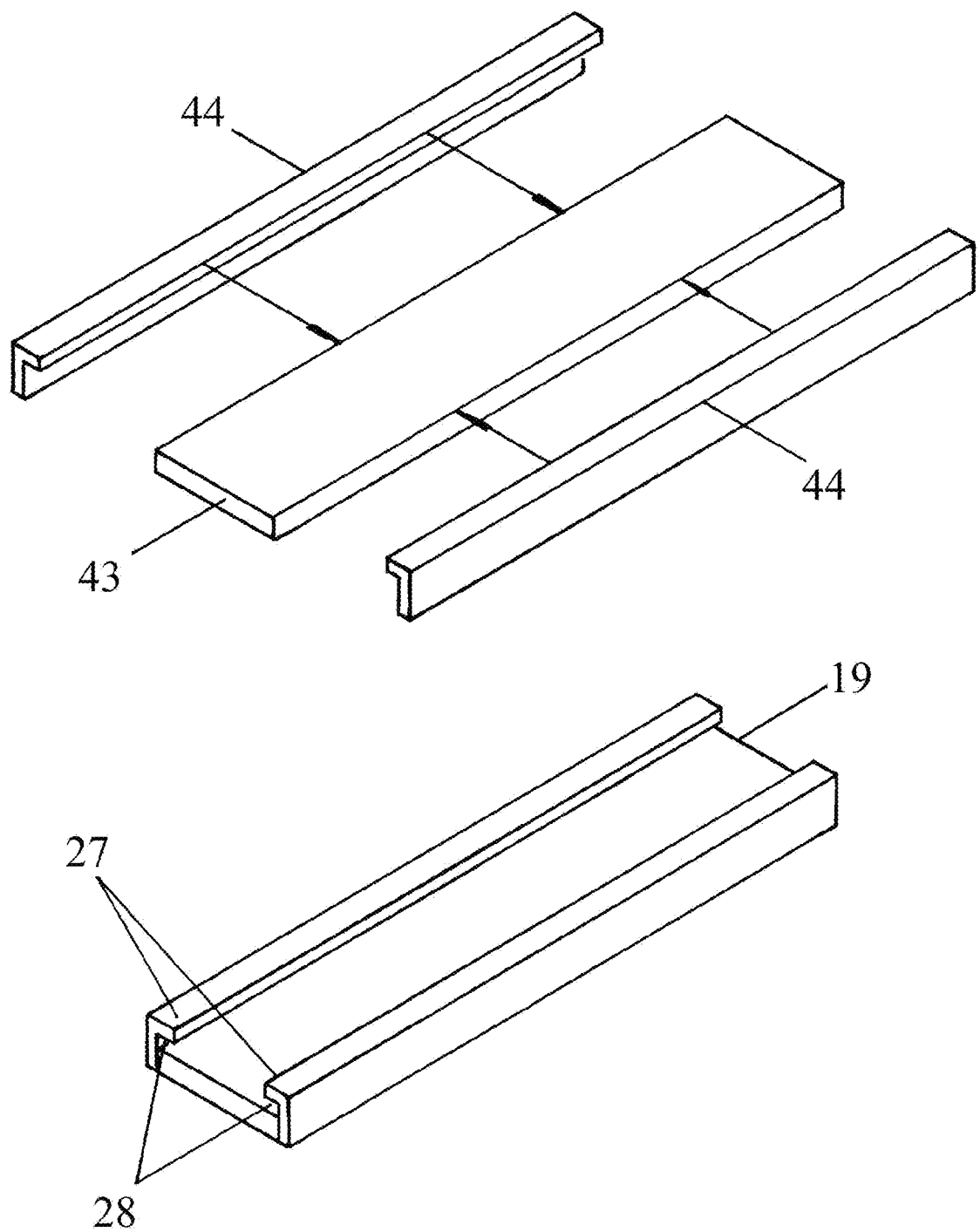
FIG. 27 shows typical manner of construction of the guide (19).

FIG. 27 shows a typical construction of the guide (19) where in order to construct the already mentioned guide (19) a straight orthogonal plate (43) 275×43×15 mm, made of MDF or any desired plywood with smooth surface is used. On this surface the magnetic constructions (12A, 12B) and any other of the invention may slide, since the guide is typical and common to all the magnetic constructions of all types. On the lateral sides of the plate (43) two equally long angles (44) are glued, the angles being made of wood or plastic and not of metal, without using nails, creating on both sides of the guide a tooth (27) elevated to the interior of the guide, leaving the desired channel (28) having a height of 3.5 mm on both sides, where in both channels (28) all the magnetic constructions of the invention slide. From the proposed dimensions of the guide and the base, it is apparent that between the base and the guide there is a 0.5 mm air tolerance between them, since the channel is higher than the base by 0.5 mm and the plate of the guide (43) is also larger than the width of the base by 1 mm. This ensures the free sliding of the base on the guide. The proposed construction of the guide, FIG. 27 (19) and of the base, FIGS. 24 to 26 (11) or (11A), made of wood or balsa, is exemplary and serves in that it does not create interferences to magnetic fields, and also, in that the magnetic construction may be easily immobilized with a pin which will penetrate the balsa of the base (11) or (11A) and the wood of the guide (19). Other materials realizing the same conditions may be used such as soft plastic or any other alternative material.

Figure 28:
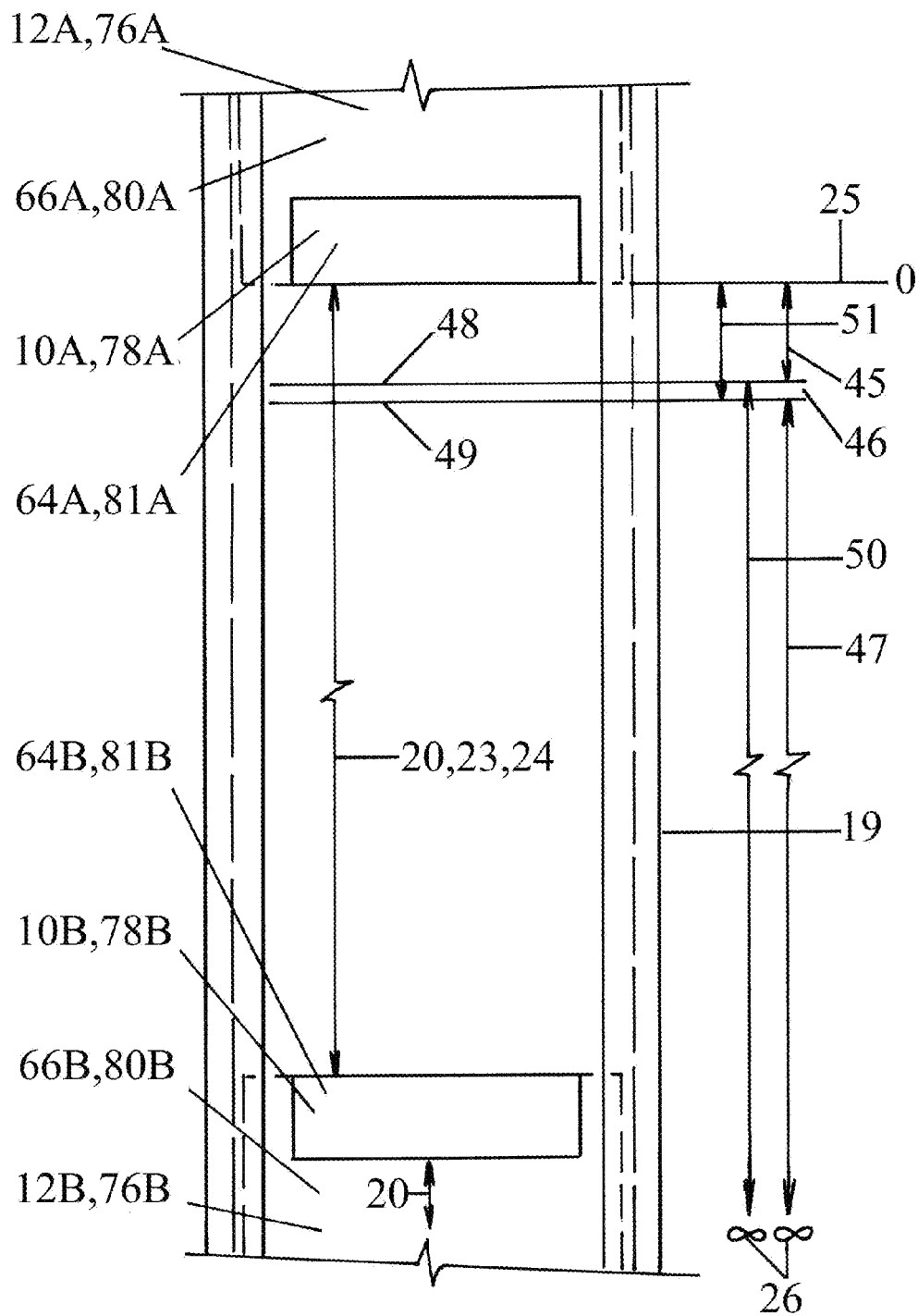
FIG. 28 shows the typical plan view of the guide (19) and two magnetic constructions on it where there is a division and determination of the free air space between the magnetic constructions in three distances (51, 46 50) and two boundaries (48, 49), where depending on the distance that separates the magnetic constructions, there is a change of the polarity of the arrangements and of their interactions between them.
Figure 29:
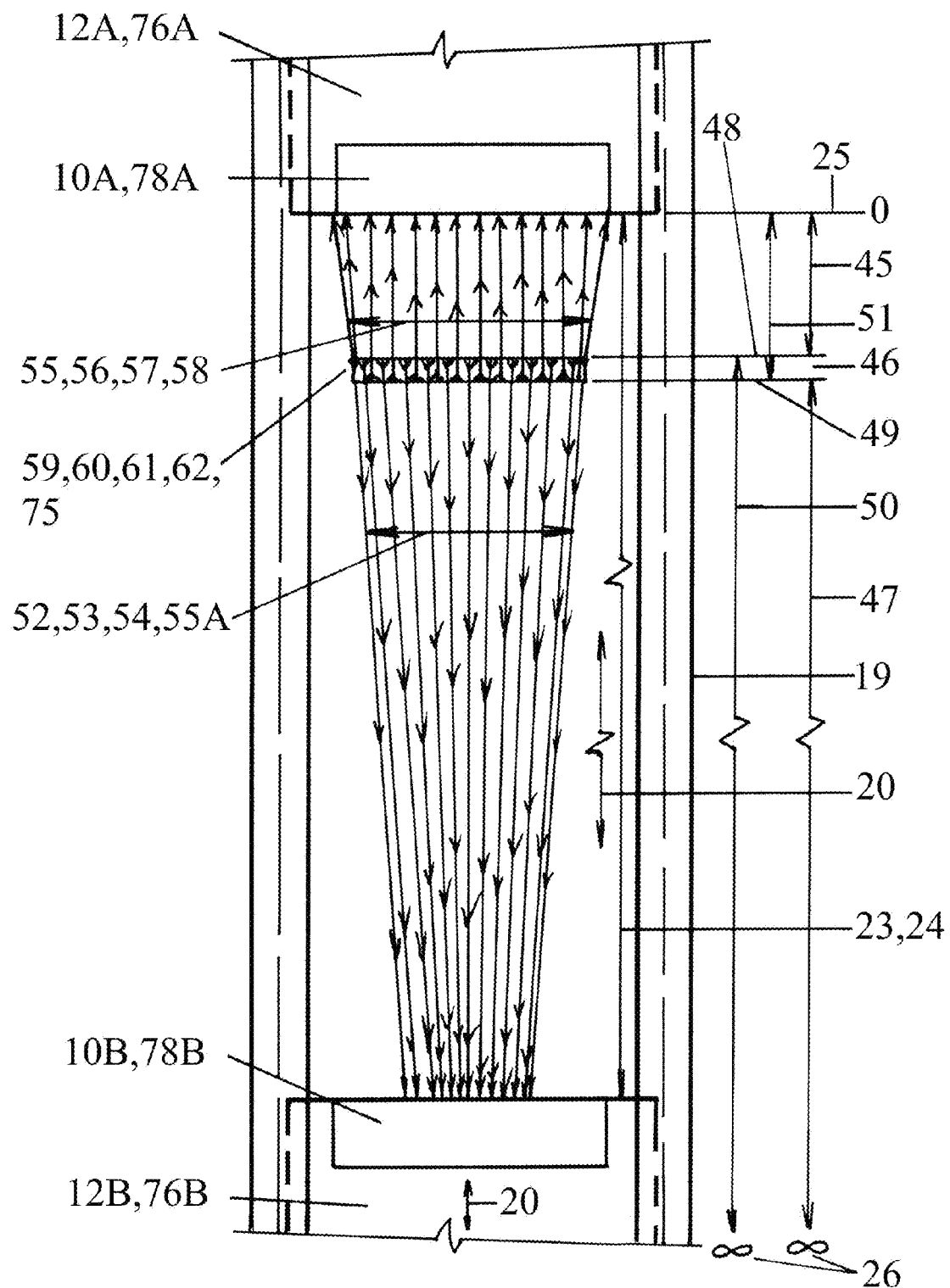
FIG. 29 shows during the magnetic construction's interaction the occurrence of three typical spatial distances (51, 46, 50) and two boundaries (48, 49), three different polarities and three interactions on the guide (19) when the front poles (15) of the magnets of the arrangements are initially like. The conical representation of the dynamic lines shows in a graphical manner the fluctuation of their intensity without corresponding of course to a real representation of them in space. This pertains also for FIG. 32.

FIG. 28 shows the division and determination of the empty air space between the magnetic construction at three distances and two boundaries which apply both for the like and the unlike front poles. FIG. 29 shows the three typical spatial distances, the three multi-plane polarities and the three interactions with properties and with spatial boundaries and interactions based on the bundles of the dynamic lines between the two magnetic constructions, on the guide, when the poles of the front poles of the arrangements are initially like.

FIG. 28 shows a typical plan view of the guide and two magnetic constructions, where the empty air space is divided and defined between the magnetic constructions, at three distances and two boundaries. Depending on the distance dividing the magnetic constructions, the polarities of the arrangements' and the interactions between them change. By dividing and defining the empty air space between the magnetic constructions at three distances; 1) nearer (45), (2) middle (46) and 3) further (47) and by defining the boundaries of the middle distance (46) to the nearer distance (45) as middle-nearer boundary (48) and to the further distance (47) to the middle-further boundary (49), the description of the interactions follows beginning from the so-called middle-further interaction, FIG. 29 (53), which includes the middle distance, FIG. 28 (46) and further distance (47), and as total this distance, is designated as middle-further distance (50) and extends to infinity (26). Subsequently, the nearer-middle interaction, FIG. 29 (56) that comprises the nearer distance, FIG. 28 (45) and the middle distance (46) and as total this distance is designated as nearer-middle distance (51). Finally, the middle interaction, FIG. 29 (75), is described, which includes the middle distance itself, FIG. 28 (46), which is noted between the middle-nearer (48) and middle-further boundary (49). In order to make the said distances in FIG. 28 and 29 better understood, the magnetic construction (12A) is fixed and the magnetic construction (12B) is movable. It is apparent that on the application of the guide, the magnetic arrangements (10A, 10B), by means of the magnetic constructions (12A, 12B) respectively, are both movable and if desired either one or both of them may be fixed-immobilized so that the experiments and measurements may be executed in various preferred ways. Thus, it is noted that the distances and the interactions, as mentioned above, are typical for all the comprehensive constructional types of the invention that employ these and not only those described in the above figures and the above-mentioned arrangements.

Figure 5:
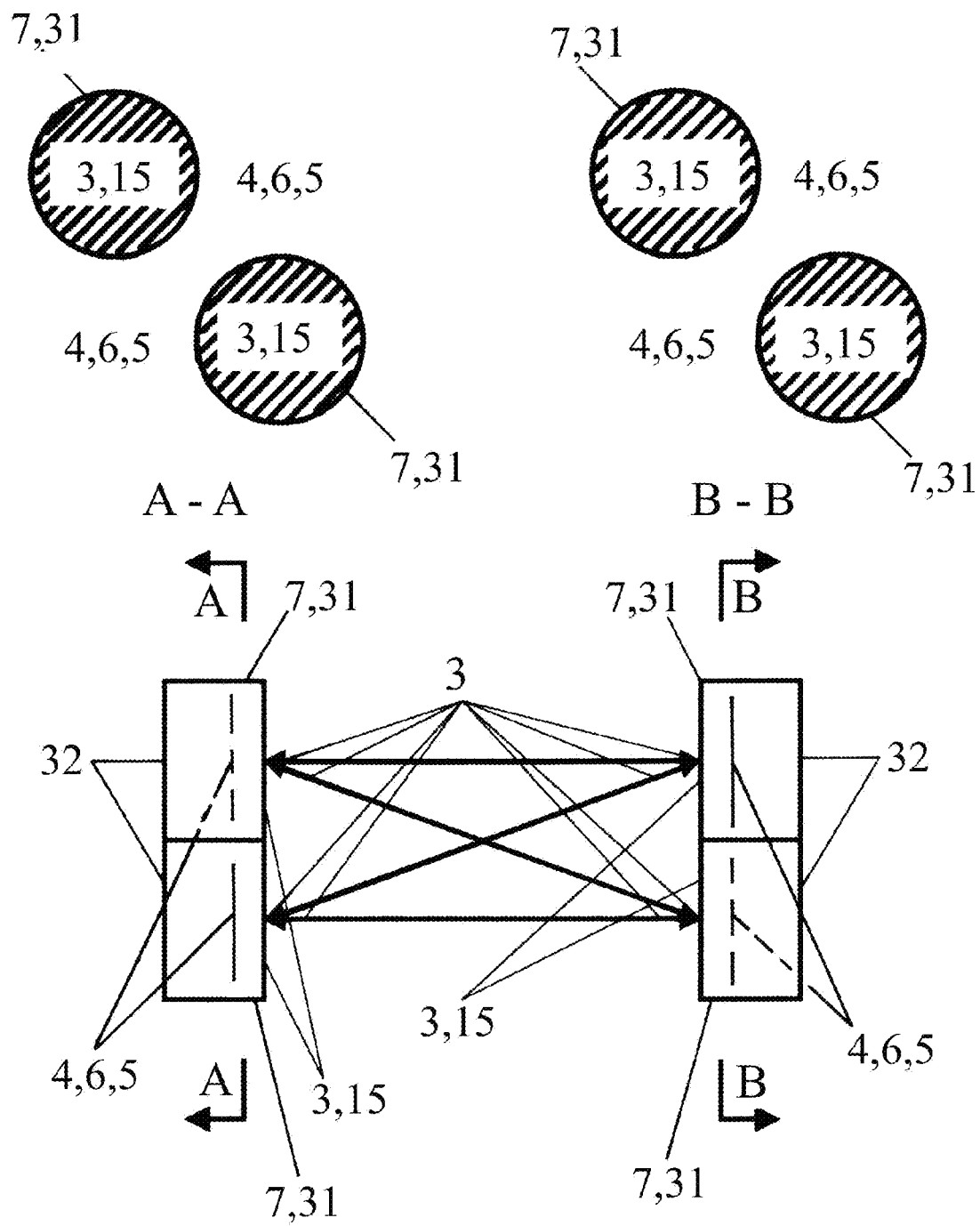
FIG. 5 shows on bottom two confronted magnetic arrangements each comprised of two magnets aligned in one row-array and on top two sections A-A and B-B of the arrangements. On bottom shows separate unique interactions of the front-front (3-3) bundles of dynamic lines, when the front/rear bundles of dynamic lines are (4) and their polarity is the same with the rear face-pole (32) of the front (31) dipole (7).
Figure 6:
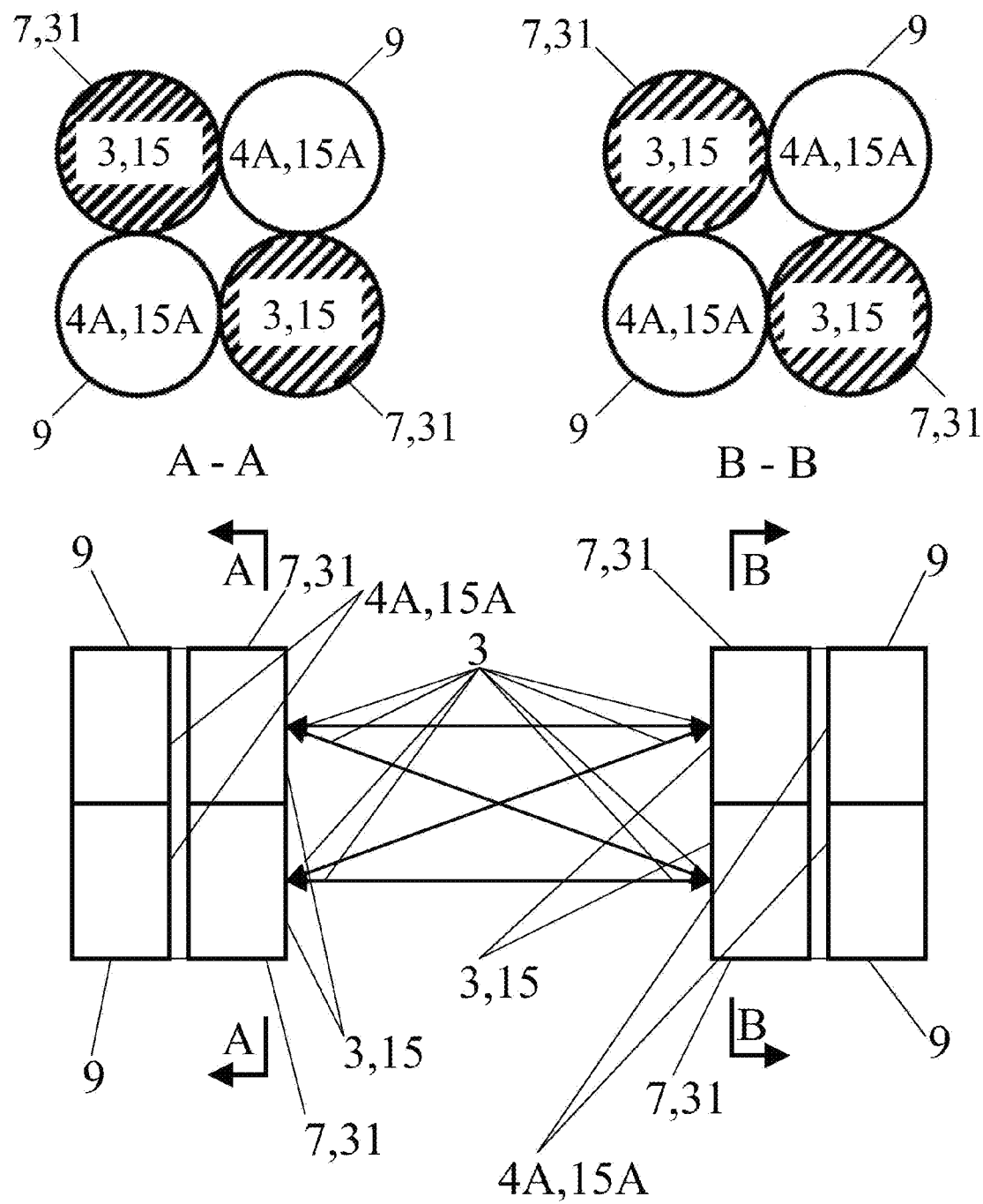
FIG. 6 shows on bottom two confronted magnetic arrangements each comprised of four magnets aligned in two rows-arrays and on top two sections A-A and B-B of the arrangements. On bottom shows separate unique interactions of the front-front (3-3) bundles of dynamic lines, when the front/rear bundles of dynamic lines are (4A) and their polarity is the same with the front face-pole (15A) of the rear dipole (9).

Each arrangement (10A, 10B), on each magnetic construction (12A, 12B), applying the above-mentioned features, has the vertical standing dipoles (13) arranged in one row-array only, i.e. the front faces (15) and the rear faces (32) of the poles are aligned between them, i.e. FIGS. 16 and 17 and 23. Depending on the distance, FIG. 28 (24) between the interacting magnetic arrangements. (10A, 10B), both the front (15) and the rear polarity (32) of each dipole become functionally beneficial. Each magnetic arrangement (10A, 10B) has one row-array of dipoles (13) but possesses two levels of beneficial and functional polar property, i.e. a beneficial front bundle of dynamic lines, FIGS. 16 and 17 (3,1) and an equally beneficial front/rear bundle of dynamic lines having an opposite polarity, in the same FIGS. 16 and 17 (4, 2). Thus, when two matched magnetic constructions that fulfill the above requirements, such as (12A, 12B), are moved one against the other on the guide (19) by the intervention of the operator, three interactions occur, due to the polarity exchanges in the empty air space (23), according to the distance (24), which separates the magnetic arrangements (10A, 10B) present on the magnetic constructions (12A, 12B), respectively and are the following:

A) When the magnetic constructions, FIG. 28 (12A, 12B), approach one another on the guide (19), from a non-interaction distance, which theoretically is infinity (26), the first interaction created between the confronted dynamic lines is the lateral and diagonal distance relation found between the front poles, FIG. 16 and 17 (15, 3) of each magnetic arrangement (10A, 10B), see also FIG. 5. Between these and as long as this relation of sideways-lateral and diagonal distance is the nearer for the interaction of the dynamic lines (3) and as the constructions approach each other, the front bundles of dynamic lines, FIGS. 16 and 17 (3, 1) of the front poles (15) of the arrangements (10A, 10B) continue to interact and this interaction is designated as mutual-double front-front interaction, FIG. 29 (52) of the middle-further distance, FIG. 28 and 29 (50). This becomes typical for all the comprehensive constructional types of arrangements as middle-further interaction, FIG. 29 (53), of the mutual-double front-front interaction (52), since the confronted front poles (15) are like (55A) with repulsive (54) interaction. Its maximum strength starts from the middle-nearer boundary (48) and extinguishes through the further distance (47) to infinity (26) and this is repulsive (54), since the poles are like (55A) and this interaction does not occur at all (53, 54) from the middle-nearer boundary (48) to the whole of the nearer distance (45).

B) When, however the same magnetic constructions, FIG. 28 (12A, 12B) are in the nearer-middle distance, FIGS. 28 and 29 (51) their distance ranging from their physical contact to a small distance (24) apart up to the middle-further boundary (49), the nearer distance created between the interacting confronted dynamic lines is the distance between the front poles, FIG. 16 and 17 (15, 3) of each magnetic arrangement (10A, 10B) and of the confronted front/rear emission bundles of dynamic lines, FIG. 16 and 17 (4, 2), which are identical to the rear poles (32) of the confronted arrangement. Thus, the front bundles of dynamic lines, FIGS. 16 and 17 (3, 1), interact with each confronted front/rear emission bundle of dynamic lines, FIGS. 16 and 17 (4, 2) of the loop of the confronted magnetic construction which possesses the property of each rear pole (32) and this interaction is designated as mutual-double front-front/rear interaction, FIG. 29 (55) of the nearer-middle distance (51), see also FIG. 7. This is always of opposite interaction from the mutual-double front-front interaction (52) of the middle-further distance (50), of the same constructions (12A, 12B) that interact. Its maximum strength starts at the zero distance (25) of the nearer distance of physical contact, FIGS. 28 and 29 (45) of the magnetic construction (12A, 12B) and its extinguishing stops abruptly at the middle-further boundary (49). This is typical, for all the comprehensive constructional types of arrangements as nearer-middle interaction (56) of the mutual-double front-front/rear interaction (55), since the poles are unlike (57) with attractive interaction (58) and this interaction is absent from the middle-further boundary (49) until the whole further distance (47) extending to infinity (26), i.e. wherein the above-mentioned repulsive (54) mutual-double front-front interaction (52) of the middle-further distance (50) applies uniquely.

C) When in two confronted magnetic constructions, FIG. 28 (12A, 12B), the two above-mentioned effects apply, i.e. since the poles are like, FIG. 29 (55A), in the mutual-double front-front interaction (52) of the middle-further distance (50), causing repulsive interaction (54) of the magnetic constructions, then the poles of the constructions become unlike (57) in the mutual-double front-front/rear interaction (55) of the nearer-middle distance (51), causing attractive interaction (58) of the magnetic constructions. These two different and opposite interactions coexist and are equivalent, where exactly the poles are like and unlike (59) simultaneously and simultaneous repulsive and attractive (60) equivalent interaction (62) is generated, causing an unstable balance (61) of the magnetic constructions, keeping them in full immobility thereof and this interaction is designated as unstable balance (61), due to the particularly small distance range, FIG. 28 (46), on which the effect is observed, see also FIG. 9. Furthermore, if the magnetic constructions are slightly displaced from the position of unstable balance, FIG. 29 (61), i.e. if they penetrate to the nearer distance (45) between them is activated the attractive interaction (58) with subsequent contact thereof, or if they are brought to the further region (47), is activated the repulsive interaction (54). This is typical for all the comprehensive constructional types of arrangements as middle interaction (75) of the unstable balance (61), since the poles are like and unlike (59), simultaneously and at the same time is generated a simultaneous repulsive and attractive equivalent interaction (60).

The repulsive interaction (54) of the middle-further distance (50) with the attractive interaction (58) of the nearer-middle distance (51) are equivalent to the middle interaction (75) of the middle distance (46) of the unstable balance (61). The repulsive (54) middle-further interaction (53) vanishes completely from the middle-nearer boundary (48) until all the nearer distance (45), i.e. to the physical contact of the magnetic constructions and the attractive (58) nearer-middle interaction (56) vanishes completely from the middle-further boundary (49) until the whole further distance (47).

By applying the above, as the operator moves the two confronted magnetic constructions, FIG. 28 (12A, 12B) with the uni-directional, forward-backwards (20) confronted always sliding possibility, they possess to move in the guide (19) the following three magnetic experimental phenomena and data are obtained:

1) When the operator brings manually from a non-interaction distance anyone of the two magnetic constructions (12A, 12B) near the other, i.e. from the further distance, FIGS. 28 and 29 (47), to the middle-nearer boundary (48) and if left free, the confronted magnetic construction will exhibit repulsive, FIG. 29 (54), interaction, and move backwards. If the two magnetic constructions are held and the operator brings them slowly closer one-another by hand, he feels the repulsive (54) gradually increasing force, its maximum value being at the middle-nearer boundary, FIG. 28 and 29 (48).

2) Contrary to the only present observable phenomenon in magnetism, which determines and defines the continuous increase of this repulsive force up to the zero distance between the magnetic constructions, FIG. 28 and 29 (25), as soon as the force applied by hand, which brings the magnetic constructions closer, exceeds the marginal repulsive force, FIG. 29 (54), its maximum being at the middle-nearer boundary, FIG. 28 and 29

(48), the magnetic constructions present strong attraction (58) and are joined by attractive force.

3) If the operator holds the two magnetic constructions, FIG. 28 (12A, 12B) and brings them to the middle distance, FIG. 28 and 29 (46), in order to equilibrate the attractive, FIG. 29 (58) and the repulsive (54) interactions between them, then at the middle distance (46) the magnetic constructions are completely fixed-immobilized, since the attractive and repulsive forces there are equivalent, causing the interaction designated as unstable balance (61). Any small shift, even of the one magnetic construction from the position of the middle distance (46), will cause an attraction and subsequent union thereof if displaced to the nearer distance (45), or the repulsive (54) separation thereof, if displaced to the further distance (47).

The measurements of the spatial distances, FIG. 28 and of the interactions, as these are defined in FIG. 29, depend on the size of the dipoles used for the execution of the application and on the magnetic force that they possess. The measurements of the distances with the defined materials and elements of the invention are typical, i.e. they apply for the present as well as for the following comprehensive constructional types of arrangements of like front poles, approximately and they range on average as following: the range of the nearer-middle distance, FIGS. 28 and 29 (51) is 7.8 to 8.5 mm. The range of the middle distance (46) is minimal in macroscopic measurement, from 0.1 to 0.4 mm and the range of the middle-further one (50) begins from the middle-nearer boundary (48), the distance of which from the zero distance (25) is estimated from (51) minus (46) and then this (50), having the range from 7.7 to 8.1 mm from the zero distance (25) extending to infinity (26). Notably, the magnetic constructions begin to repel one another on the guide (19), at an average distance between 31 and 33 mm. In order to bring the magnetic constructions from the distance 31 and 33 mm to the middle-nearer boundary (48), where the repulsive field vanishes abruptly, FIG. 29 (54, 52), these should be kept by the operator and an external force should be applied thereon so that the magnetic constructions are brought closer. As explained above, as soon as the constructions go past the middle-nearer boundary, FIGS. 28 and 29 (48), entering the nearer distance (45), they are attracted due to the attractive contact interaction, FIG. 29 (58, 56, 55).

Figure 30:
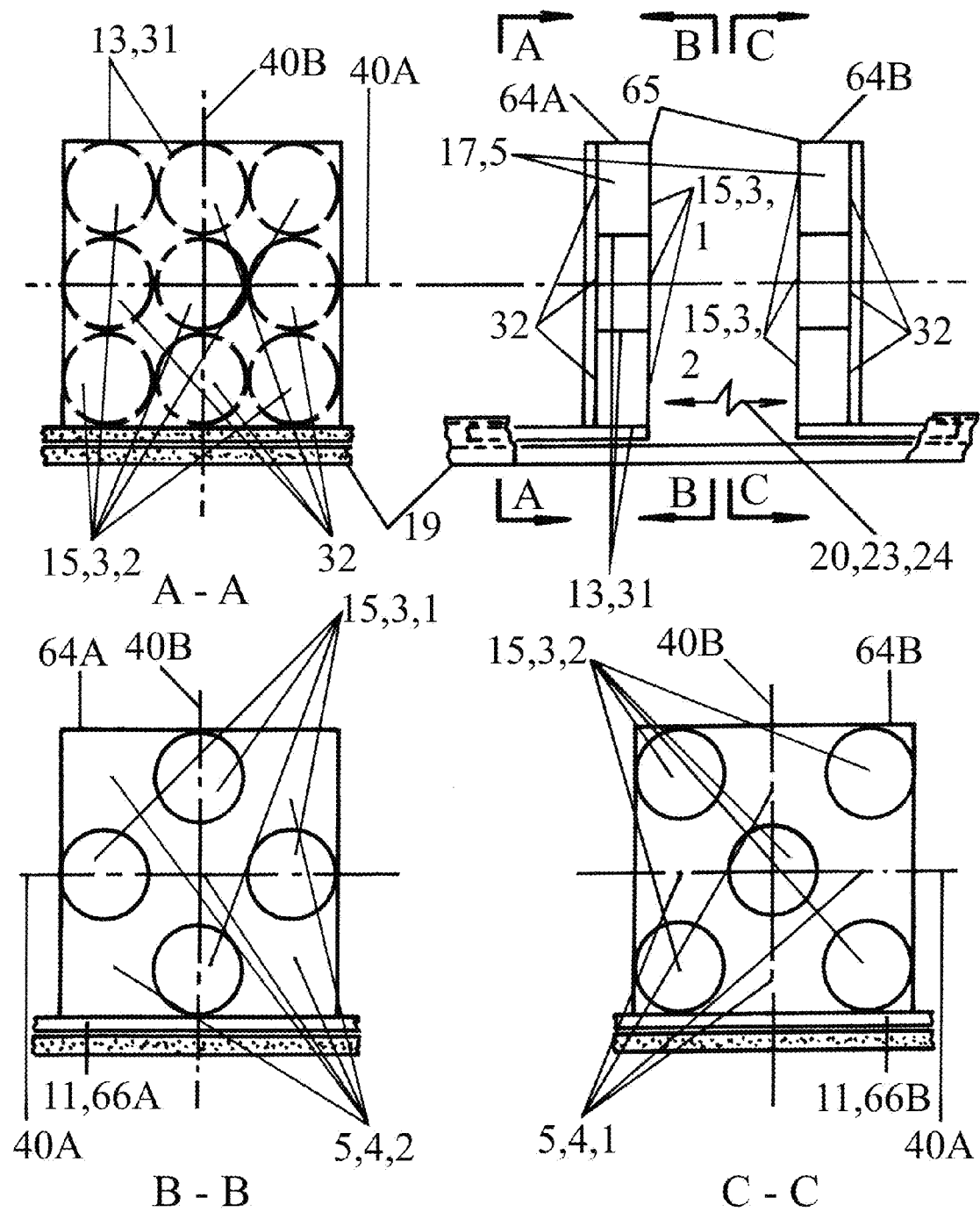
FIG. 30 shows the First Comprehensive Constructional Type Of Arrangements (FCCTOA) with north-south (1-2) unlike front poles (15, 3), in elevation at the top right part with the section A-A at the left and right underneath sections B-B and C-C that show the front part of the arrangements (64A, 64B).
Figure 31:
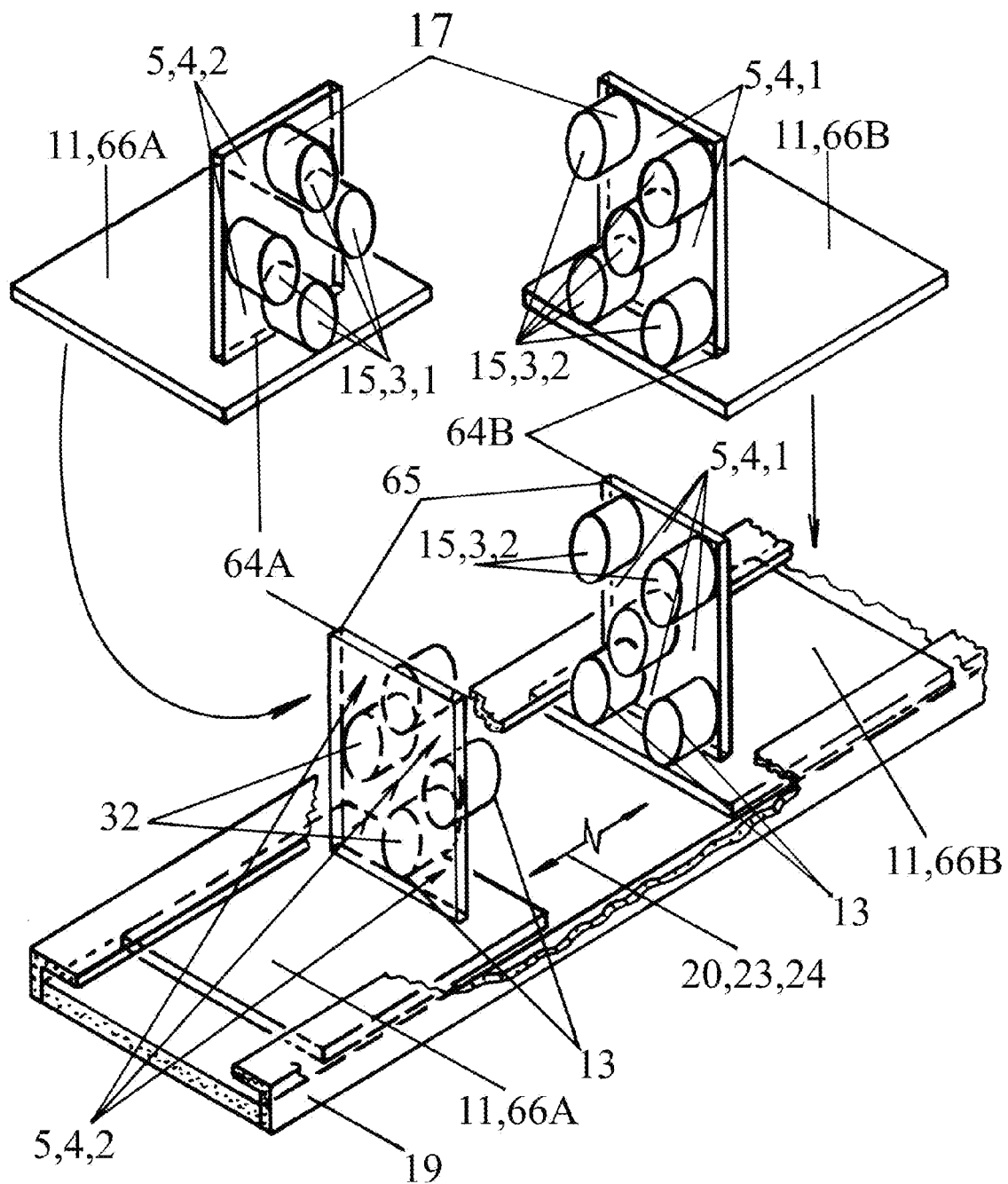
FIG. 31 shows the First Comprehensive Constructional Type Of Arrangements (FCCTOA) with north-south (1-2) unlike front poles (15, 3) that are shown also on FIG. 30, but here they are shown again in perspective and also confronted are the two magnetic constructions (66A, 66B) inside the guide (19).

FIGS. 30 and 31 show a first comprehensive constructional type of arrangements (FCCTOA) of unlike front poles (65), where this is similar to the FCCTOA of like front poles (30), as all the elements of that have already been described above and in all the figures for this type (30). Thus, exactly the same and similar apply for the type described below, except that the front poles are unlike between the confronted magnetic constructions. Therefore, for this type of unlike front poles, the features already described for the type (30) also apply from FIGS. 1 to 28 excluding the FIGS. 16 and 17 and also replacing FIG. 29 with FIG. 32. This type of unlike front poles (65) is shown in FIGS. 30 and 31, which are corresponding to the FIGS. 16 and 17, with only difference the unlike front poles between the arrangements.

The FCCTOA of unlike front poles (65) are shown in FIGS. 30 and 31, with the magnetic constructions (66A, 66B) of unlike front poles, wherein in FIGS. 30 and 31 the front poles (15) are north (3,1) for the (64A) and south (3,2) for the (64B). The magnetic arrangements (64A, 64B) form the magnetic constructions (66A, 66B). The front/rear bundles of dynamic lines (4) have an opposite polarity than the front bundles of dynamic lines (3) of the same magnetic arrangement for each case (64A, 64B). FIG. 29, which regards the type of like poles (30) do not apply for this type of unlike poles (65), as regards the interactions, but FIG. 32, which shows all the interactions of the type (65), with the FIG. 28 applying for both cases, i.e. of (30) and (65). In order to make, the mentioned distances in FIGS. 28 and 32 better understood, the magnetic construction FIG. 32 (66A) is fixed-immobilized and the magnetic construction (66B) is movable. On the application of the guide, the magnetic arrangements (64A, 64B) by means of the magnetic constructions (66A, 66B) respectively, are both movable and if desired either one or both may be immobilized, and the experiments and measurements are executed in various ways. The distances and interactions, as mentioned above, are typical for all the comprehensive constructional types of arrangements that use these and not only for the arrangements mentioned in the figures and the description.

Figure 32:
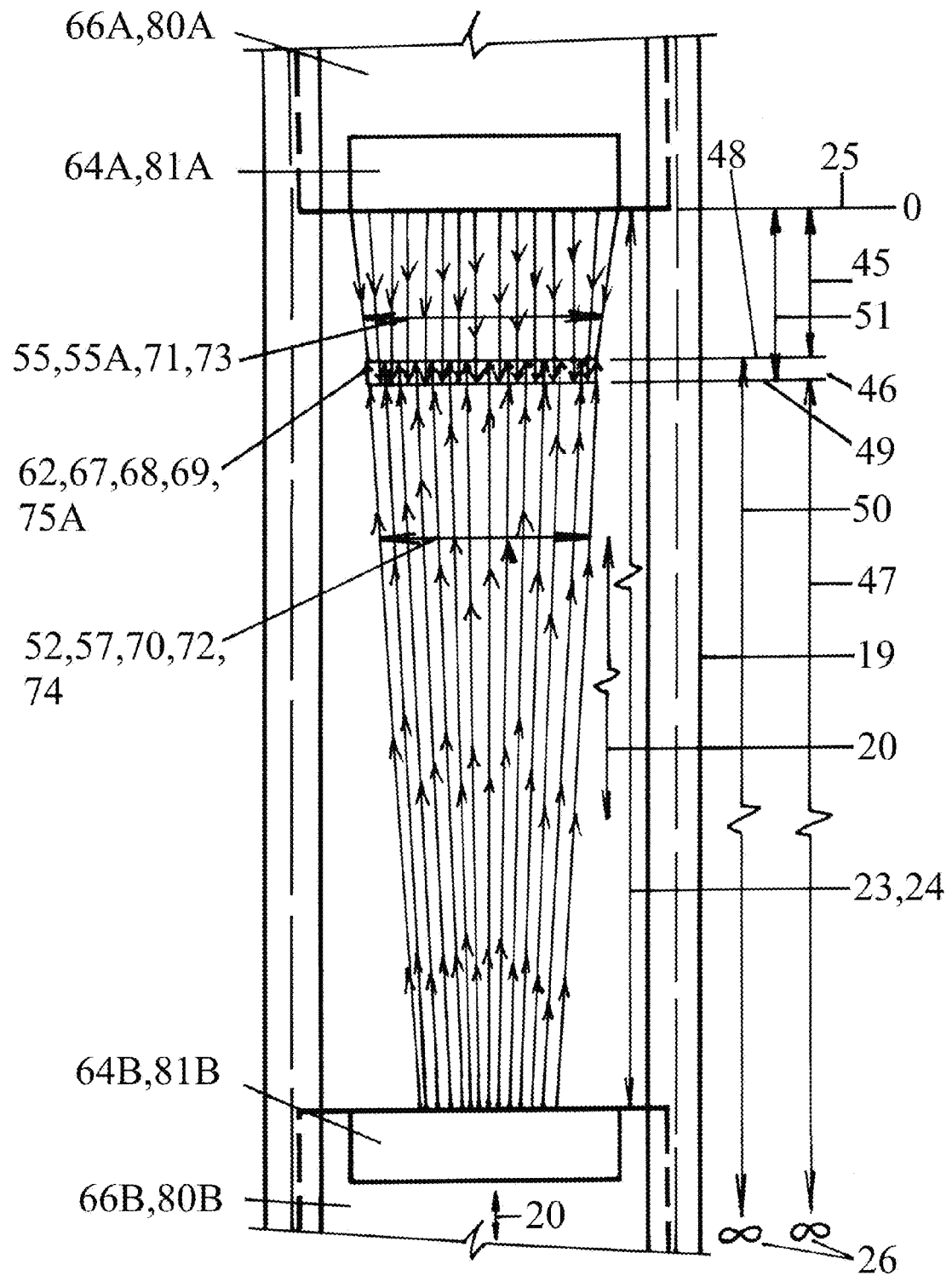
FIG. 32 shows during the magnetic construction's interaction the occurrence of three typical spatial distances (51, 46, 50) and two boundaries (48, 49), three different polarities and three interactions on the guide (19) when the front poles (15) of the magnets of the arrangements are initially unlike. The conical representation of the dynamic lines shows in a graphical manner the fluctuation of their intensity without corresponding of course to a real representation of them in space.

FIG. 32 shows the three typical spatial distances, the three multi-plane polarities and the three interactions with properties and with spatial boundaries and interactions based on the bundle of the dynamic lines between the two magnetic constructions, on the guide, when the poles of the front magnets of the arrangements axe initially unlike:

A) When between the magnetic constructions, FIG. 30 and 31 (66A) and (66B) the mutual-double front-front interaction is occurring, FIG. 32 (52) of the middle-further distance (50), which starts its maximum strength from the middle-nearer boundary (48) and extinguishes through the further distance (47) to the infinity (26), this is attractive from distance (70) since the poles are unlike (57).

B) When between the magnetic constructions, FIGS. 30 and 31 (66A) and (66B) the mutual-double front-front/rear interaction is occurring, FIG. 32 (55) of the nearer-middle distance (51) where its maximum strength starts from the zero distance (25) of physical contact of the nearer distance (45) of the magnetic constructions and its extinguishing stops abruptly at the middle-further boundary (49) this is repulsive (71) since the interacting poles are like (55A) and constitutes the nearer-middle interaction (73).

C) When on the two confronted magnetic constructions, FIGS. and 30 and 31 (66A) and (66B) the poles are unlike, FIG. 32 (57) in the mutual-double front-front interaction (52) of the middle-further distance (50) causing attractive interaction from distance (70) of the magnetic constructions (66A) and (66B), then the poles of the constructions become like (55A) in the mutual-double front-front/rear interaction (55) of the nearer-middle distance (51) causing a repulsive interaction (71) of the magnetic constructions. However, at the middle distance (46) these two different and opposite interactions (70, 71) co-exist, and are equivalent and at that point exactly the poles are unlike and like simultaneously (67) and simultaneous attractive and repulsive equivalent interaction (68) is generated. This causes a stable balance (69) of the magnetic bodies (66A) and (66B) with full immobility of the magnetic constructions (66A) and (66B) and this middle interaction (75A) is designated as interaction of stable balance (69) causing further, apart from the stable balance (69) of the magnetic constructions also the interaction of the attractive secured field from distance (70). This happens because when the one construction withdraws in the guide, it attracts and pulls the confronted construction, having always a distance (23, 24) and never physical contact, due to the repulsive interaction (71) existing at the nearer-middle distance (51).

The attractive interaction from distance, FIG. 32 (70) of the middle-further distance (50), with the repulsive interaction (71, 73) of the nearer-middle distance (51) are equivalent (68) at the middle interaction (69) of the middle distance (46) of the stable balance (69). The attractive middle-further interaction (72) vanishes from the middle-nearer boundary (48) until all the nearer distance (45) i.e. to the physical contact of the magnetic constructions and the repulsive, FIG. 32 (71) nearer-middle interaction (73) vanishes from the middle-further boundary (49) to the whole further distance (47).

With the application of the above, as the user moves the two confronted magnetic constructions, FIGS. 30 and 31 (66A) and (66B) with the uni-directional forward-backwards, FIG. 28 (20), confronted always sliding possibility they possess to move inside the guide (19) there develop the following three experimental magnetic phenomena and facts:

1) When the operator brings anyone of the two magnetic constructions from the non-interaction distance close to each other, i.e. from the further distance (47) to the middle-nearer boundary (48) the confronted magnetic construction, if left free, presents an attractive interaction, FIG. 32 (70, 72) and moves forwards, i.e. to the confronted magnetic construction since it is attracted by it, to the middle-nearer boundary (48), where the strength of this attractive force (70) is maximum. This means that while there is attraction and the confronted magnetic construction is approaching due to the attractive force (70, 72) however this attraction vanishes abruptly at the middle-nearer boundary (48) leaving an empty air space, FIG. 28 (23, 24) between the magnetic constructions (66A) and (66B), which is the nearer distance (45) and at that point there is repulsive field, FIG. 32 (71, 73) between the magnetic constructions. Thus, if the operator pulls backwards, selecting anyone of the magnetic constructions, he simultaneously pulls the confronted magnetic construction, due to the attraction, FIG. 32 (70, 72) and between them there is a distance and no contact. On the contrary, with the only present observable effect on magnetism, which defines that with an attractive interaction the magnetic constructions are joined with zero distance between them. Therefore, this specific attractive interaction (70, 72), which does not allow the union of the two magnetic constructions, due to a mediating repulsive (71, 73) field, is also designated as interaction of the attractive secured field from distance (70).

2) At the point where the two magnetic constructions are attracted and remain fixed with empty air space between them FIG. 28 (66A) and (66B.) stable balance is established, FIG. 32 (69). Contrary to the unstable balance of FIG. 29 (61) in the case of FIGS. 16 and 17 of magnetic constructions (12A) and (12B) respectively with like front poles between the arrangements, where effort must be applied to equilibrate the two magnetic constructions, at the stable balance no effort is required since the two magnetic constructions, FIG. 28 (66A) and (66B) by themselves equilibrate permanently (69) at the middle distance (46) due to the equivalence of the attractive and repulsive forces, FIG. 32 (68).

3) When the operator brings manually anyone of the two magnetic constructions, FIG. 28 (66A) and (66B) from the middle distance (46) of stable balance (69) of non-movement, close to the other, the confronted magnetic construction, if left free, presents a repulsive interaction, FIG. 32 (71, 73) and moves backwards. If the two magnetic constructions are held and the operator brings them closer, he feels a repulsive (71) gradually increasing force, the maximum of which is at the zero distance (25) between the magnetic constructions, FIG. 28 (66A) and (66B) and of course its extinguishment vanishes abruptly at the middle-further boundary, FIG. 32 (49). If from the position of non-movement of the stable balance (69) anyone of the two magnetic constructions is displaced, this causes either the attraction and pulling from distance (70) of the confronted magnetic construction, if displaced to the further distance (47) or the repulsive (71) interaction thereof, if displaced to the nearer distance (45).

The measurements of the spatial distances FIG. 28 and of the interactions, as those defined in FIG. 32 depend on the size of the dipoles employed for the execution of the application and on the magnetic force that these possess. The measurements of the distances with the defined materials and elements of the invention are typical, i.e. they apply for the present as well as for the subsequent comprehensive constructional types of arrangements of unlike front poles and on average they vary as follows: on average, the width-range of the nearer-middle distance, FIGS. 28 and 32 (51), is 7.8 to 8.5 mm. The width-range of the middle distance (46) of the stable balance, FIG. 32 (69, 68) is wider in macroscopic measurement than that of the unstable balance, FIG. 29 (61, 60), from 0.1 to 2.8 mm and the width-range of the middle-further one, FIGS. 28 and 32 (50), begins from the middle-nearer boundary (48), the distance of which from zero distance (25) is evaluated from (51) minus (46) and then this (50) is extended to infinity (26). It is also noted that the magnetic constructions pull one another on the guide (19), while as it is explained above, in between them the distance of the nearer distance exists, FIG. 32 (45), where the repulsive interaction (71, 73, 55) is applied.

Figure 33:
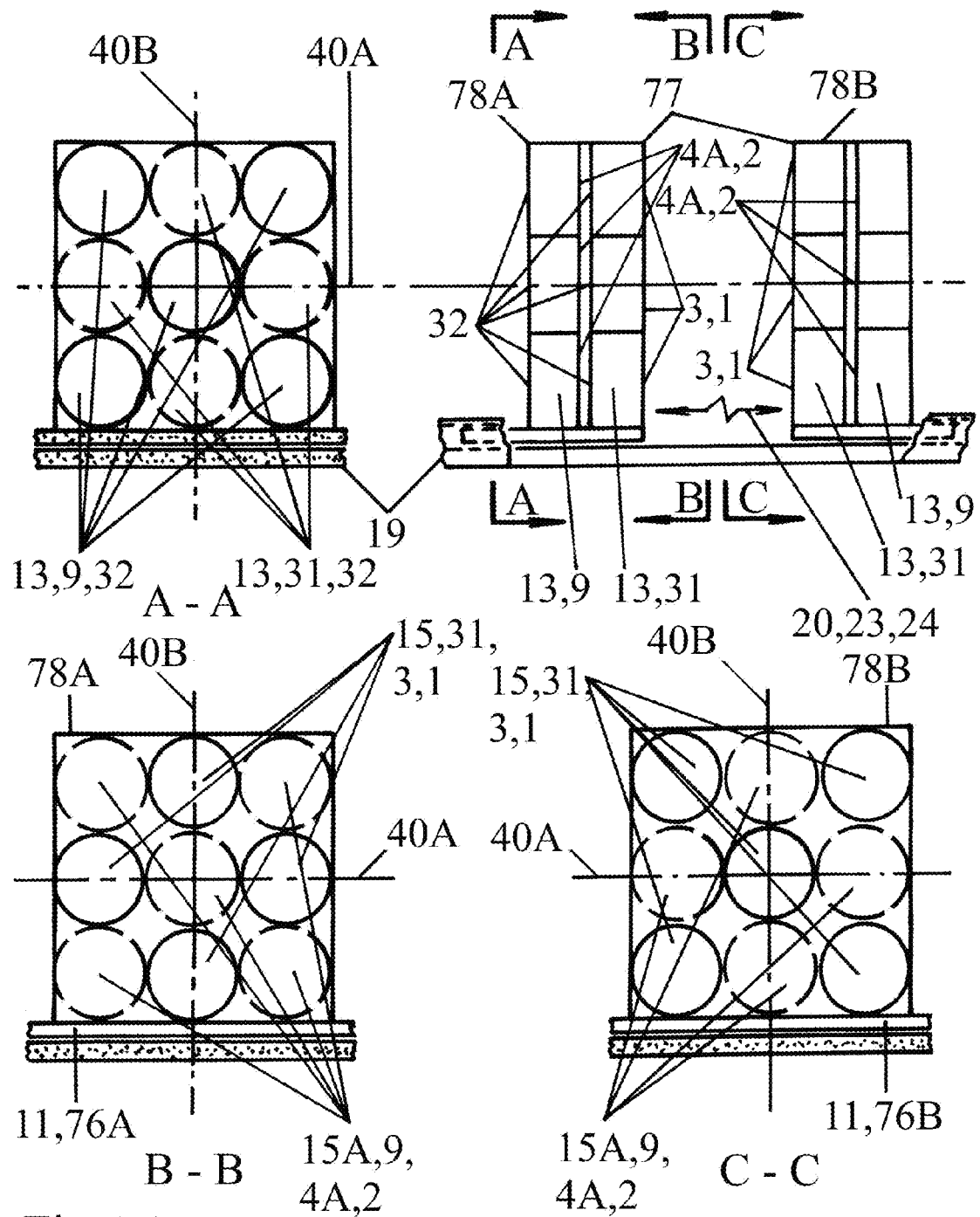
FIG. 33 shows the Second Comprehensive Constructional Type Of Arrangements (SCCTOA) with like (1-1) front poles (15-3), in elevation at the top right part of the Fig., with the section A-A at the left and right underneath sections B-B and C-C that show the front part of the arrangements (78A, 78B).
Figure 34:
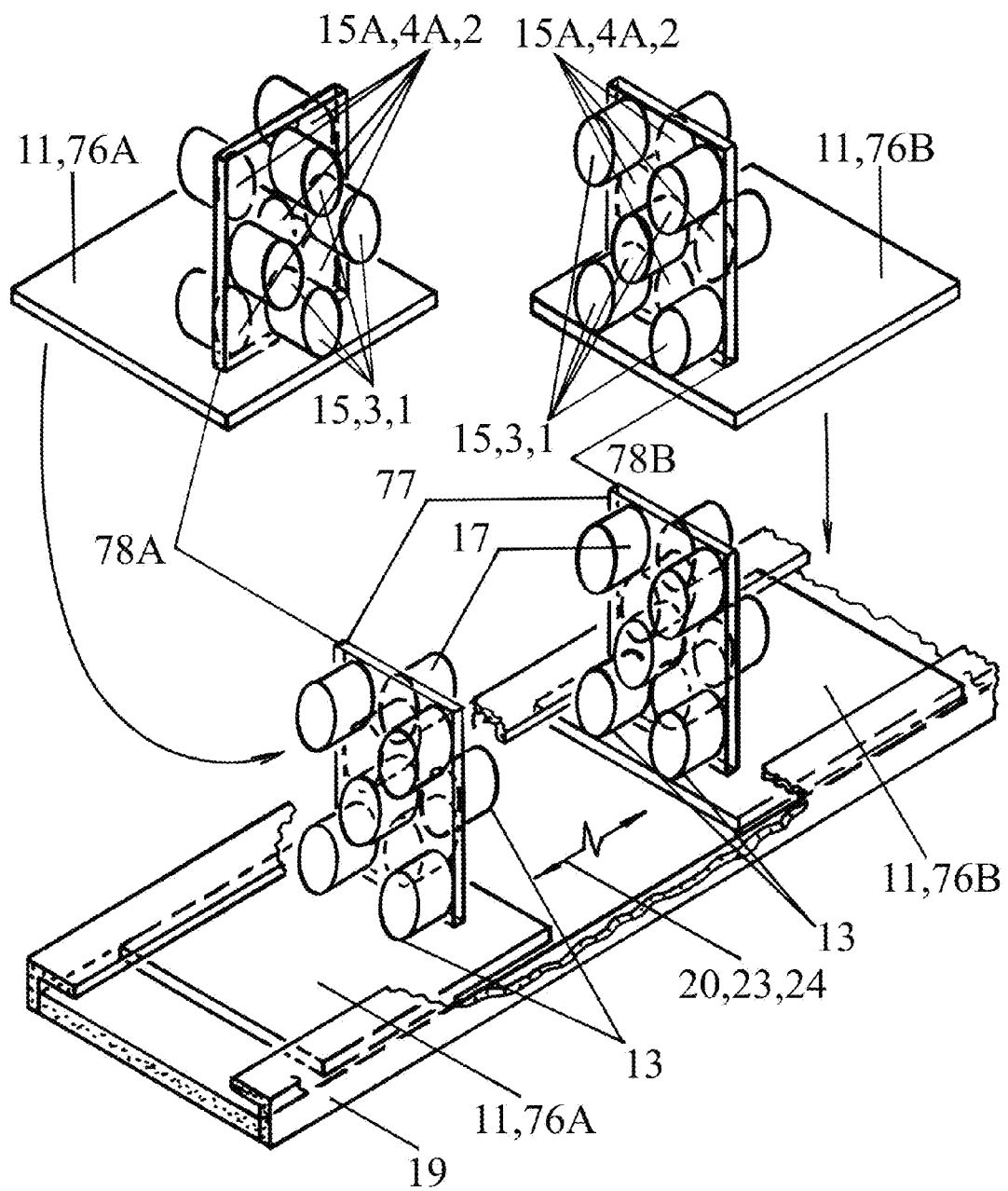
FIG. 34 shows the Second Comprehensive Constructional Type Of Arrangements (SCCTOA) with like (1-1) front poles (15-3), that are shown also on FIG. 33, but here they are shown again in perspective and also confronted are the two magnetic constructions (76A, 768) inside the guide (19).

FIGS. 33 and 34 show the second comprehensive constructional type of arrangements (SCCTOA) with like front poles (77), which is based on all the features given in the description and the drawings on the first comprehensive constructional type of arrangement of FIGS. 16 and 17, and in comparison with it the featured (77) here is characterized in that each magnetic construction (76A, 76B) of each pair (77) emits in the empty air space in front of it (23) a beneficial front north bundle of dynamic lines (15, 31, 3, 1) and an equally beneficial front/rear south bundle of dynamic lines (15A, 9, 4A, 2) of opposite polarity, which however contrary to the first comprehensive constructional type of arrangements of FIGS. 16 and 17 is emitted from the front face-pole (15A) of the rear positioned magnets (9) of the two magnetic constructions (76A) and (76B). Since, as shown from the first comprehensive constructional type of arrangements (30) of the FIGS. 16 and 17, which show north like poles, the results of the construction are exactly the same as if south like poles are used, due to the nature of magnetism and since it is known to the skilled in the art, the term "like" poles encompasses both the confronted north and the confronted south poles. In the following, two figures with front like poles will be shown, as north on all arrangements as an example of like front poles, which encompass also the case of south like poles. The same applies for the subsequently described comprehensive constructional types of arrangements which will use unlike front poles, i.e. two figures including both cases are used, wherein the magnetic arrangements have two different locations of unlike front poles.

The front bundle of dynamic lines, FIGS. 33 and 34 (3) is the one that either starts or ends directly from or to the face (15) of each front pole (13), while the front/rear bundle of dynamic lines (4A) has as polar emission the front face-pole (15A) of each rear positioned magnet (9, 13), on each magnetic construction (76A, 76B), which of course is positioned laterally and behind from each front dipole (31, 13) of each arrangement (78A, 78B) and it is always the polarity of the face of the rear dipole (9, 13) that emits the dynamic lines in front of the magnetic construction in the empty air space, similar to the rear pole (32) of every front dipole (31, 13) of the same arrangement and is always opposite to the front polarity (15, 3) of each front dipole (31) of the same arrangement. All the front faces-poles (15A, 4A) of the rear positioned dipoles (9, 13), independently from the quantity or arrangement they have between them, always possess the same polarity, i.e. this is always similar to the rear polarity (32) of each front dipole (31), of the same arrangement and is always opposite to the front polarity (15, 3) of each front dipole (31), of the same arrangement.

Figure 37:
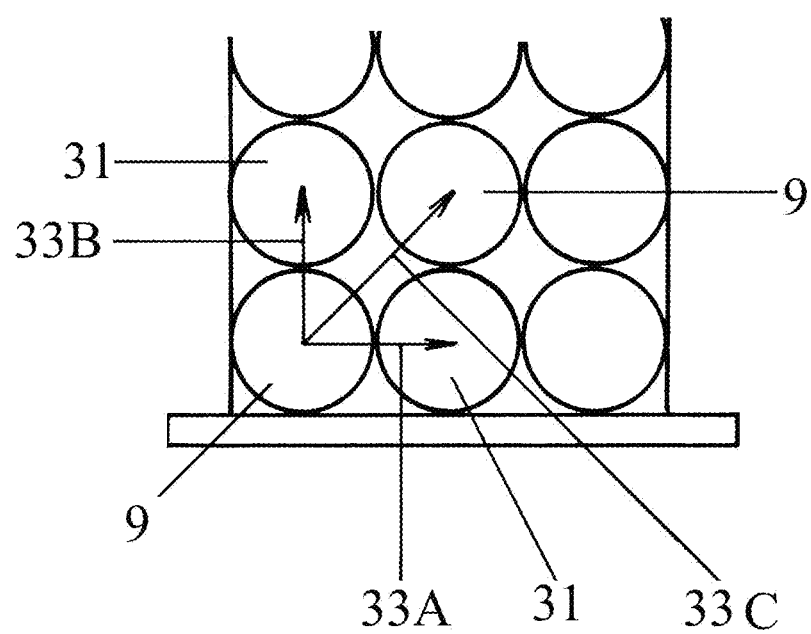
FIG. 37 shows typical delimitated arrangement of front (31) and rear dipoles (9) on an arrangement that uses two rows of dipoles.
Figure 38:
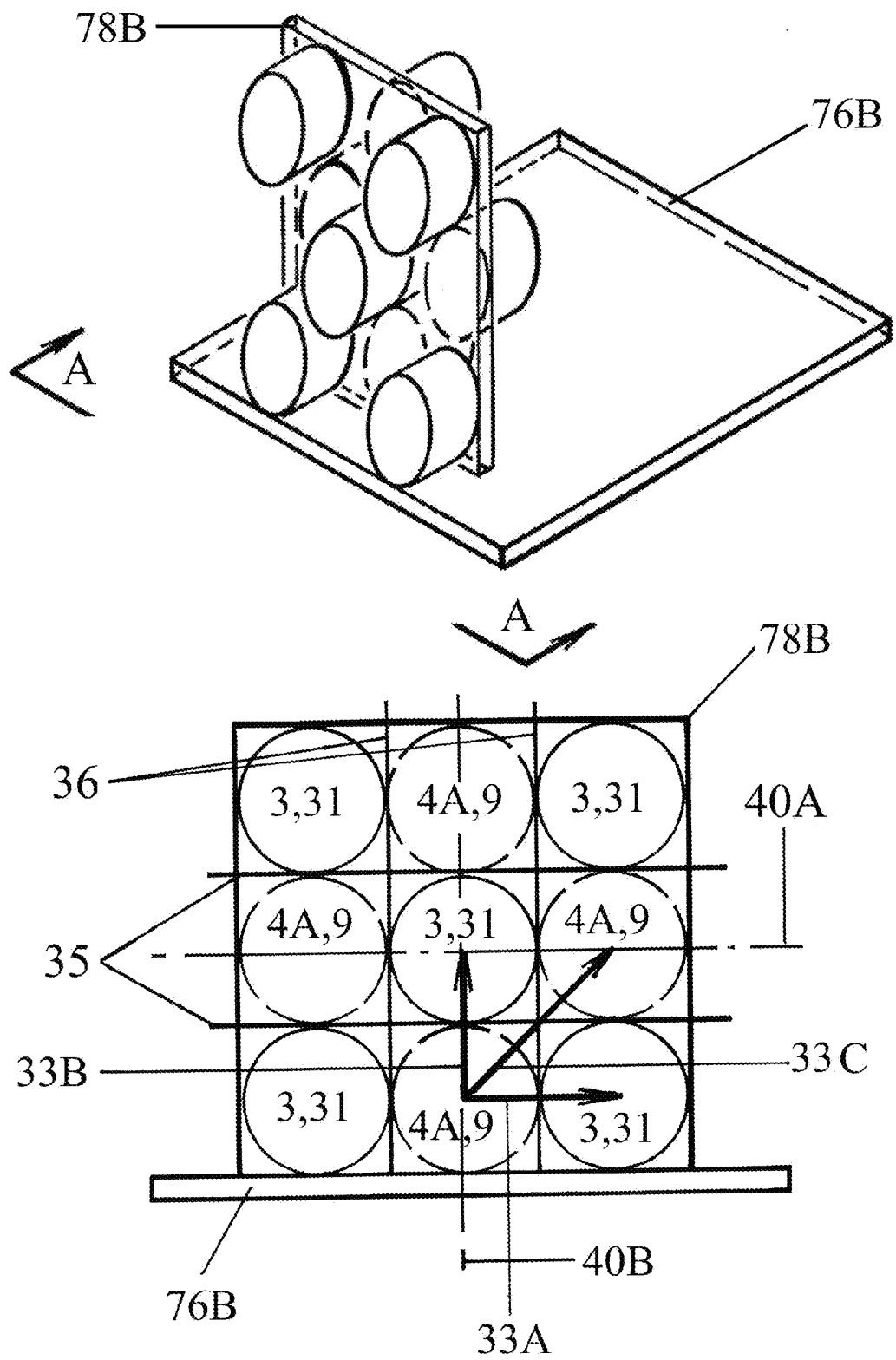
FIG. 38 shows on top perspective view of magnetic arrangement with two rows-arrays of magnets and on bottom elevation of typical delimitated placement for all referred symmetries that constitute magnetic arrangements with two rows of dipoles, front (31) and rear (9) positioned in every arrangement.
Figure 39:
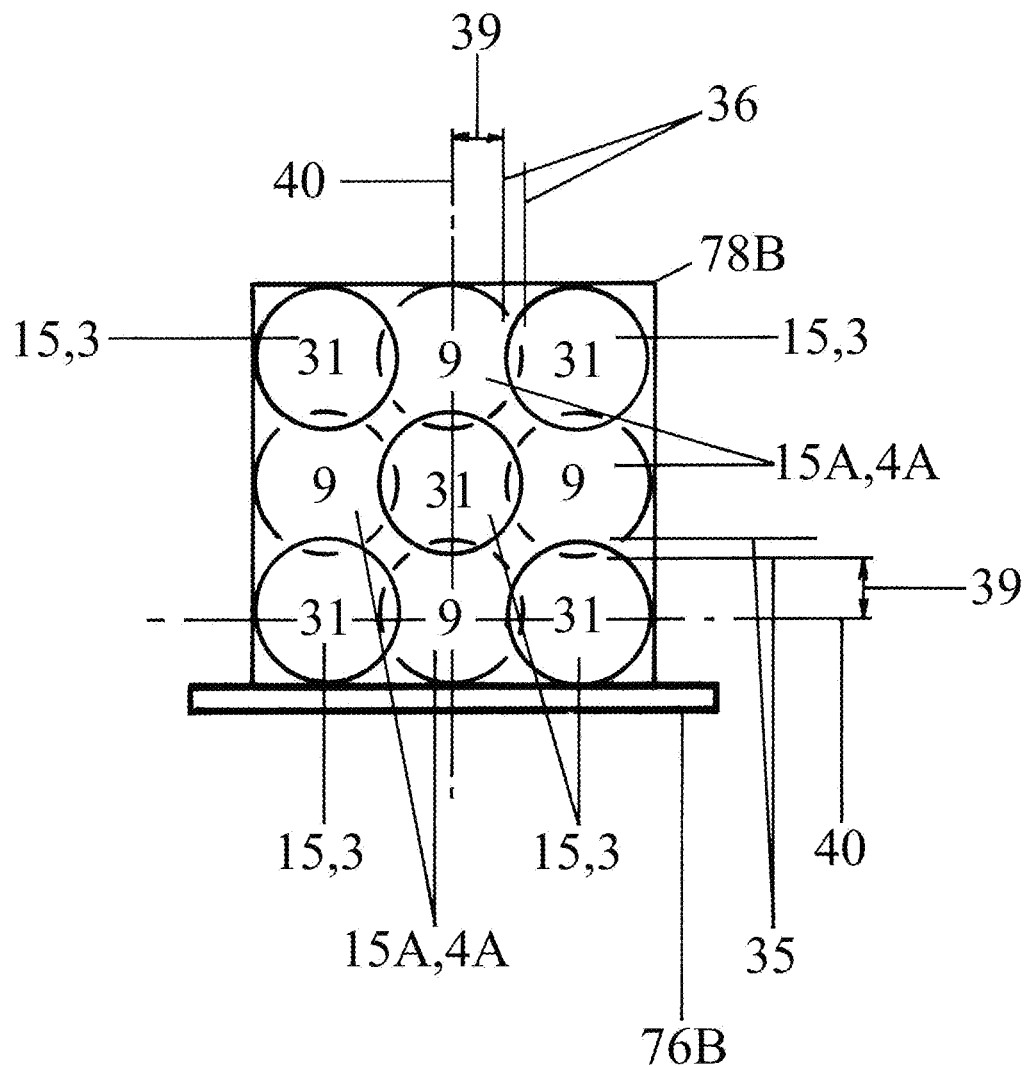
FIG. 39 shows the typical toleration from 0 to ⅓ infiltration of every rear dipole (9) from its sideways outmost barrier, until the central conceivable line of every front dipole (31), of every arrangement that makes use of two rows of front (31) and rear (9) dipoles, so that the tolerance (39) to be equal with ⅔ or even more of the dipole's radius.

FIGS. 37 and 38 show typical delimitated location-positioning of the front (31) and the rear dipoles (9) on an arrangement with two rows arrays of dipoles and FIG. 39 shows a penetration tolerance of the rear dipoles (9) in relation to the front dipoles (31) of the arrangement. The location of the rear dipoles (9), in relation to the front dipoles (31) on a magnetic arrangement (78A) or (78B), is similar to the location of the front confronted dipoles (31) between two arrangements, as mentioned for the first comprehensive constructional type of arrangements (30), in FIGS. 19, 20 and 21 including the penetration tolerance (39) of FIG. 22. This relation is shown on the new FIGS. 37, 38 and 39, noting their similarity to the figures concerning the first comprehensive constructional type of arrangements (30), i.e. FIGS. 19, 20, 21 and 22.

In FIG. 21 it is important to note that the horizontal imaginary central line (40A), which intersects exactly in half each arrangement (78A, 78B) and the vertical imaginary central line (40B) coincide one another in a single line, when the two arrangements are confronted and the total symmetry (34), namely the constructional pair (77) has a horizontal imaginary central line (40A) and a vertical imaginary central line (40B), since thereon the (40A) and (40B) of the individual arrangements coincide. Also, in FIG. 21, only the front poles (15, 13, and 31) of the front dipoles are shown and in the location of the cells with bundle (4) of FIG. 21, in the above case of two rows-arrays of (78B) there is in that location a rear dipole with a bundle (4A). FIG. 38 shows in detail this variation of FIG. 21.

The location of each rear dipole (9), as lateral horizontal one, FIG. 37 (33A) or vertical one (33B) or otherwise diagonal one (33C) and behind each front dipole (31) of each arrangement is exactly opposite to the physical existence of the front dipole (15, 3, 31) of the confronted arrangement i.e. exactly confronted to the loop of the front bundle of dynamic lines (3) which have as emission origin each front face-pole (15) of each frontally located magnet (31, 13) and the loop (3) is able to interact with the front/rear bundle of dynamic lines (4A). If the imaginary line, FIG. 38 (35, 36) coincides with the final lateral boundary of each front dipole (3, 31) of the arrangement (78B), then this also coincides with the initial lateral boundary of each rear laterally located magnet (4A, 9) on the same arrangement. The similar applies on the arrangement (78A).

FIG. 39 gives a view of the magnetic construction (76B), which has the magnetic arrangement (78B), and shows a tolerance (39) in which each rear dipole (9) may enter laterally, through the boundary of the imaginary line (35, 36) and its boundary may penetrate in the boundary of the front dipole from 0 to ⅓ of the dimension regarding the lateral upper boundary (35, 36) of each dipole (9,31), to the central imaginary line (40), which intersects in half each dipole (9, 31), so that the dimension (39) is equal to ⅔ or more of the dipole radius, but it is never smaller. The same apply for the magnetic construction (76A), which has the magnetic arrangement (78A). The above-mentioned tolerance (39) allows a control on the intensity of the interaction by increasing or decreasing it, since from the marginal zero boundary lateral coincidence, FIG. 38 (35, 36) and up to the ⅓ of their penetrating dimension, FIG. 39 (39) the intensity of the magnetic force generated by each front/rear bundle of dynamic lines (15A, 4A) when interacting attractively or repulsively is incrementally increased. The magnetic arrangements may be constructed either by marginal boundary placement between the rear and front dipoles or by tolerance penetration, FIG. 39, which may range from zero boundary to ⅓ of the dipole radius. As long as each north front pole (15, 31, 3, 1) of each arrangement, FIGS. 33 and 34 (78A, 78B) has marginally, FIG. 38 (35, 36) or in tolerance penetration, FIG. 39 (39) laterally, or in horizontal, FIG. 37 (33A) or vertical (33B) or otherwise diagonally (33C) delimitated, oppositely confronted each north front pole (15, 31, 3, 1) of the confronted magnetic construction exactly opposite to each front pole and not laterally or diagonally, each front pole confronts the south front/rear bundle/emission of the dynamic lines, FIGS. 33 and 34 (15A, 9, 4A, 2) of the confronted magnetic construction, the polar origin of which is the front face-pole (15A) of each rear positioned dipole (9, 13) in the magnetic construction. Each magnetic arrangement, FIGS. 33 and 34 (78A, 78B), on each magnetic construction (76A, 76B) has the vertical standing dipoles (13) arranged in two rows-arrays, i.e. the front dipoles (13, 31) are aligned between them and also the rear dipoles (9, 13) are aligned between them and their front poles (15A) coincide with the rear poles (32) of the front dipoles (31). Depending on the distance (24) mediating between the interacting magnetic arrangements (78A, 78B) the front bundle of dynamic lines becomes functionally beneficial, FIG. 6 (15, 3) from the front dipoles (31) and the front/rear bundle of dynamic lines FIG. 8 (4A) from the rear located dipoles (9). Each magnetic arrangement, FIGS. 33 and 34 (78A, 78B) has two rows-arrays of dipoles front and rear (31, 9) and also has two levels of beneficial and operational polar property, i.e. a beneficial front bundle of dynamic Lines (15, 3, 1) from the front dipoles (31) and an equally beneficial front/rear bundle of dynamic lines (15A, 4A, 2) of opposite polarity from the front poles (15A) of the rear dipoles (9).

As regards now the spatial distances of FIG. 28 and the interactions of FIG. 29, whatever applies for the FCCTOA of the pair (30) FIGS. 16 and 17, also applies for the SCCTOA of the pair (77) of FIGS. 33 and 34. Also, whatever regards the distances of FIG. 28 and the various interactions of FIG. 29 they apply, with the only exception that when the magnetic constructions, FIGS. 33 and 34 (76A, 768) are in the nearer-middle distance, FIG. 28 and 29 (51) in-between them distance, which may range from the physical contact (25) to the nearer-further boundary, FIG. 28 and 29 (49), the smallest distance created between the interacting confronted dynamic lines, FIG. 8 (3, 4A) and this is the distance between the front poles, FIGS. 33 and 34 (15, 31, 3) see also FIG. 8 (3), of each magnetic arrangement and of the front-rear poles, FIGS. 33 and 34 (15A, 9, 4A) see also FIG. 8 (4A), which belong to each rear dipole (9, 13) of the confronted arrangement. Thus, the front bundles of dynamic lines, FIG. 8 (3) interact with each opposite front/rear bundle-emission of dynamic lines, FIG. 8 (4A) of the front/rear face-pole, FIGS. 33 and 34 (15A) of each rear positioned dipole (9, 13) of the confronted magnetic construction and this interaction is designated as mutual-double front-front/rear interaction, FIG. 29 (55) of the nearer-middle distance, FIG. 28 and 29 (51). This is the nearer-middle interaction, FIG. 29 (56) and is attractive by contact (58), since the interacting poles are unlike (57). All other elements are similar—as regards the spatial distances and the interactions between the pair (30) of the FIGS. 16 and 17 and the pair (77) of the FIGS. 33 and 34 and the only exception is that the front/rear bundle of dynamic lines in the first case of the pair (30) is the (4), whereas in the second case of the pair (77) is the (4A). Consequently are applied FIGS. 6, 8 and 10, instead of the FIGS. 5, 7 and 9. All other elements and features of the above SCCTOA, FIGS. 33 and 34 (77) are absolutely similar to those of the FCCTOA of FIGS. 16 and 17 (30). They apply as typical and similar as regards the spatial dimensions and interactions, as well as the common elements used either for the second or of the first comprehensive constructional type of arrangements. In other words, as with the above example, the front/rear bundle of dynamic lines as (4) existing in the arrangements (10A, 10B) of the pair (30) is similar as regards the behavior to the front/rear bundle of dynamic lines as (4A), which exists in the arrangements (78A, 78B) of the pair (77) there is no other reference and distinction between them, apart from making the distinction in the arrangements that follow as to whether they use (4) or (4A) in their construction. For the spatial distances and all the interactions, FIGS. 28 and 29 apply, which also apply for the FCCTOA of like front poles (30).

Figure 35:
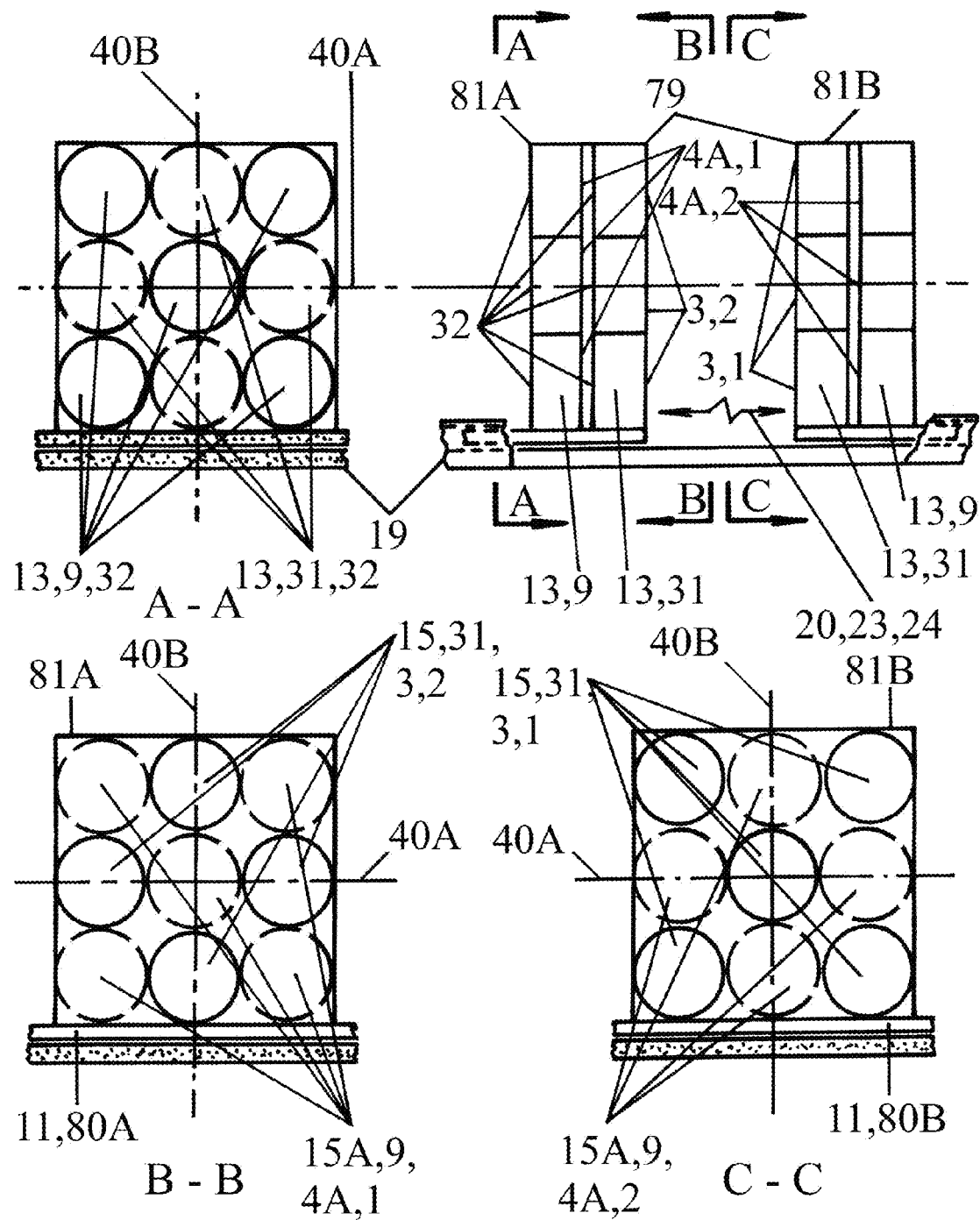
FIG. 35 shows the Second Comprehensive Constructional Type Of Arrangements (SCCTOA) with unlike (1-2) front poles (15, 3), in elevation at the top right part of the Fig., with the section A-A at the left and right underneath sections B-B and C-C that show the front part of the arrangements (81A, 81B).
Figure 36:
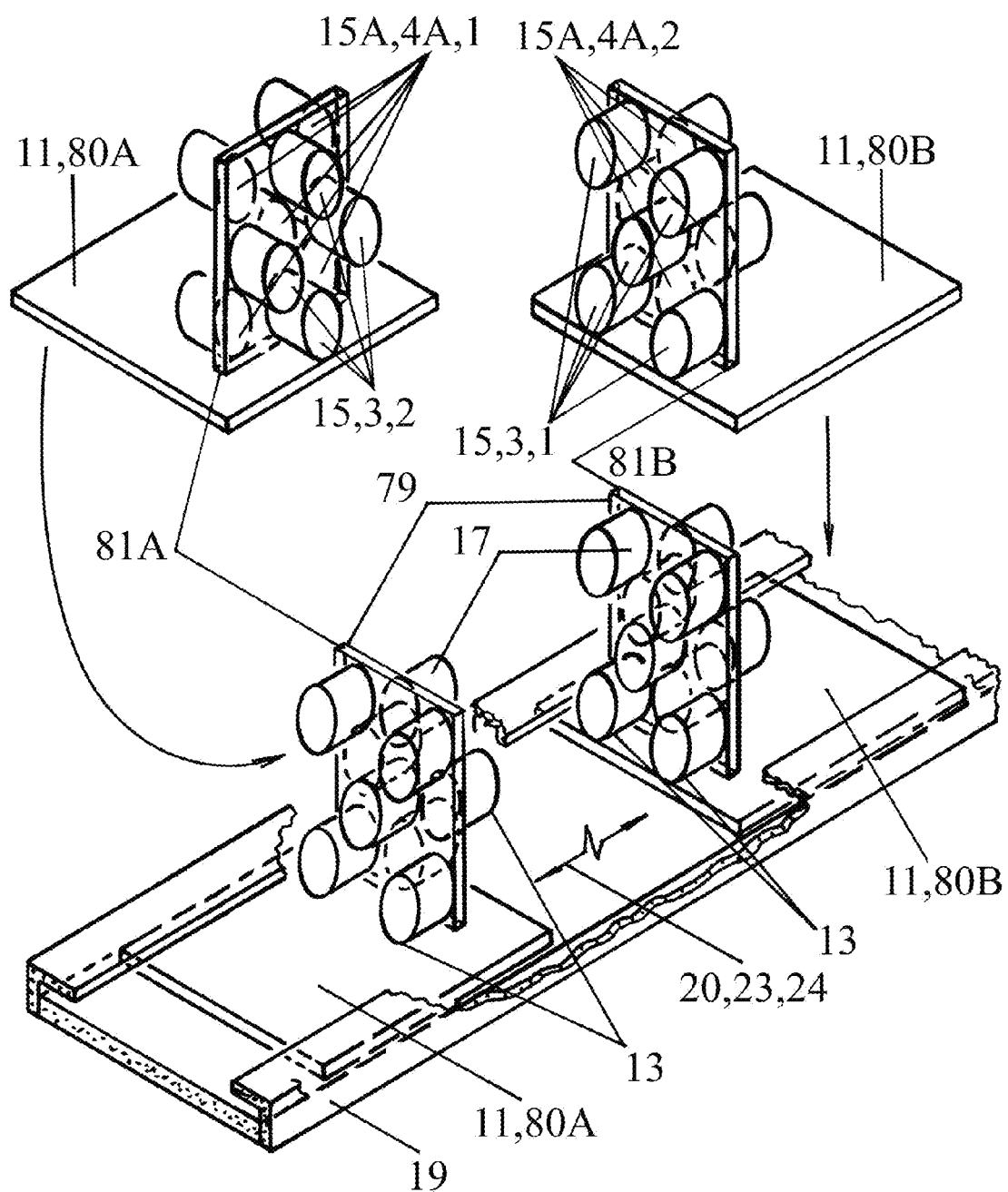
FIG. 36 shows the Second Comprehensive Constructional Type Of Arrangements (SCCTOA) with unlike (1-2) front poles (15, 3) that are shown also on FIG. 35, but here they are shown again in perspective and also confronted are the two magnetic constructions (80A, 80B) inside the guide (19).

FIGS. 35 and 36 show the SCCTOA of unlike front poles (79). Each magnetic arrangement (81A, 81B), on each magnetic construction (80A, 80B) has the vertical standing dipoles (13) arranged in two rows-arrays, i.e. the front dipoles (13,31) are aligned between them and also the rear dipoles (9, 13) are aligned between them and their front poles (15A) coincide with the rear poles (32) of the front dipoles (31). The magnetic construction (80A) has the magnetic arrangement (81A) having as south (3, 2) poles the front poles (15, 31) and the magnetic construction (80B) with the magnetic arrangement (81B) with north (3, 1) front poles and the faces-poles (15A) of the rear dipoles (9, 13) have an opposite polarity than the front polarities of each arrangement (81A, 81B). FIGS. 35 and 36 show the SCCTOA with unlike front poles, which is based on all the elements and features given in the description and the drawings regarding the SCCTOA of like front poles of FIGS. 33 and 34, pair (77). Any constructional feature that applies for the (77) of the FIGS. 33 and 34, including the references to (30), also applies for (79) of the FIGS. 33 and 34 except the FIG. 29, namely the interactions. In other words, for the (79) of the FIGS. 35 and 36, the FIG. 28 applies for the spatial distances, as it also applies for the (77), however FIG. 32 applies as regards the interactions for unlike front poles, as it applies for the pair (65) of the FIGS. 30 and 31 of the FCCTOA of unlike front poles. As already mentioned, the SCCTOA of unlike front poles (79) covers both combinations of unlike poles, i.e. it covers the case in which the magnetic construction (80A) has the magnetic arrangement (81A) with north (3, 1) and the magnetic construction (80B) with the magnetic arrangement (81B) has the front poles (15, 31) as south poles (3,2).

What is claimed is:

1. A magnetic apparatus executing magnetic interaction experiments comprising:
   two confronting magnetic constructions interacting as a pair movable in one dimension only, producing three magnetic interactions, comprised, of:
   a first magnetic construction of said pair comprising:
   a first total of four right central cylindrical permanent magnets of same type and size and the ratio between the height h and base diameter 2a of each magnet is equal to h=4/7(2a), these are adhesively fastened and fixed in positions on
   a first planar surface mounted in a direction orthogonal to the axis of the plane of
   a first nonmagnetic planar base, so that the poles of said first total of four right central cylindrical permanent magnets are in line with the outer limit of said firs nonmagnetic planar base forming the front end of the interacting part of said first magnetic construction and said poles are front poles of said first magnetic construction, all having the same polarity; the rear poles of said first total of four right central cylindrical permanent magnets are adhesively fastened and fixed in positions on said front of first planar surface, this front facing the front end of the interacting part of said first magnetic construction;
   a second magnetic construction of said pair comprising:
   a second total of five right central cylindrical permanent magnets of same type and size, same as the ones used for said first magnetic construction and the ratio between said height h and base diameter 2a of each magnet is equal to h=4/7(2a), these are adhesively fastened and fixed in positions on
   a second planar surface mounted in a direction orthogonal to said axis of said plane of
   a second nonmagnetic planar base, so that said poles of said second total of five right central cylindrical permanent magnets are in line with said outer limit of said second nonmagnetic planar base forming said front end of said interacting part of said second magnetic construction and said poles are front poles of said second magnetic construction, all having said same polarity: said rear poles of said second total of five right central cylindrical permanent magnets are adhesively fastened and fixed in positions on said front of second planar surface, this front facing the front end of the interacting part of said second magnetic construction;
   a symmetry of square mesh of plane tiling p4m used as a template and placed on the front of each planar surface to locate the specific positioning arrangement of said total of right central cylindrical permanent magnets on each said planar surface of each magnetic construction; nine equivalent in size squares with tangential sides, horizontally placed as three triads are present in said symmetry of square mesh of plane tiling p4m; the first triad is at the top of the template, the second triad is at the middle and the third triad is at the bottom; each right central cylindrical permanent magnet of each total of right central cylindrical permanent magnets is fixed in a specific chosen position in one of said nine squares of said symmetry of square mesh of plane tiling p4m placed on the front of each planar surface:
   a first magnetic arrangement of said first magnetic construction comprising its said first total of four right central cylindrical permanent magnets adhesively fastened and fixed in positions on said front of first planar surface, at said positions of said symmetry of square mesh of plane tiling p4m, at said middle square of said top triad, at the two outer squares of said middle triad and at said middle square of said bottom triad, all other five squares as positions of said symmetry of square mesh of plane tiling p4m not having there right central cylindrical permanent magnets;
   a second magnetic arrangement of said second magnetic construction comprising its said second total five right central cylindrical permanent magnets adhesively fastened and fixed in positions on said front of second planar surface, at said positions of said symmetry of square mesh of plane tiling p4m, at said two outer squares of said top triad, at said middle square of said middle triad and at said two outer squares of said bottom triad, all other four squares as positions of said symmetry of square mesh of plane tiling p4m not having there right central cylindrical permanent magnets;
a guide that limits the displacement of said pair of confronting magnetic constructions only to one dimension, maintaining them always parallel and confronting each other producing magnetic interactions through said front poles of said right central cylindrical permanent magnets of each magnetic construction in:
an empty air space between said confronting magnetic constructions; each magnetic construction is operated manually, sliding through its said nonmagnetic planar base on said guide; in said position where one magnetic construction has a front placed right central cylindrical permanent magnet said other confronting magnetic construction hasn't a front placed right central cylindrical permanent magnet;
said front poles of said first magnetic construction with respect to said front poles of said second magnetic construction are either like poles or unlike poles;
said confronted pair of magnetic constructions interacting on the guide, comprising:
a total of three distinctive and different magnetic interactions that are:
a middle-further magnetic interaction
nearer-middle magnetic interaction
said middle-further magnetic interaction and nearer-middle magnetic interaction are of opposite direction in respect to the direction of each exerted magnetic force in each one of them and
a middle magnetic interaction that is
a balance magnetic interaction of immobility of said pair of magnetic constructions because said middle-further magnetic interaction and said nearer-middle magnetic interactions' opposite in direction exerted magnetic forces are simultaneously co-existing there in intensity equivalence;
a total of three space distances occurring within said empty air space between said interacting magnetic constructions limiting the influence of each magnetic interaction are:
a middle-further distance, where said middle-further magnetic interaction is,
a nearer-middle distance, where said nearer-middle magnetic interaction is and
a middle distance, where said middle magnetic interaction is;
said middle distance has two boundaries that are:
a middle-nearer boundary towards said nearer distance and
a middle-further boundary towards said further distance.

2. The magnetic apparatus of claim 1, wherein
a like poles are present as said front poles of said first and second magnetic arrangement;
said confronted pair of magnetic constructions interacting on the guide, comprising:
a repulsive force at said middle-further magnetic interaction;
an attractive by contact force at said nearer-middle magnetic interaction;
a simultaneous repulsive-attractive force at said middle magnetic interaction of unstable balance causing unstable immobility of said pair of magnetic constructions.

3. The magnetic apparatus of claim 1, wherein
an unlike poles are present as said front poles of said first and second magnetic arrangement;
said confronted pair of magnetic constructions interacting on the guide, comprising:
an attractive front distance force of no-contact of said pair of magnetic constructions at said middle-further magnetic interaction;
a repulsive force at said nearer-middle magnetic interaction;
a simultaneous attractive-repulsive force at said middle magnetic interaction of stable balance causing a stable immobility of said pair of magnetic constructions.

4. The magnetic apparatus of claim 2, further comprising:
a total of five right central cylindrical permanent magnets of same type and size, same as the ones used for said first magnetic construction, adhesively fastened and fixed in rear positions at the back of said first planar surface of said first magnetic construction, positioned laterally and behind each one of the existing first total of four right central cylindrical permanent magnets, altogether comprising two rows-arrays; their five fixed rear positions are at the projected in space of said squares of said symmetry of square mesh of plane tiling p4m of said first magnetic arrangement where if these positions are projected to the front positions of said symmetry of square mesh of plane tiling there is not in the existing front row a right central cylindrical permanent magnet; said five fixed poles of these five right central cylindrical permanent magnets, which are facing towards said front end of the interacting part of said first magnetic construction are all said same polarity and said polarity is the same as said rear polarity of all said existing first total of four right central cylindrical permanent magnets and also opposite to said front poles of same;
a total of four right central cylindrical permanent magnets of same type and size, same as the ones used for said second magnetic construction, adhesively fastened and fixed in rear positions at said back of said second planar surface of said second magnetic construction, positioned laterally and behind each one of said existing second total of five right central cylindrical permanent magnets, altogether comprising two rows-arrays; their four fixed rear positions are at said projected in space of said squares of said symmetry of square mesh of plane tiling p4m of said first magnetic arrangement where if these positions are projected to said front positions of said symmetry of square mesh of plane tiling there is not in said existing front row a right central cylindrical permanent magnet; said four fixed poles of these four right central cylindrical permanent magnets, which are facing towards said front end of said interacting part of said second magnetic construction are all said same polarity and said polarity is the same as said rear polarity of all said existing second total of five right central cylindrical permanent magnets and also opposite to said front poles of same.

5. The magnetic apparatus of claim 3, further comprising:
a total of five right central cylindrical permanent magnets of same type and size, same as the ones used for said first magnetic construction, adhesively fastened and fixed in rear positions at the back of said first planar surface of said first magnetic construction, positioned laterally and behind each one of the existing first total of four right central cylindrical permanent magnets, altogether comprising two rows-arrays; their five fixed rear positions are at the projected in space of said squares of said symmetry of square mesh of plane-tiling p4m of said first magnetic arrangement where if these positions are projected to the front positions of said symmetry of square mesh of plane tiling there is not in the existing front row a right central cylindrical permanent magnet; said five fixed poles of these five right central cylindrical permanent magnets, which are facing towards said front end of the interacting part of said first magnetic construction are all said same polarity and said polarity is the same as said rear polarity of all said existing first total of four right central cylindrical permanent magnets and also opposite to said front poles of same;

a total of four right central cylindrical permanent magnets of same type and size, same as the ones used for said second magnetic construction, adhesively fastened and fixed in rear positions at said back of said second planar surface of said second magnetic construction, positioned laterally and behind each one of said existing second total of five right central cylindrical permanent magnets, altogether comprising two rows-arrays; their four fixed rear positions are at said projected in space of said squares of said symmetry of square mesh of plane tiling p4m of said first magnetic arrangement where if these positions are projected to said front positions of said symmetry of square mesh of plane tiling there is not in said existing front row a right central cylindrical permanent magnet; said four fixed poles of these four right central cylindrical permanent magnets, which are facing towards said front end of said interacting part of said second magnetic construction are all said same polarity and said polarity is the same as said rear polarity of all said existing second total of five right central cylindrical permanent magnets and also opposite to said front poles of same.

6. A process of operation of a magnetic apparatus executing magnetic interaction experiments comprising the steps of:
providing two confronting magnetic constructions interacting as a pair movable in one dimension only, producing three magnetic interactions, composed of:
providing a first magnetic construction of said pair comprising:
a first total of four right central cylindrical permanent magnets of same type and size and the ratio between the height h and base diameter $2a$ of each magnet is equal to $h=4/7(2a)$, these are adhesively fastened
fixing them in positions on a first planar surface
mounting this in a direction orthogonal to the axis of the plane of a first nonmagnetic planar base, so that the poles of said first total of four right central cylindrical permanent magnets are in line with the outer limit of said first nonmagnetic planar base forming the front end of the interacting part of said first magnetic construction and said poles are front poles of said first magnetic construction, all having the same polarity; the rear poles of said first total of four right central cylindrical permanent magnets are adhesively fastened and fixed in positions on said front of first planar surface, this front facing the front end of the interacting part of said first magnetic construction;
providing a second magnetic construction of said pair comprising:
a second total of five right central cylindrical permanent magnets of same type and size, same as the ones used for said first magnetic construction and the ratio between said height h and base diameter $2a$ of each magnet is equal to $h=4/7(2a)$, these are adhesively fastened fixing them in positions on a second planar surface
mounting this in a direction orthogonal to said axis of said plane on a second nonmagnetic planar base, so that said poles of said second total of five right central cylindrical permanent magnets are in line with said outer limit of said second nonmagnetic planar base forming said front end of said interacting part of said second magnetic construction and said poles are front poles of said second magnetic construction, all having said same polarity; the rear poles of said first total of four right central cylindrical permanent magnets are adhesively fastened and fixed in positions on said front of first planar surface, this front facing the front end of the interacting part of said first magnetic construction;
utilizing a symmetry of square mesh of plane tiling p4m as a template and placed on the front of each planar surface to locate the specific positioning arrangement of said total number of right central cylindrical permanent magnets on each said planar surface of each magnetic construction;
placing nine equivalent in size squares with tangential sides, horizontally placed as three triads are included in said symmetry of square mesh of plane tiling p4m; the first triad is at the top of the template, the second triad is at the middle and the third triad is at the bottom; each right central cylindrical permanent magnet of each total of right central cylindrical permanent magnets is fixed in a specific chosen position in one of said nine squares of said symmetry of square mesh of plane tiling p4m placed on the front of each planar surface;
providing a first magnetic arrangement of said first magnetic construction comprising its said first total of four right central cylindrical permanent magnets adhesively fastened and fixed in positions on said front of first planar surface, at said positions of said symmetry of square mesh of plane tiling p4m at said middle square of said top triad, at the two outer squares of said middle triad and at said middle square of said bottom triad, all other five squares as positions of said symmetry of square mesh of plane tiling p4m not having any right central cylindrical permanent magnets;
providing a second magnetic arrangement of said second magnetic construction comprising its said second total of five right central cylindrical permanent magnets adhesively fastened and fixed in positions on said front of first planar surface, at said positions of said symmetry of square mesh of plane tiling p4m at said two outer squares of said top triad, at said middle square of said middle triad and at said two outer squares of said bottom triad, all other four squares as positions of said symmetry of square mesh of plane tiling p4m not having any right central cylindrical permanent magnets;
providing a guide that limits the displacement of said pair of confronting magnetic constructions only to one dimension, maintaining them always parallel and confronting each other producing magnetic interactions through said front poles of said right central cylindrical permanent magnets of each magnetic construction in
occurring in the empty airspace between said confronting magnetic constructions;
operating each magnetic construction manually, sliding through its said nonmagnetic planar base on said guide;
providing in said position where one magnetic construction has a front placed right central cylindrical permanent magnet said other confronting magnetic construction hasn't a front placed right central cylindrical permanent magnet;

providing said front poles of said first magnetic construction with respect to said front poles of said second magnetic construction that are either like poles or unlike poles determining for said confronted pair of magnetic constructions interacting on the guide in producing a total of three distinctive and different magnetic interactions that are:

producing a middle-further magnetic interaction producing a nearer-middle magnetic interaction providing said middle-further magnetic interaction and nearer-middle magnetic interaction are of opposite direction in respect to the direction of each exerted magnetic force in each one of them and producing a middle magnetic interaction that is a balance magnetic interaction of immobility of said pair of magnetic constructions because said middle-further magnetic interaction and said nearer-middle magnetic interactions' opposite in direction exerted magnetic forces are simultaneously co-existing there in intensity equivalence;

specifying a total of three space distances occurring within said empty air space between said interacting magnetic constructions limiting the influence of each magnetic interaction providing a middle-further distance, where said middle-further magnetic interaction is produced providing a nearer-middle distance, where said nearer-middle magnetic interaction is produced and providing a middle distance, where said middle magnetic interaction is produced;

providing a middle distance that has two boundaries fixing a middle-nearer boundary towards said nearer distance and fixing, a middle-further boundary towards said further distance setting said middle distance to be between said middle-nearer boundary and said middle-further boundary;

providing each space distance and each boundary delimiting the start and end influence of each distinctive and different in direction magnetic force that produces each distinctive and different magnetic interaction producing said middle-further magnetic interaction presented at said middle-further distance suddenly starting its production through its maximum strength of magnetic force at said middle-nearer boundary and extinguishing this at said further distance to infinity delimiting said influence of this middle-further magnetic interaction to said middle-further distance; said middle-further magnetic interaction is absent from said middle-nearer boundary to the rest of said nearer distance;

producing said nearer-middle magnetic interaction presented at said nearer-middle distance starting its production through its maximum strength of magnetic force at the closest between magnetic constructions distance of contact and said nearer-middle magnetic interaction stopping suddenly at said middle-further boundary operating said nearer-middle magnetic interaction with an opposite in direction magnetic force from said middle-further magnetic interaction presented at said middle-further distance delimiting said influence of said nearer-middle magnetic interaction to said middle-nearer distance; said nearer-middle magnetic interaction is absent from said middle-further boundary until the whole further distance extending to infinity;

providing said middle balance magnetic interaction presented at said middle distance produced by the intensity equivalence of the co-existing attractive and repulsive forces, operating as said middle-further magnetic interaction and said nearer-middle magnetic interaction co-existing simultaneously, causing immobility of said pair of magnetic constructions for said whole middle distance.

7. The process of claim 6, wherein providing like poles as said front poles of said first and second magnetic arrangement;

determining for said confronted pair of magnetic constructions interacting on the guide in producing a repulsive force and operating as said middle-further magnetic interaction of said middle-further distance causing said pair of magnetic constructions to repel each other;

producing an attractive by contact force and operating as said nearer-middle magnetic interaction of said nearer-middle distance causing said pair of magnetic constructions to attract each other and unite by contact;

producing a simultaneous repulsive-attractive force at said middle magnetic interaction of unstable balance and operating as said middle-further magnetic interaction of repulsive force and said nearer-middle magnetic interaction of attractive by contact force, simultaneously co-existing causing said pair of magnetic constructions to rest in unstable immobility.

8. The process of claim 6, wherein providing unlike poles as said front poles of said first and second magnetic arrangement;

determining for said confronted pair of magnetic constructions interacting on the guide in producing an attractive from distance force and operating as said middle-further magnetic interaction of said middle-further distance causing said pair of magnetic constructions to attract each other without contact; if the operator pulls backwards selecting anyone of said magnetic constructions, said confronted magnetic construction is also pulled due to said attraction but between them there is a distance and no contact is occurring;

producing a repulsive force and operating as said nearer-middle magnetic interaction of said nearer-middle distance causing said pair of magnetic constructions to repel each other;

producing a simultaneous attractive-repulsive force at said middle magnetic interaction of stable balance and operating as said middle-further magnetic interaction and said nearer-middle magnetic interaction co-existing simultaneously causing said pair of magnetic constructions to stay in stable immobility.

9. The process of claim 7, further comprising the steps of:

providing a total of five right central cylindrical permanent magnets of same type and size, same as the ones used for said first magnetic construction, adhesively fastened and fixed in rear positions at the back of said first planar surface of said first magnetic construction;

maintaining them positioned laterally and behind each one of the existing first total of four right central cylindrical permanent magnets, altogether comprising two rows-arrays;

securing their five fixed rear positions are at the projected in space of said squares of said symmetry of square mesh of plane tiling p4m of said first magnetic arrangement where if these positions are projected to the front positions of said symmetry of square mesh of plane tiling there is not in the existing front row a right central cylindrical permanent magnet;

positioning said five fixed poles of these five right central cylindrical permanent magnets, which are facing towards said front end of the interacting part of said first magnetic construction to be all said same polarity and said polarity is the same as said rear polarity of all said existing first total of four right central cylindrical permanent magnets and also opposite to said front poles of same;

providing a total of four right central cylindrical permanent magnets of same type and size, same as the ones used for said second magnetic construction, adhesively fastened and fixed in rear positions at said back of said second planar surface of said second magnetic construction;

maintaining them positioned laterally and behind each one of said existing second total of five right central cylindrical permanent magnets, altogether comprising two rows-arrays;

securing their four fixed rear positions are at said projected in space of said squares of said symmetry of square mesh of plane tiling p4m of said first magnetic arrangement where if these positions are projected to said front positions of said symmetry of square mesh of plane tiling there is not in said existing front row a right central cylindrical permanent magnet;

positioning said four fixed poles of these four right central cylindrical permanent magnets, which are facing towards said front end of said interacting part of said second magnetic construction to be all said same polarity and said polarity is the same as said rear polarity of all said existing second total of five right central cylindrical permanent magnets and also opposite to said front poles of same.

10. The process of claim 8, further comprising the steps of:

providing a total of five right central cylindrical permanent magnets of same type and size, same as the ones used for said first magnetic construction, adhesively fastened and fixed in rear positions at the back of said first planar surface of said first magnetic construction;

maintaining them positioned laterally and behind each one of the existing first total of four right central cylindrical permanent magnets, altogether comprising two rows-arrays;

securing their five fixed rear positions are at the projected in space of said squares of said symmetry of square mesh of plane tiling p4m of said first magnetic arrangement where if these positions are projected to the front positions of said symmetry of square mesh of plane tiling there is not in the existing front row a right central cylindrical permanent magnet;

positioning said five fixed poles of these five right central cylindrical permanent magnets, which are facing towards said front end of the interacting part of said first magnetic construction to be all said same polarity and said polarity is the same as said rear polarity of all said existing first total of four right central cylindrical permanent magnets and also opposite to said front poles of same;

providing a total of four right central cylindrical permanent magnets of same type and size, same as the ones used for said second magnetic construction, adhesively fastened and fixed in rear positions at said back of said second planar surface of said second magnetic construction;

maintaining them positioned laterally and behind each one of said existing second total of five right central cylindrical permanent magnets, altogether comprising two rows-arrays;

securing their four fixed rear positions are at said projected in space of said squares of said symmetry of square mesh of plane tiling p4m of said first magnetic arrangement where if these positions are projected to said front positions of said symmetry of square mesh of plane tiling there is not in said existing front row a right central cylindrical permanent magnet;

positioning said four fixed poles of these four right central cylindrical permanent magnets, which are facing towards said front end of said interacting part of said second magnetic construction to be all said same polarity and said polarity is the same as said rear polarity of all said existing second total of five right central cylindrical permanent magnets and also opposite to said front poles of same.

* * * * *